(12) United States Patent
Murooka

(10) Patent No.: US 9,673,389 B2
(45) Date of Patent: Jun. 6, 2017

(54) MEMORY DEVICE

(75) Inventor: Kenichi Murooka, San Jose, CA (US)

(73) Assignee: Kabushiki Kaisha Toshiba, Tokyo (JP)

(\*) Notice: Subject to any disclaimer, the term of this patent is extended or adjusted under 35 U.S.C. 154(b) by 634 days.

(21) Appl. No.: 13/357,149

(22) Filed: Jan. 24, 2012

(65) Prior Publication Data

US 2013/0187118 A1 Jul. 25, 2013

(51) Int. Cl.
*H01L 27/24* (2006.01)
*H01L 45/00* (2006.01)

(52) U.S. Cl.
CPC .......... *H01L 45/04* (2013.01); *H01L 27/2436* (2013.01); *H01L 27/2481* (2013.01); *H01L 45/1226* (2013.01)

(58) Field of Classification Search
CPC . H01L 27/2436; H01L 27/2481; H01L 45/04; H01L 45/1226
USPC .............................................................. 257/4
See application file for complete search history.

(56) References Cited

U.S. PATENT DOCUMENTS

| 2010/0207186 A1* | 8/2010 | Higashi ............. H01L 27/11582 257/314 |
| 2011/0069531 A1* | 3/2011 | Aburada et al. ............... 365/148 |
| 2011/0299314 A1* | 12/2011 | Samachisa ........... G11C 13/003 365/51 |

FOREIGN PATENT DOCUMENTS

| JP | 2010-192589 | 9/2010 |
| JP | 2011-142276 | 7/2011 |
| JP | 2013-535101 | 9/2013 |
| WO | WO 2011/156351 A1 | 12/2011 |

OTHER PUBLICATIONS

U.S. Appl. No. 14/017,727, filed Sep. 4, 2013, Murooka.
U.S. Appl. No. 14/017,703, filed Sep. 4, 2013, Murooka.
U.S. Appl. No. 14/025,146, filed Sep. 12, 2013, Murooka.
U.S. Appl. No. 14/284,516, May 22, 2014, Murooka.
U.S. Appl. No. 14/150,193, filed Jan. 8, 2014, Tanaka.
U.S. Appl. No. 14/156,595, filed Jan. 16, 2014, Murooka.
U.S. Appl. No. 14/849,023, filed Sep. 9, 2015, Murooka.
Office Action mailed Jan. 12, 2016 in Japanese Application No. 2012-197255 (w/English translation).
Office Action mailed Jun. 2, 2015, in Japanese Application No. 2012-197255 (w/English translation).
Office Action mailed Aug. 18, 2015 in Japanese Application No. 2012-197255 (w/English translation).

\* cited by examiner

*Primary Examiner* — A. Sefer
*Assistant Examiner* — Benjamin Tzu-Hung Liu
(74) *Attorney, Agent, or Firm* — Oblon, McClelland, Maier & Neustadt, L.L.P.

(57) ABSTRACT

According to one embodiment, a memory device includes a first interconnect group, a second interconnect group, and a memory cell. In the first interconnect group, first interconnects are stacked. The first interconnect group includes first regions in which the first interconnects are formed along a first direction, and a second region in which first contact plugs are formed on the first interconnects. In the second region, the first interconnect group includes a step portion. Heights of adjacent terraces of the step portion are different from each other by the two or more first interconnects.

10 Claims, 54 Drawing Sheets

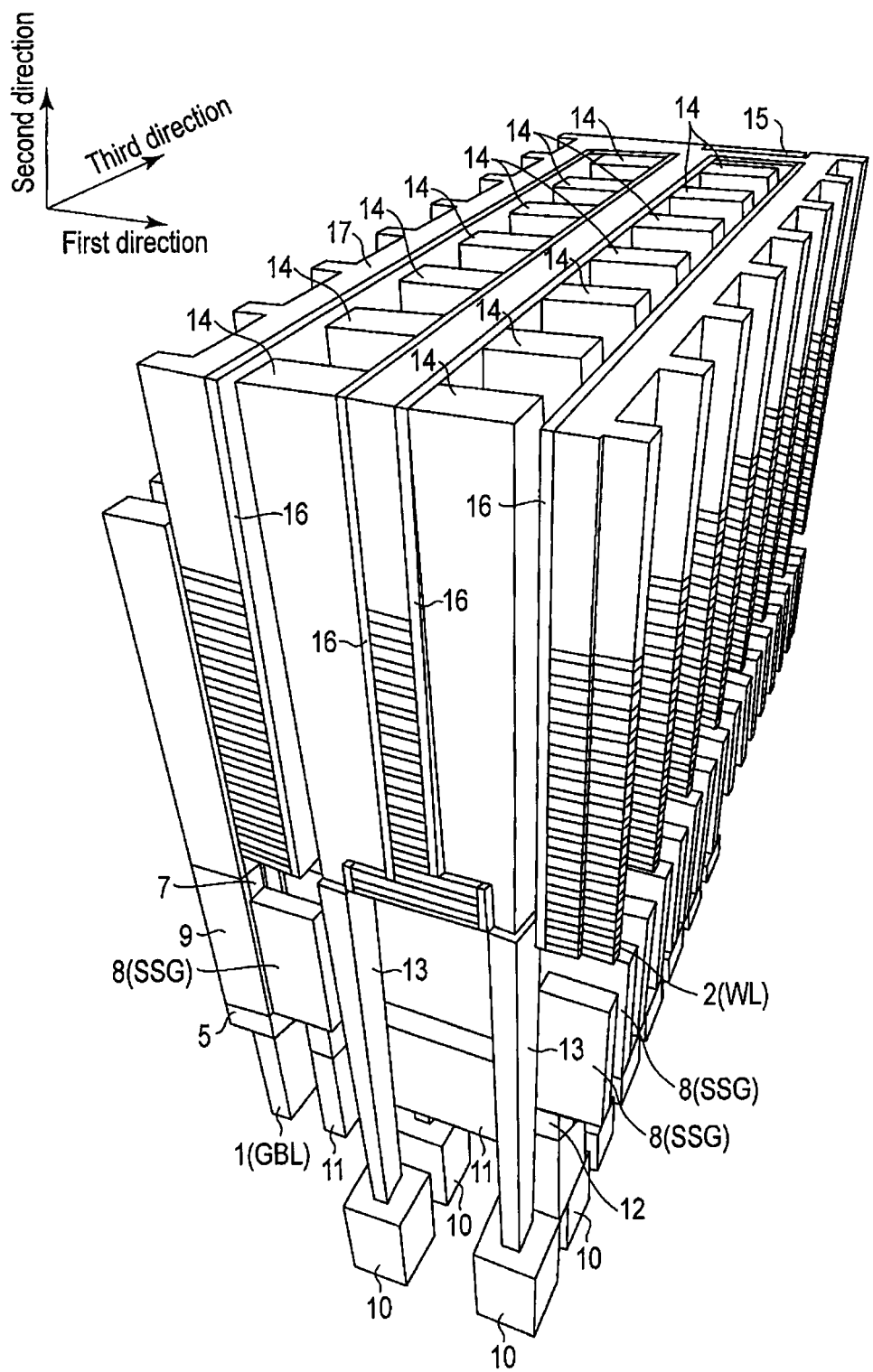
F I G. 5

|  | Write | Erase | Read |
|---|---|---|---|
| SSG_s | Vg_w | Vg_e | Vg_r |
| SSG_n | Vg_w | Vg_e | Vg_r |
| SSG_u | 0 | 0 | 0 |
| GBL_s | Vw | +1 | Vr+Vo |
| GBL_u | Vw/2 | (Ve/2)+1 | Vr+Vo |
| WL_s | 0 | Ve+1 | Vo |
| WL_u | Vw/2 | (Ve/2)+1 | Vr+Vo |

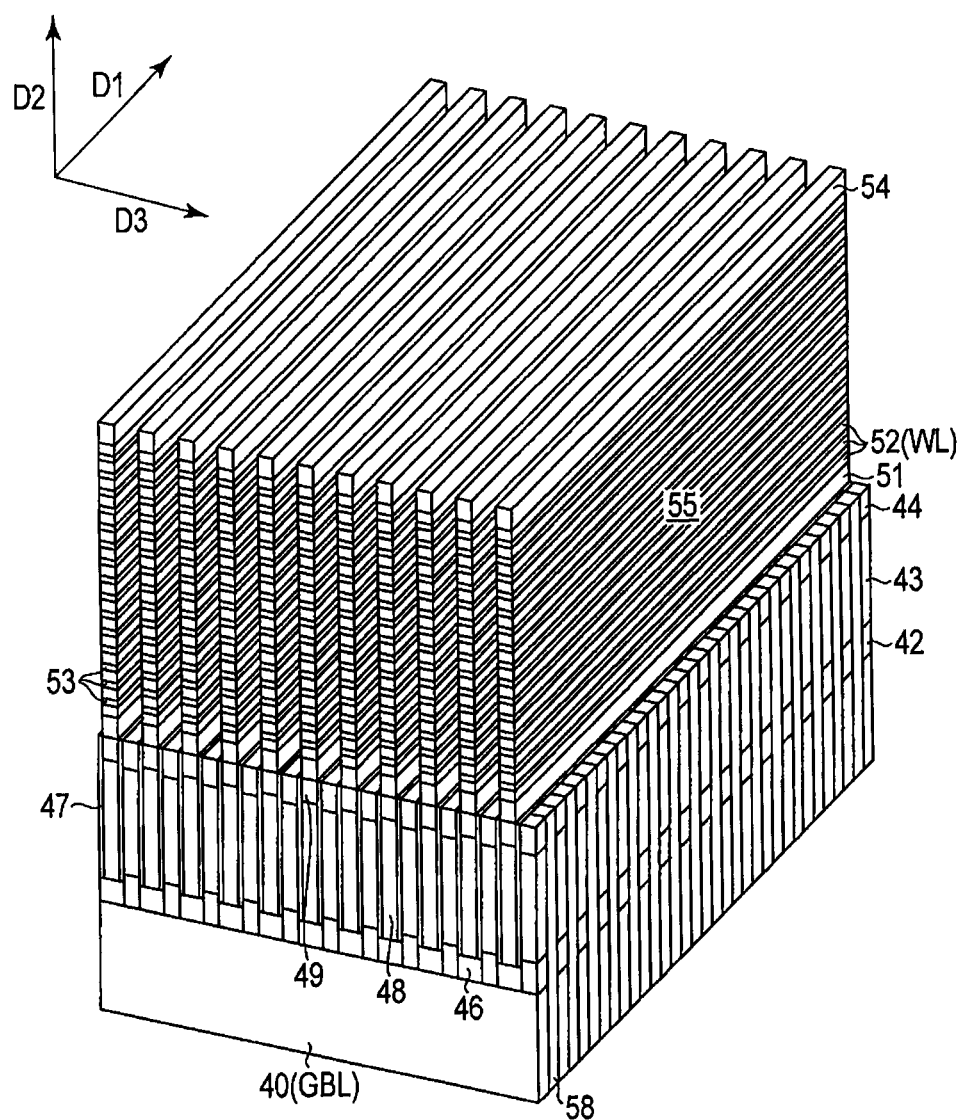
F I G. 24

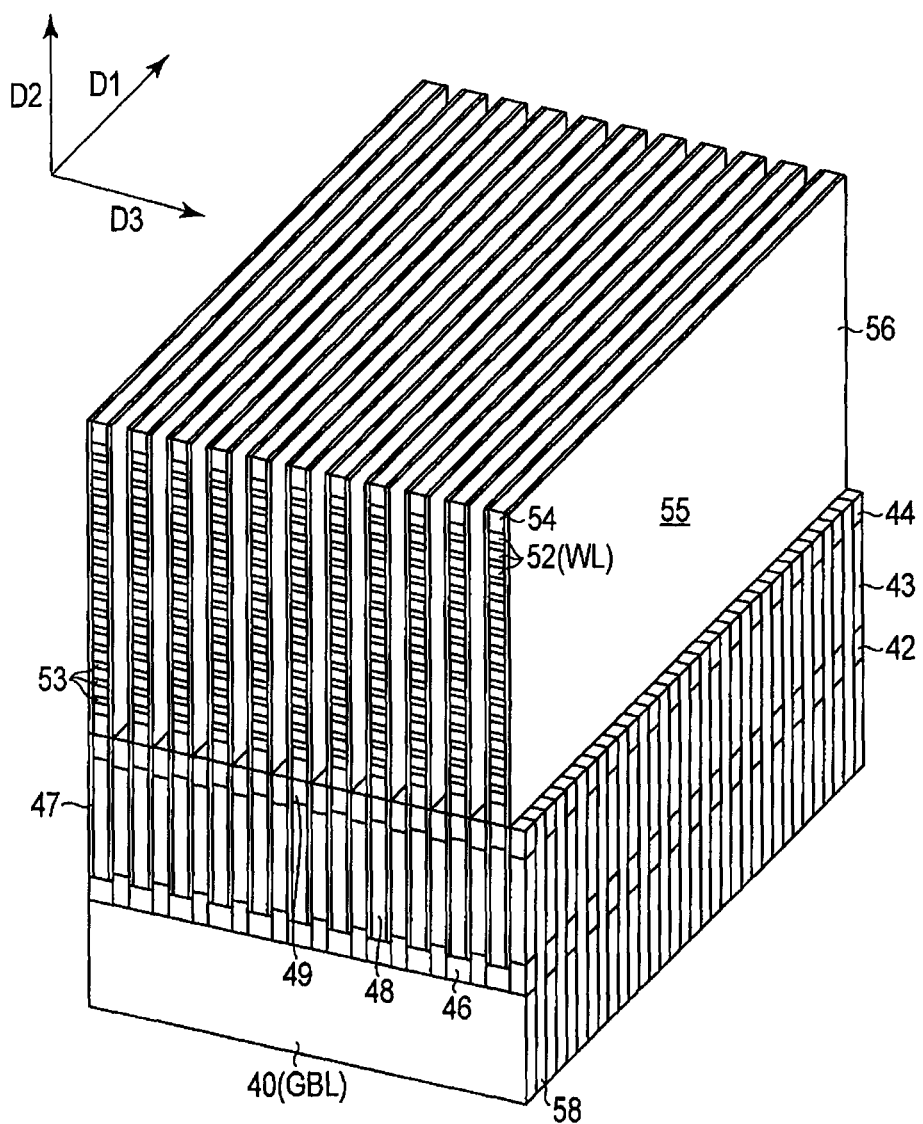
F I G. 25

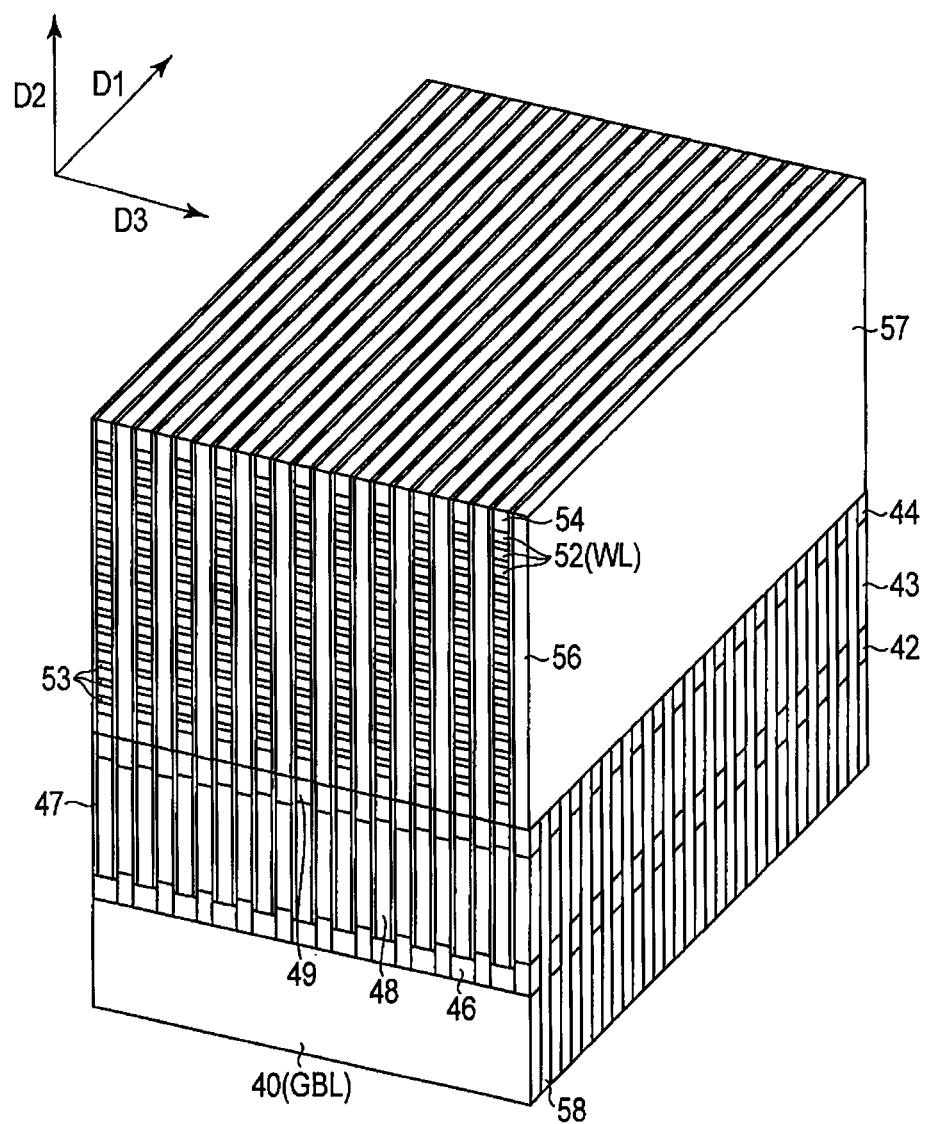
F I G. 26

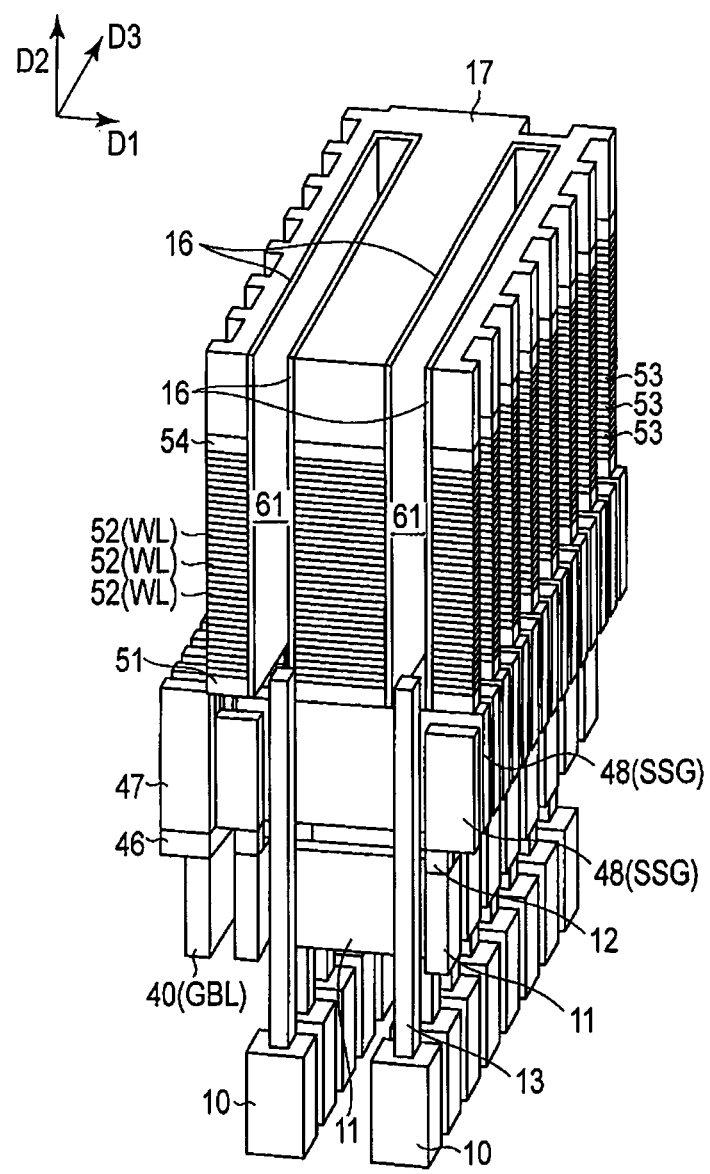
F I G. 44

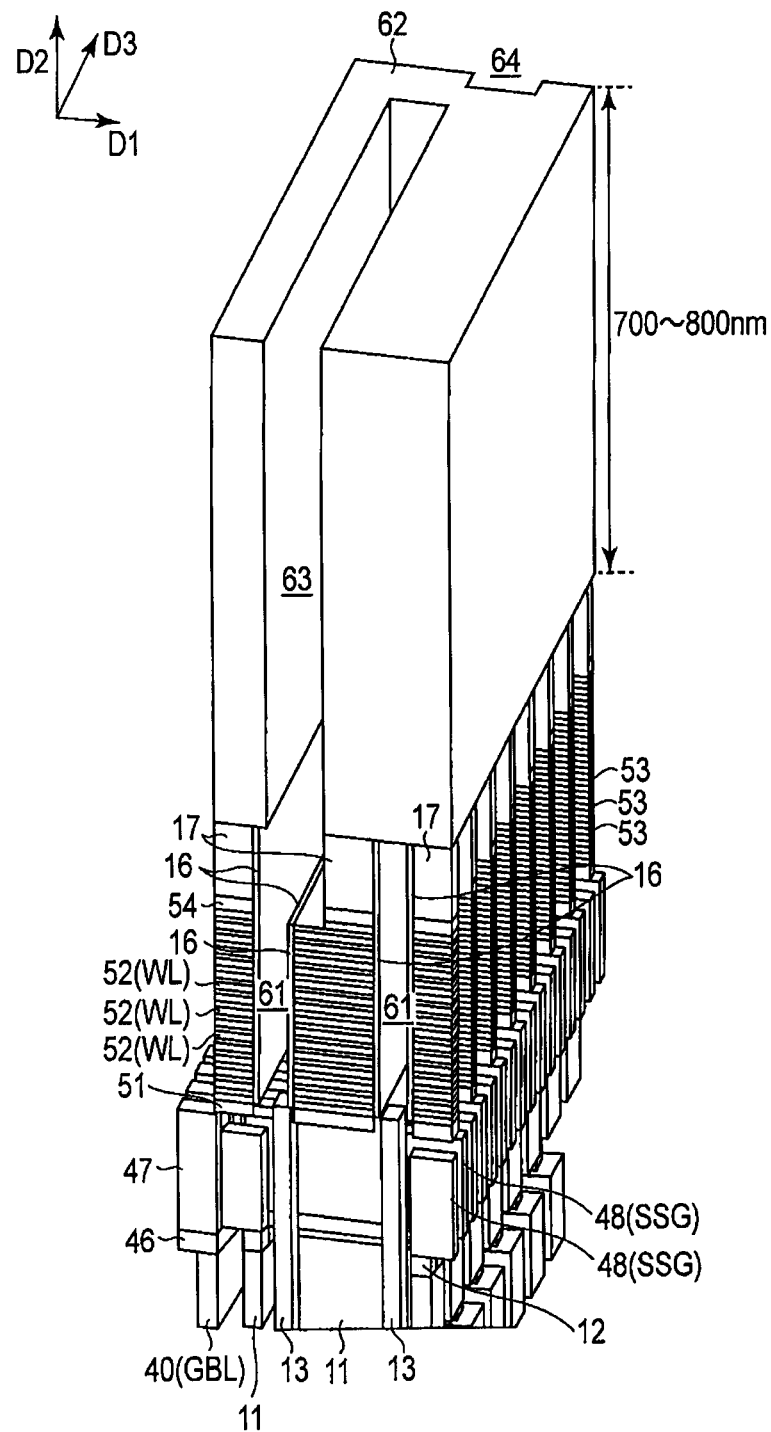
F I G. 45

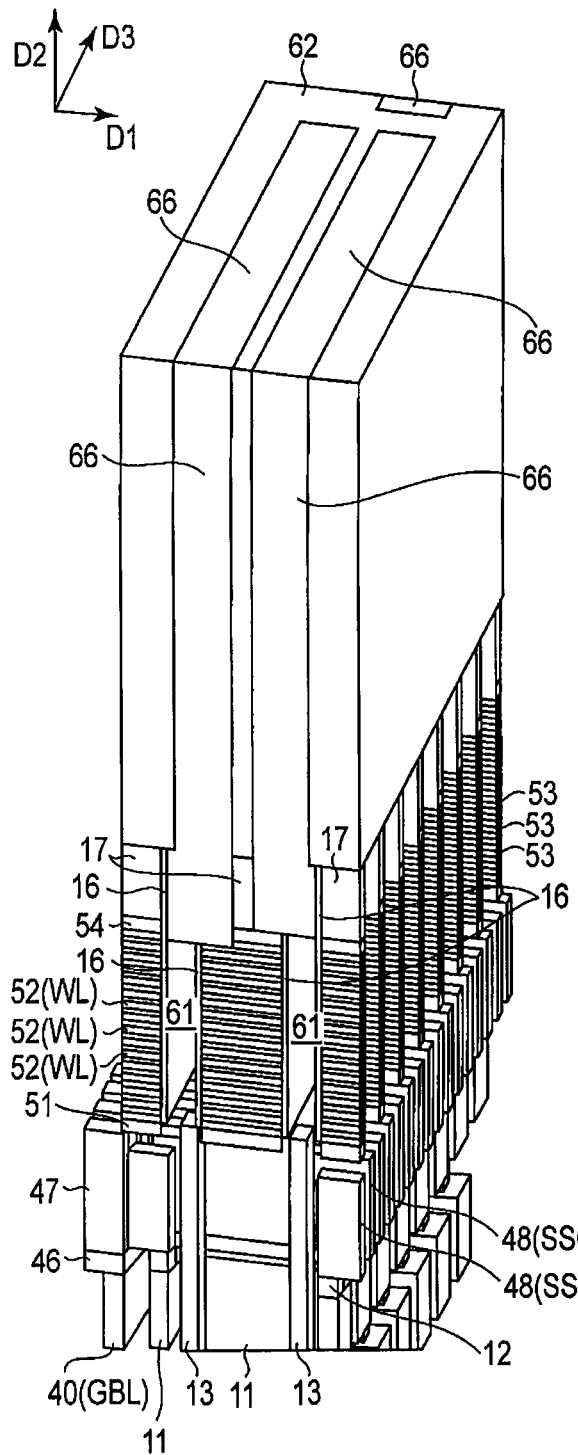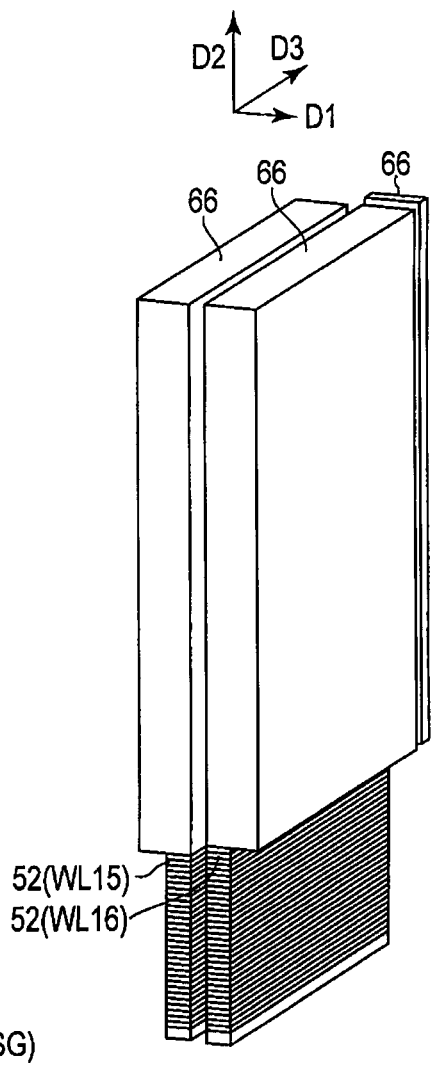
FIG. 47
FIG. 48

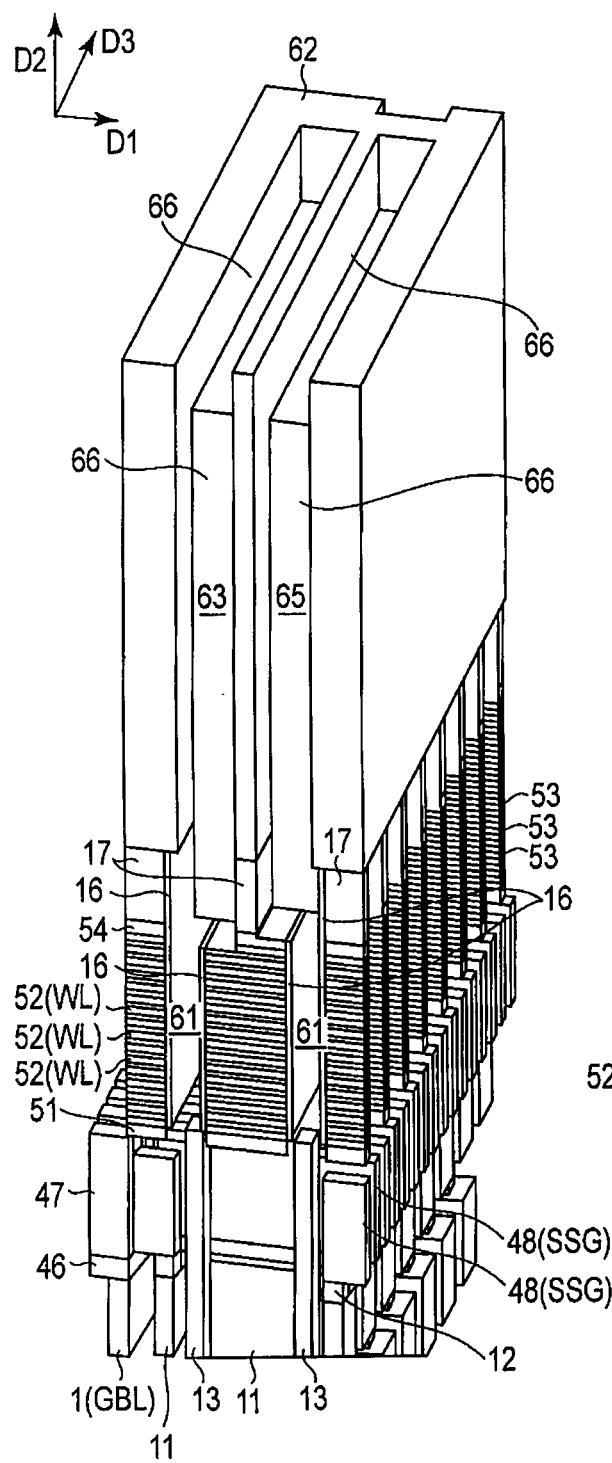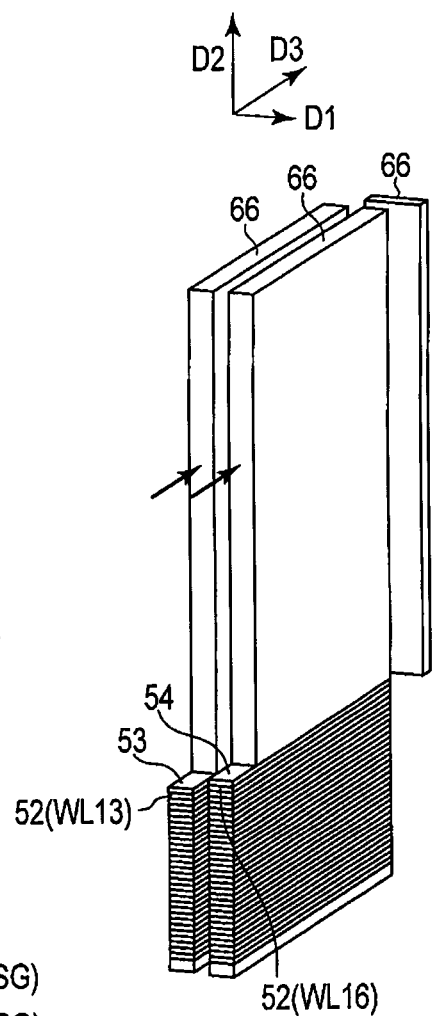
FIG. 49
FIG. 50

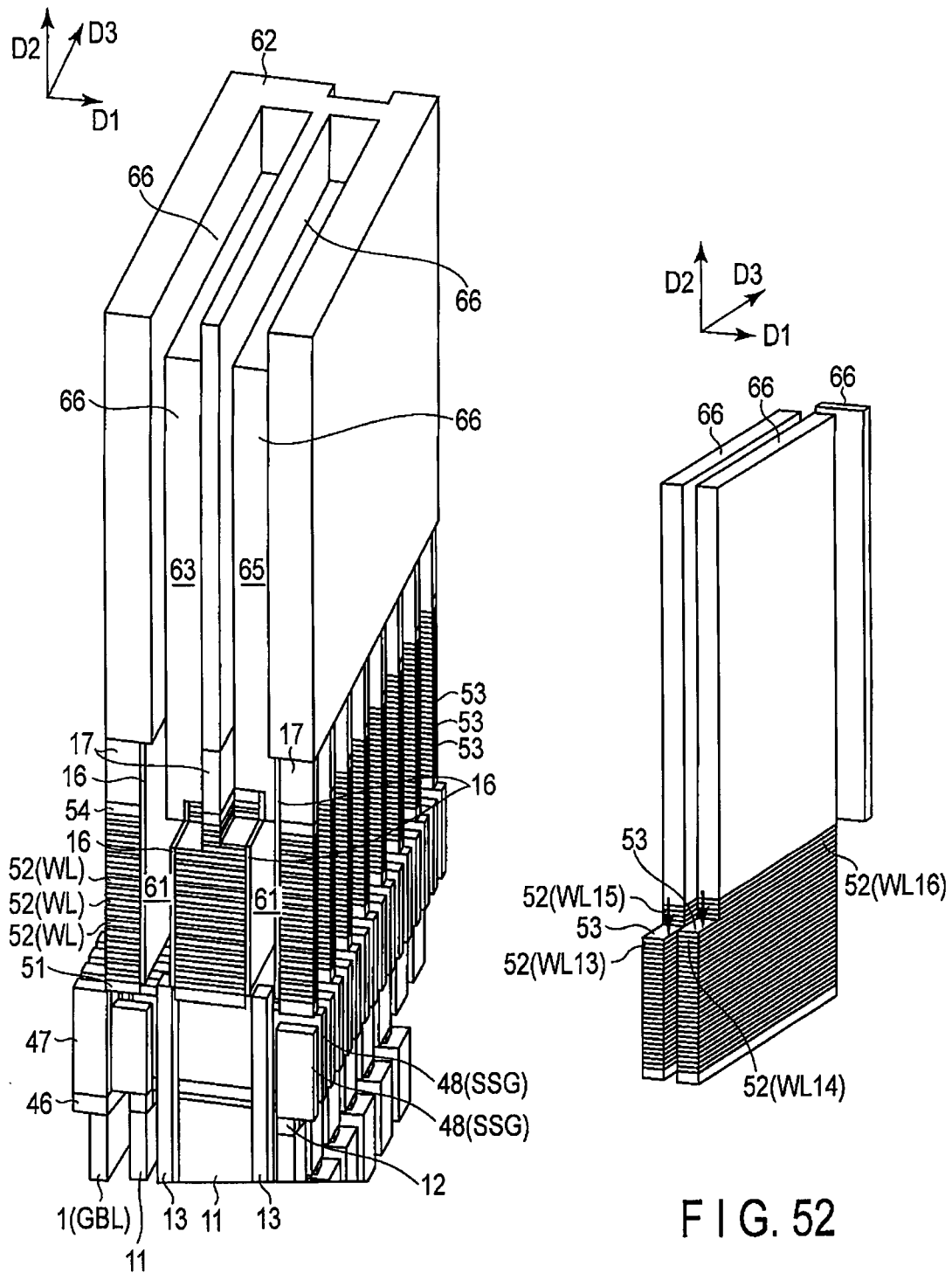
F I G. 51
F I G. 52

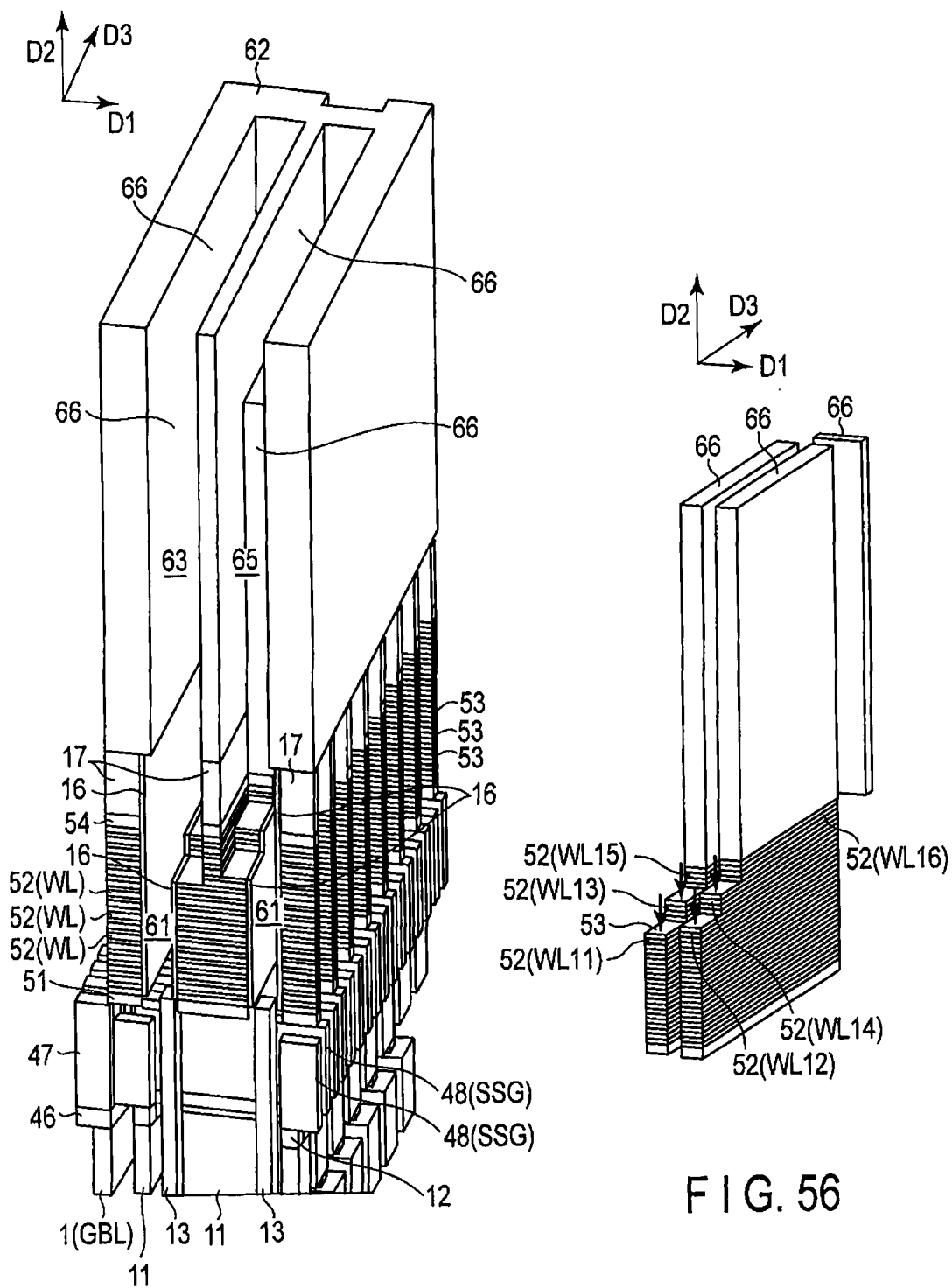
F I G. 55
F I G. 56

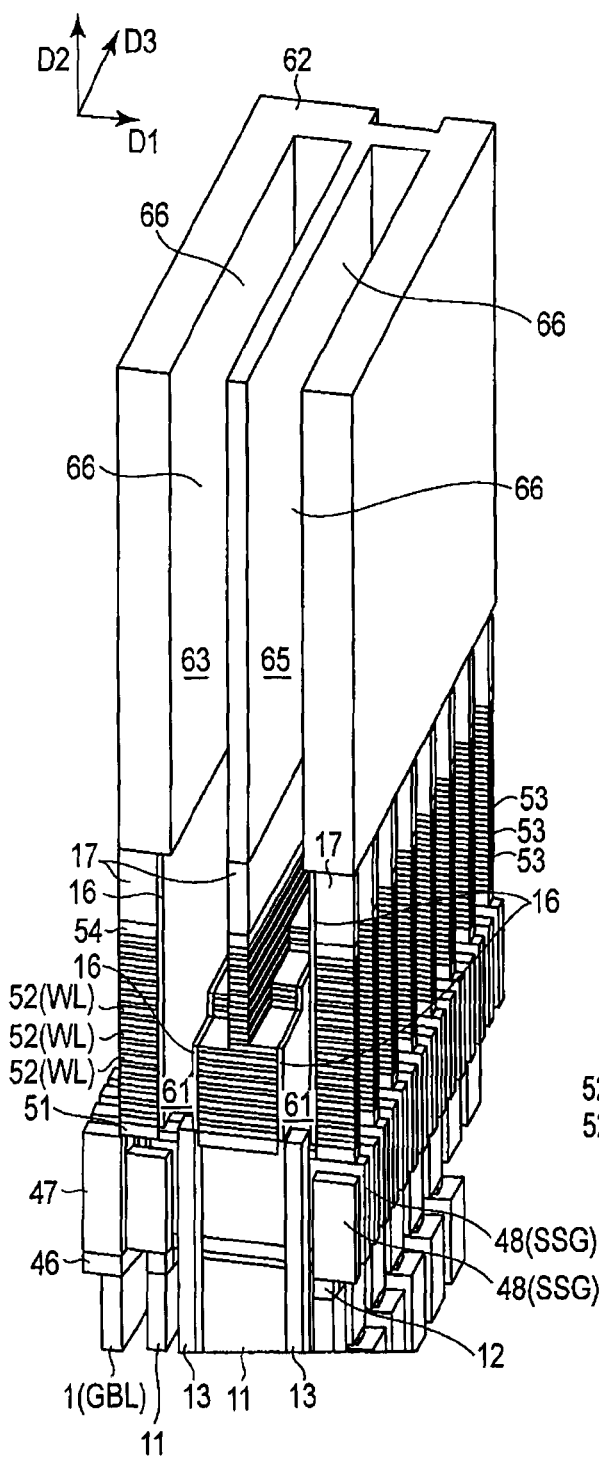
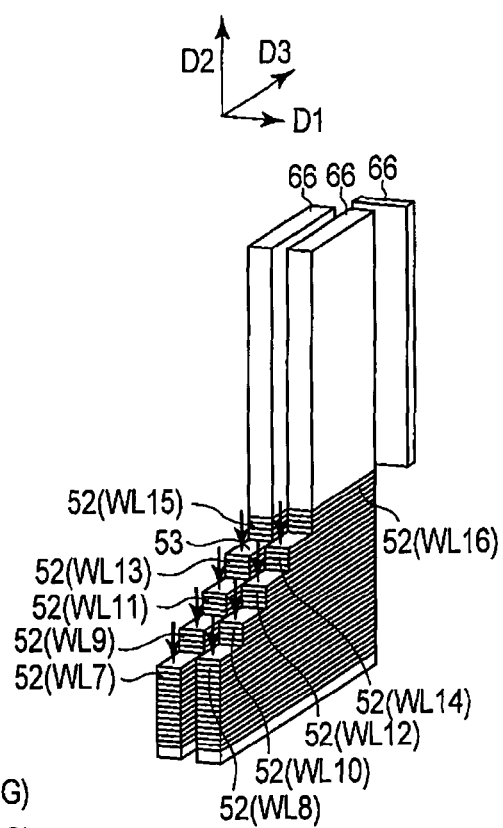
FIG. 63
FIG. 64

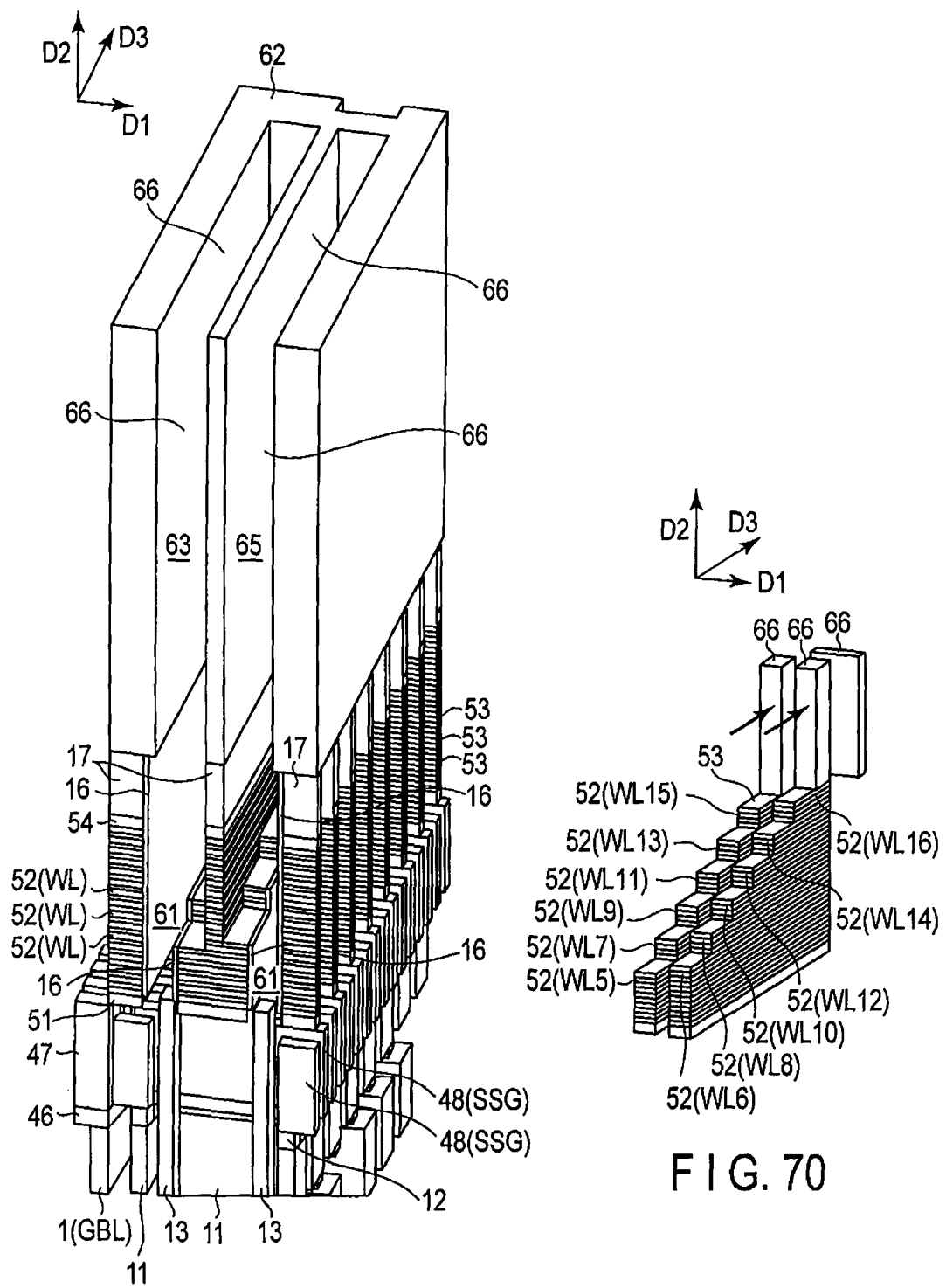
F I G. 69
F I G. 70

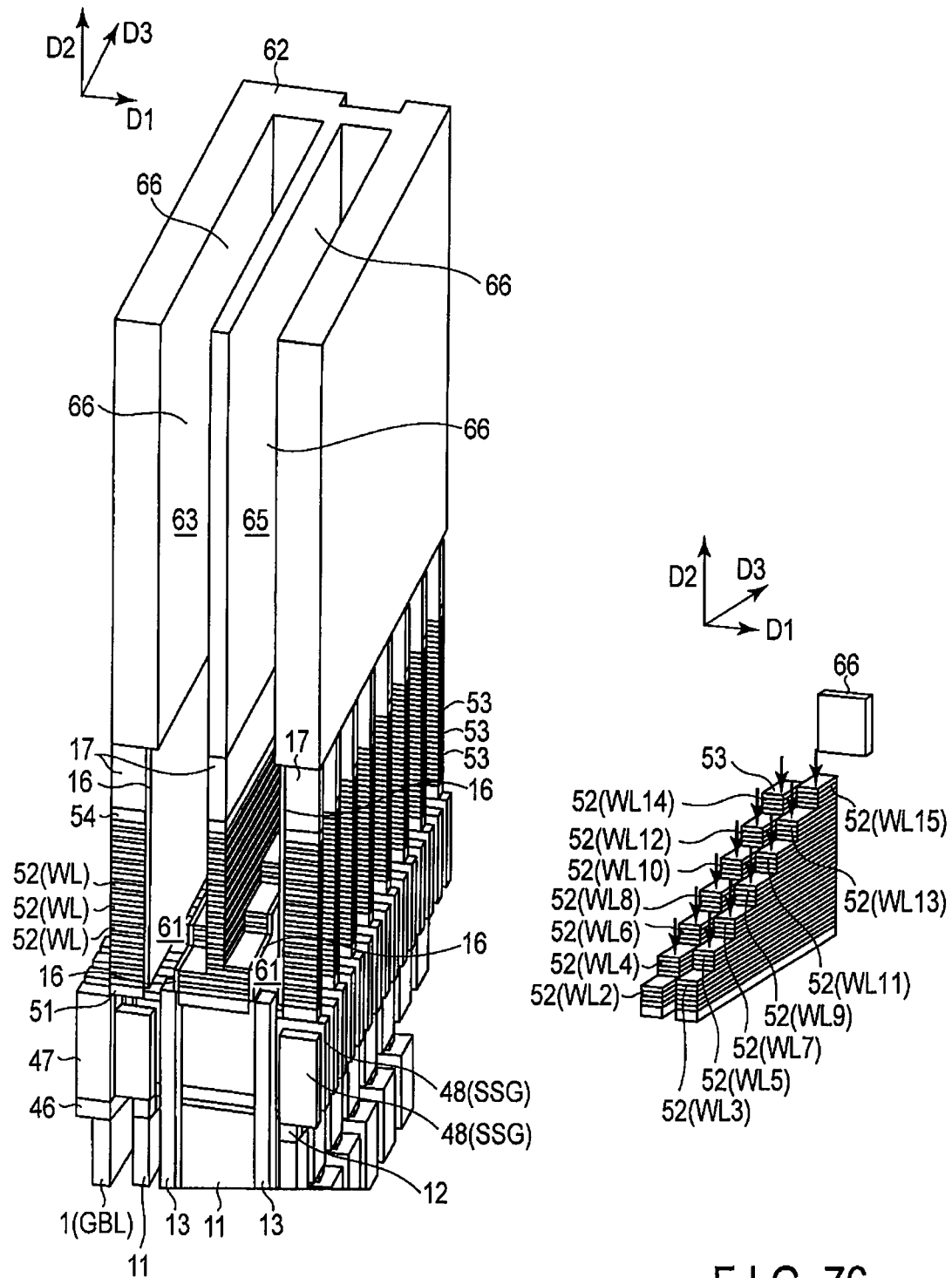
F I G. 75
F I G. 76

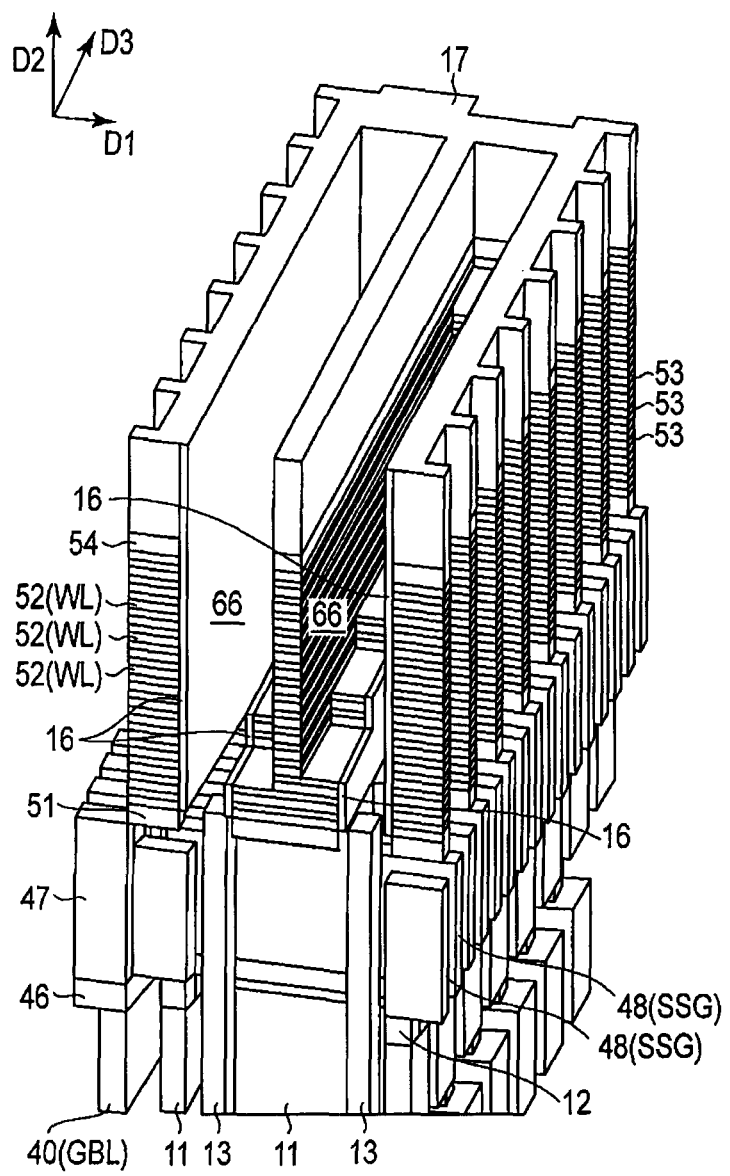
F I G. 77

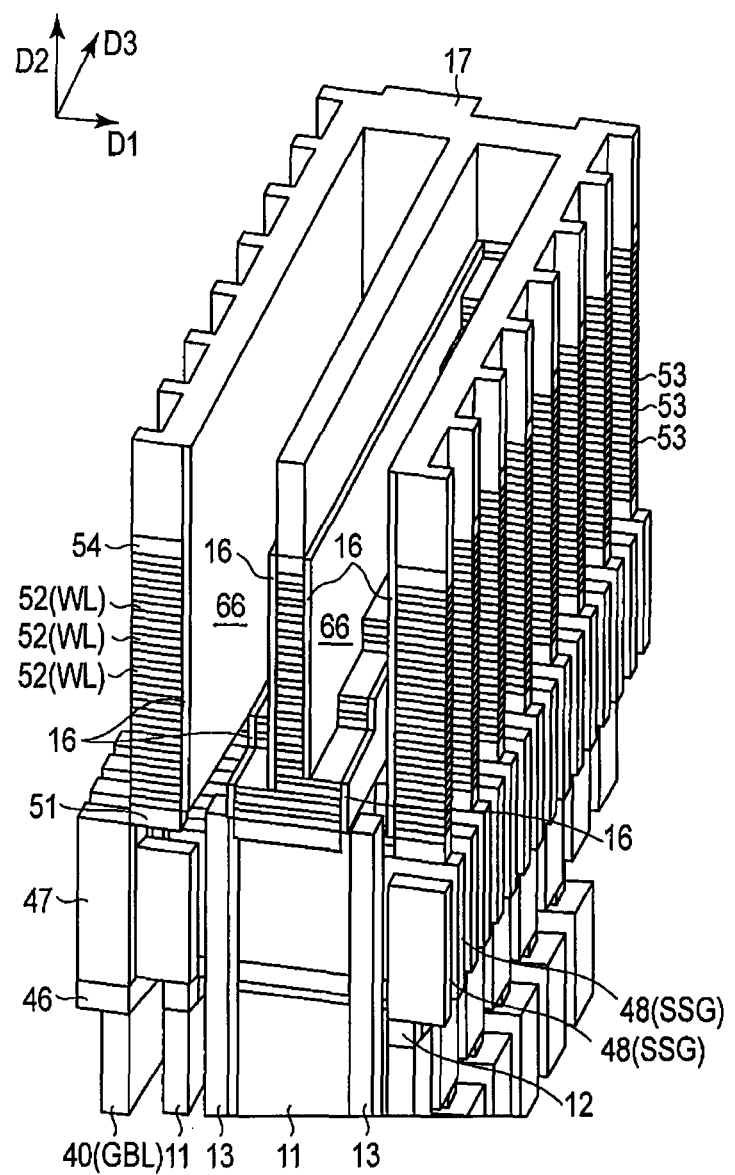
F I G. 78

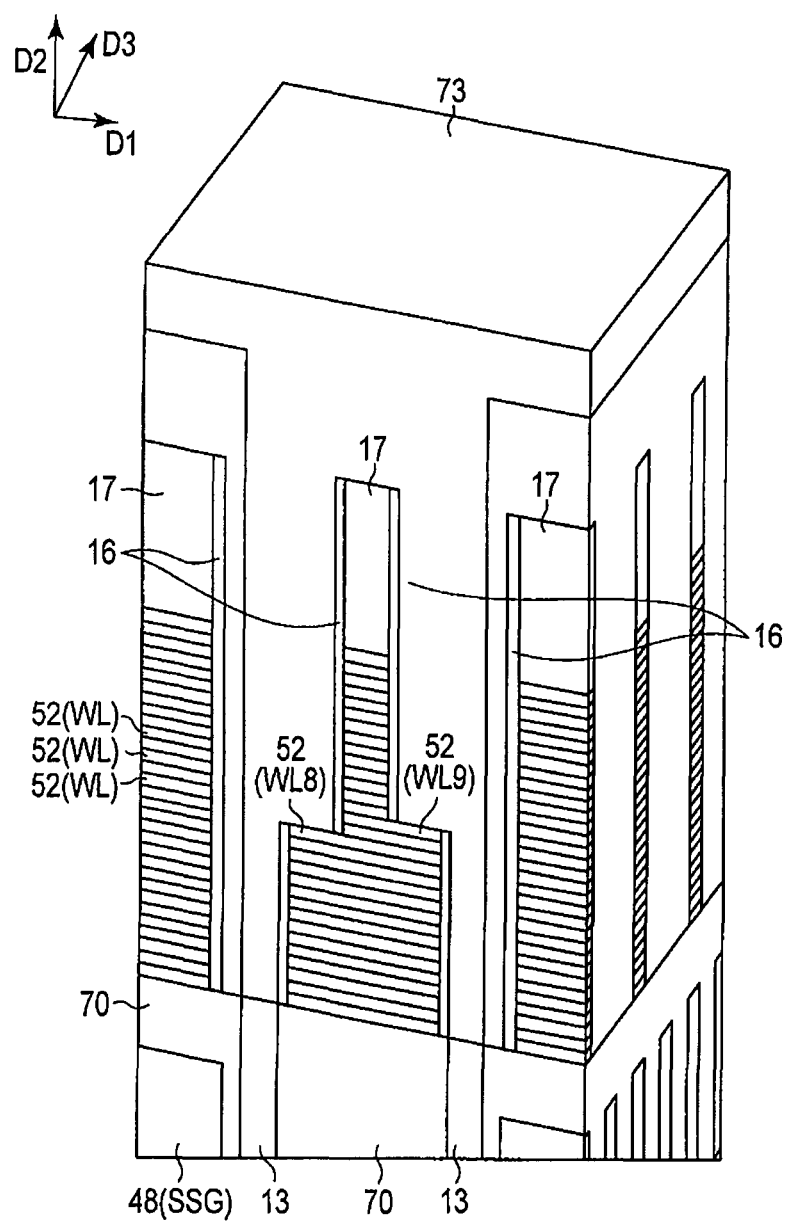
F I G. 80

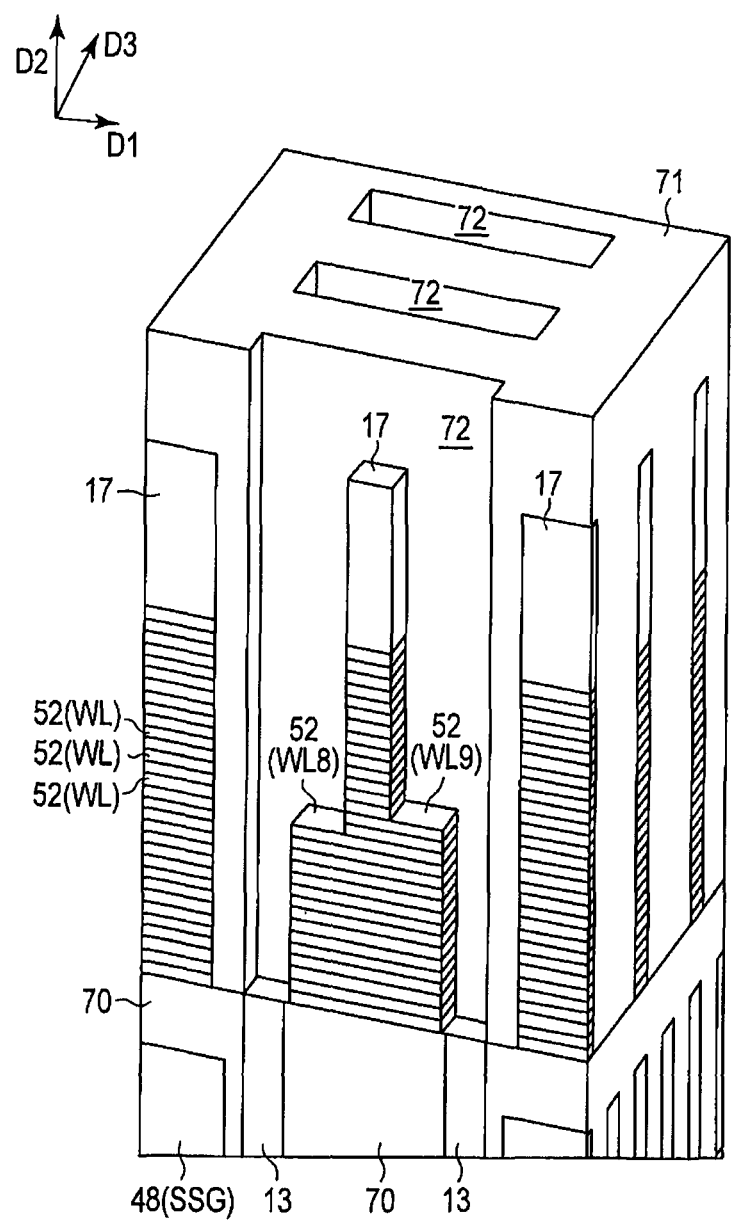
F I G. 82

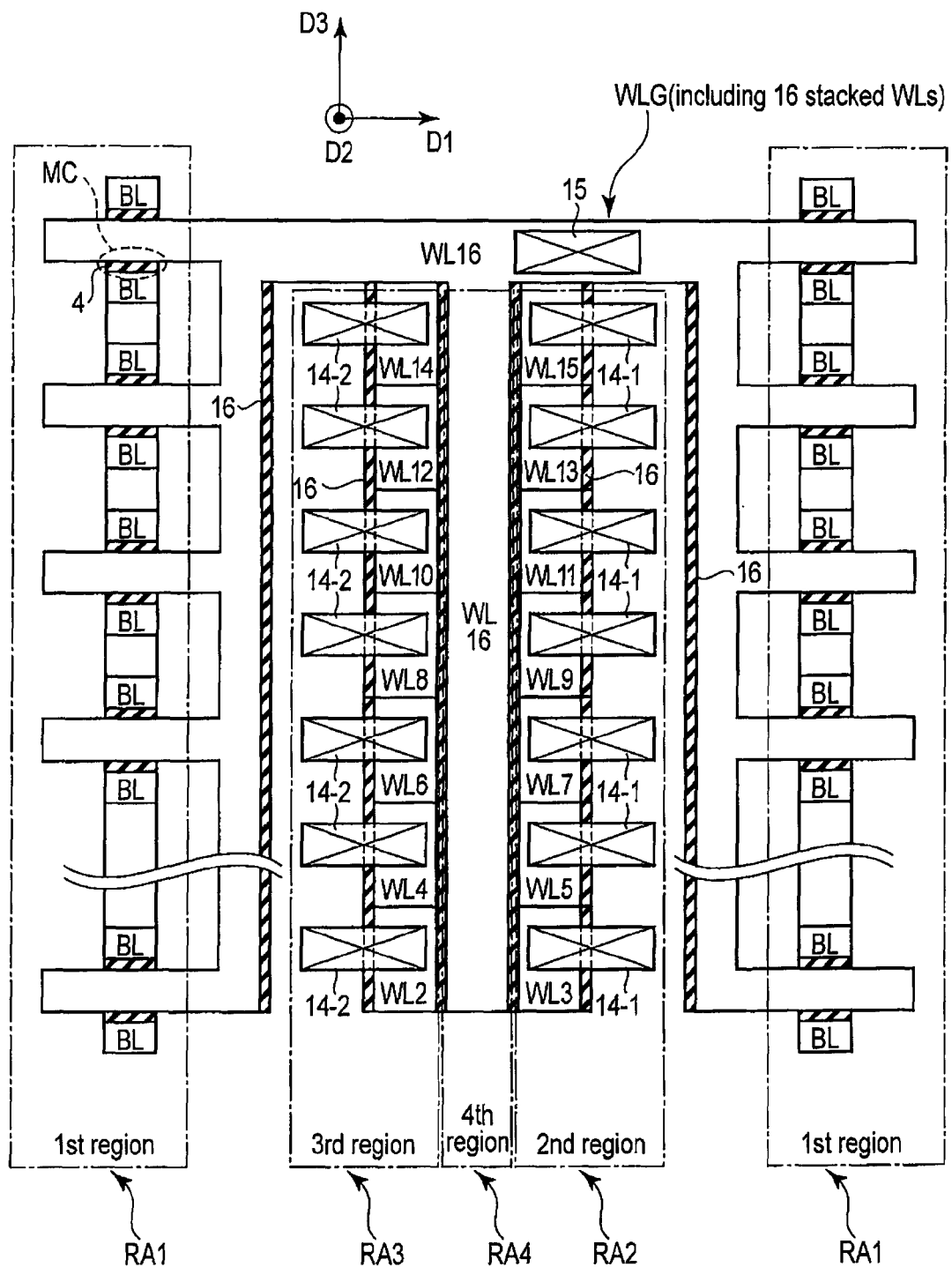
F I G. 83

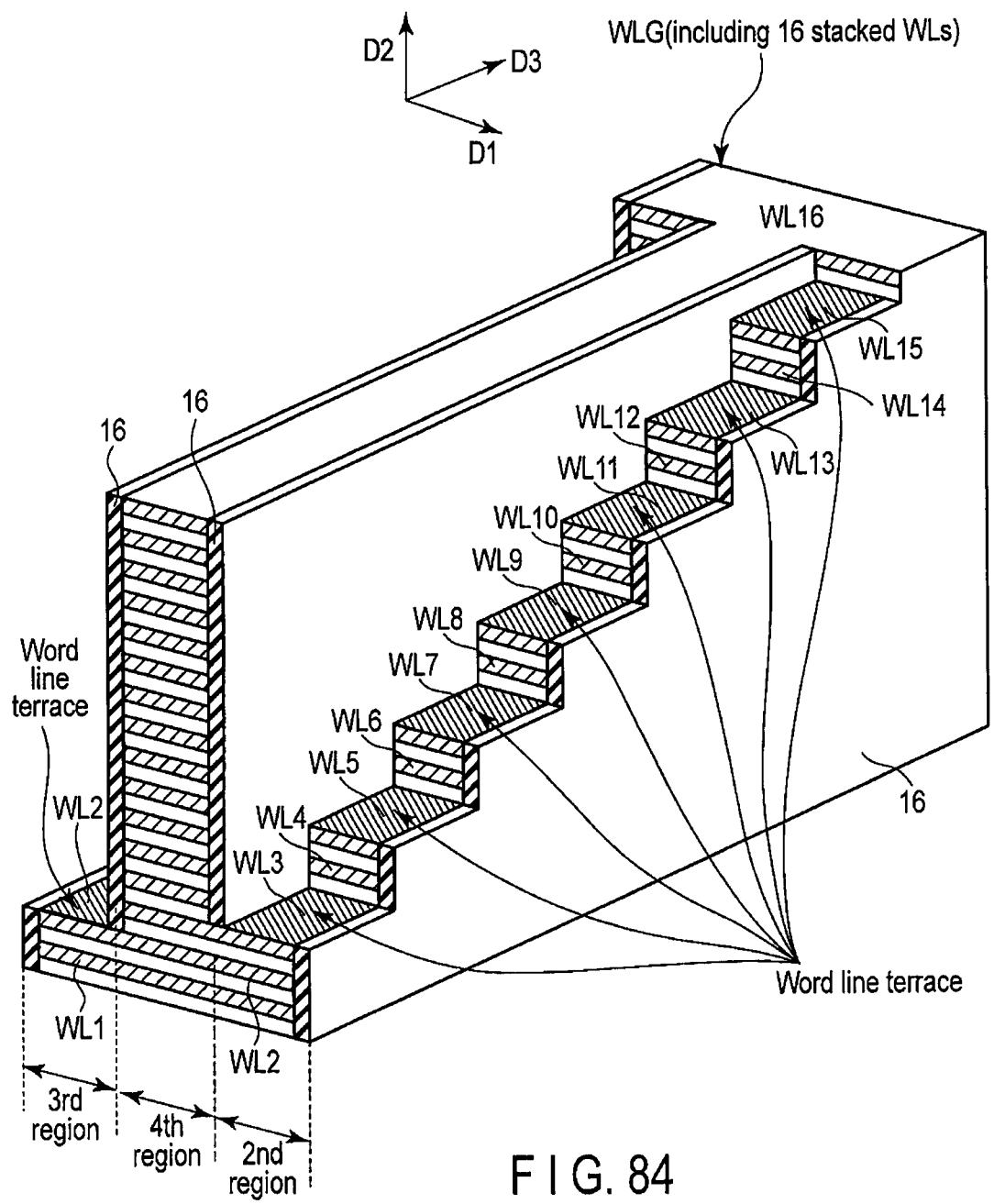
F I G. 84

US 9,673,389 B2

MEMORY DEVICE

FIELD

Embodiments described herein relate generally to a memory device.

BACKGROUND

In recent years, there has been suggested a memory called a resistive RAM (ReRAM), in which each of memory cells is formed with a non-ohmic element typified by a diode and a variable resistance material. The memory cells of the ReRAM do not use any MOSFET. Therefore, the memory cells are expected in that they enable the achievement of a high integration beyond a conventional trend.

BRIEF DESCRIPTION OF THE DRAWINGS

FIGS. 5 and 6 are a perspective view and a plan view of a hook-up-region according to the first embodiment;

FIGS. 16 to 27 are perspective views successively showing fabricating steps of a memory cell region according to a second embodiment;

FIGS. 28, 30, 32, 34, 36, 38, 40 to 47, 49, 51, 53, 55, 57, 59, 61, 63, 65, 67, 69, 71, 73, 75 and 77 to 81 are perspective views successively showing the fabricating steps of the hook-up-region;

FIGS. 48, 50, 52, 54, 56, 58, 60, 62, 64, 66, 68, 70, 72, 74 and 76 are perspective views of word line step portions in FIGS. 47, 49, 51, 53, 55, 57, 59, 61, 63, 65, 67, 69, 71, 73, and 75;

FIG. 82 is a perspective view showing a fabricating step of a hook-up-region according to a modification of the second embodiment;

FIG. 83 is a plan view of the memory cell array according to the first and second embodiments; and FIG. 84 is a perspective view of the word line step portion according to the first and second embodiments.

DETAILED DESCRIPTION

In general, according to one embodiment, a memory device includes: a first interconnect group; a plurality of second interconnects; and a memory cell. In the first interconnect group, first interconnects are stacked. The first interconnect group includes a plurality of first regions in which the first interconnects are formed along a first direction, and a second region in which a plurality of first contact plugs are formed on the first interconnects. The second interconnects are formed along a second direction different from the first direction. The first interconnects are stacked along the second direction. The memory cell includes variable-resistance-layers. The variable-resistance-layers are formed on a side surface of one of the second interconnects, and are coupled with the first interconnects. In the second region, the first interconnect group includes a step portion, and the step portion includes a plurality of terraces. Adjacent terraces have different heights from each other by at least twice a distance between upper surfaces of two layers of the first interconnects which are included in the first interconnects and are adjacent in the second direction.

[First Embodiment]

Hereinafter, a memory device according to a first embodiment will be described with respect to an ReRAM as an example.

1. Re: Structure of Memory Cell Array

Figure 1:
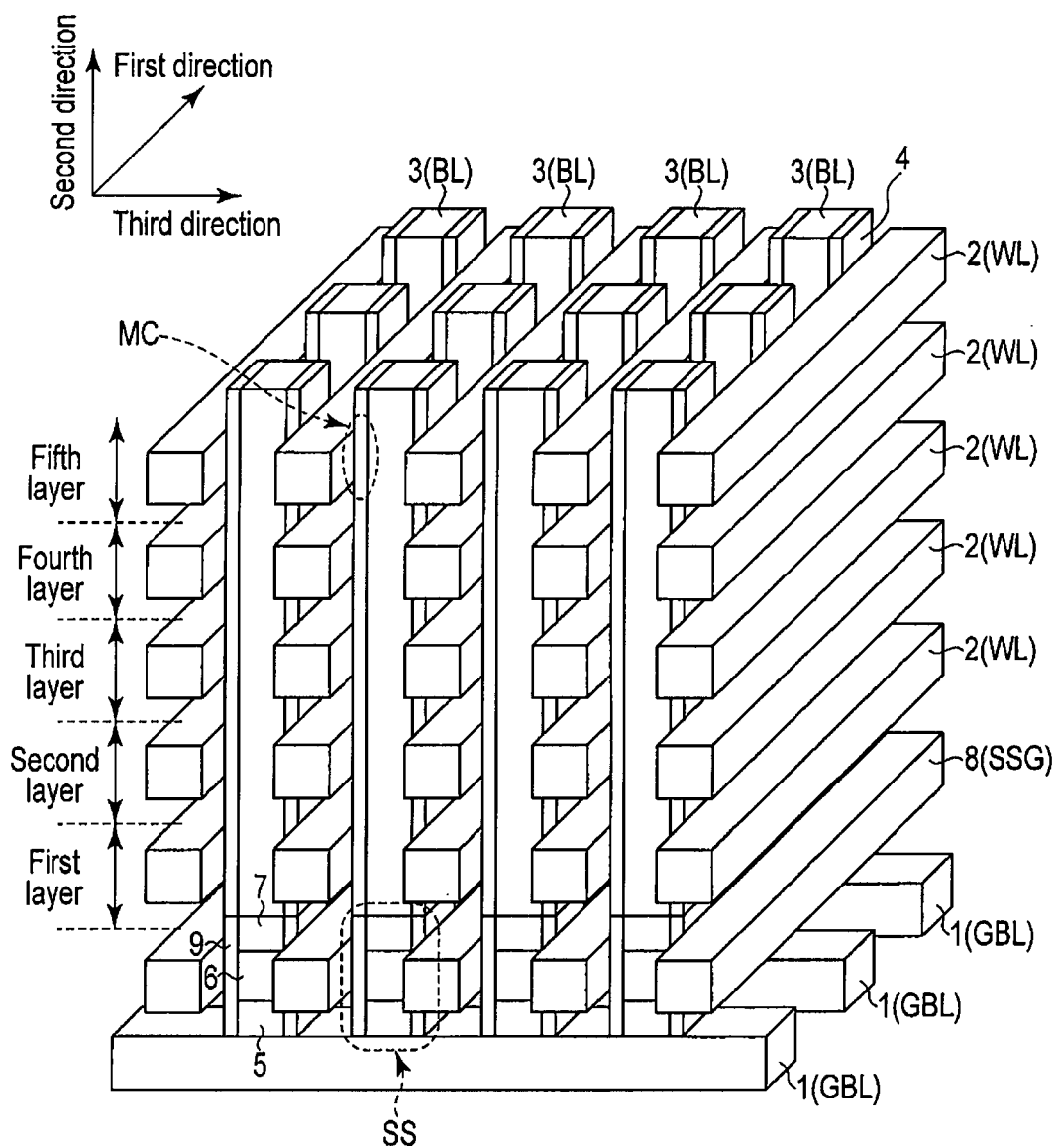
FIGS. 1 and 2 are a perspective view and a sectional view of a memory cell array according to a first embodiment.

FIG. 1 is a perspective view showing a constitution of a partial region of a memory cell array of a semiconductor memory device according to the present embodiment.

As shown, global column lines 1, row lines 2 and column lines 3 are provided in the memory cell array. The global column lines 1 are formed in parallel with one another along a third direction, and are arranged in a lowermost layer of the memory cell array. The row lines 2 are formed in parallel with one another along a first direction orthogonal to the third direction, and are provided at positions higher than the global column lines 1. Moreover, layers of the row lines 2 (a first layer, a second layer, a third layer, . . . of FIG. 1) are provided in a second direction (a normal direction of a plane where the global column lines 1 are arranged) which is orthogonal to both of the third direction and the first direction. The column lines 3, each of which is formed between the adjacent row lines 2, are formed in parallel with one another along the second direction. Furthermore, an end (a lower end) of each of the column lines 3 is electrically connected to one of the global column lines 1. More specifically, in a two-dimensional plane formed in the first and third directions, the column lines 3 arranged in the same column along the third direction are electrically connected to the same global column line 1.

A memory cell MC including a variable resistance element is formed between each of the row lines 2 and each of the column lines 3. In the present example, a variable resistance material 4 is formed on the whole side surface of the column line 3 (the surface facing the row line 2), and this material functions as the memory cell MC. It is to be noted that the variable resistance material 4 in the present example is provided on two side surfaces of the column line which face each other in the third direction (the two side surfaces facing the row lines 2), and are not provided on two side surfaces which face each other in the first direction (the two side surfaces which do not face the row lines 2) in two sets of the facing side surfaces of the column line 3.

A selection element (sheet selector) SS is provided between the global column line 1 and the corresponding column line. The selection element SS includes a source region 5 formed on the global column line 1, a silicon layer (a channel region) 6 formed on the source region 5, and a drain region 7 formed on the silicon layer 6. Furthermore, a selection gate line 8 along the first direction is formed between the adjacent silicon layers 6. The selection gate line 8 is disposed in parallel with the row lines 2. Furthermore, a gate insulating film 9 is formed between the selection gate line 8 and the silicon layer 6.

It is to be noted that hereinafter, the global column lines 1, the row lines 2 and the column lines 3 are referred to as the global bit lines GBL, the word lines WL, and the bit lines BL, respectively, in the same manner as in a usual MOS type memory device.

Figure 2:
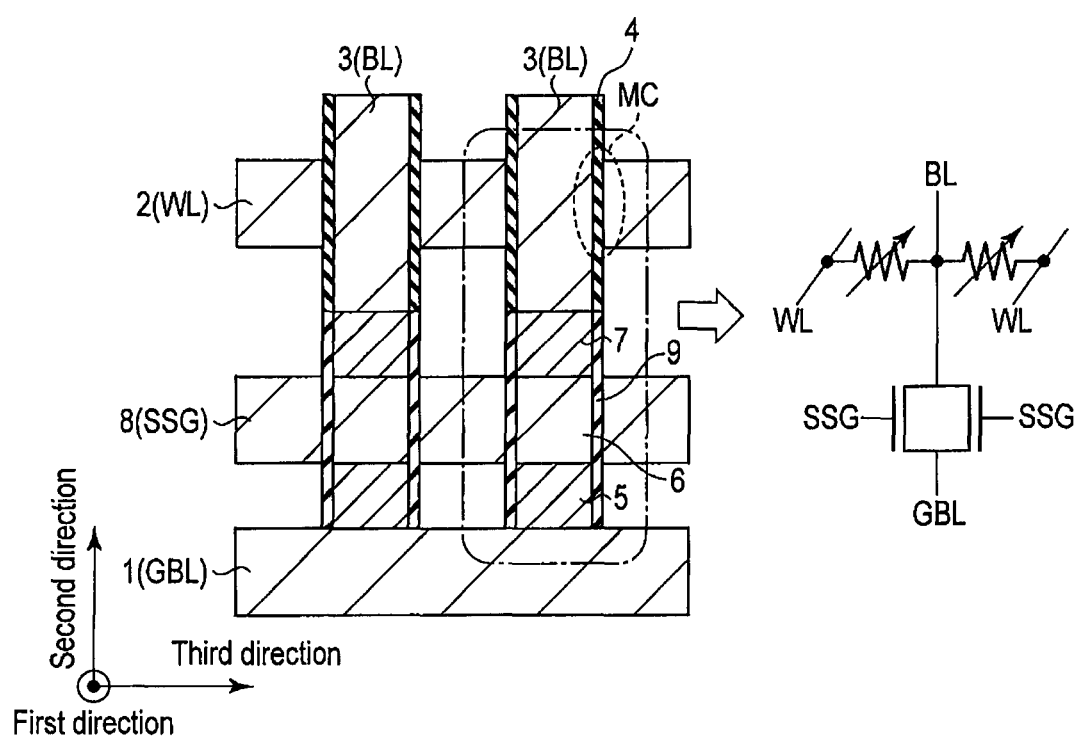

FIG. 2 shows a sectional view of the memory cell array and an equivalent circuit of a partial region of the array, and shows a structure of the partial region in a plane formed in the second direction and the third direction of FIG. 1. As shown, the source region 5, the channel region 6, and the drain region 7 for forming the selection element SS are successively stacked on one of the global bit lines GBL. Moreover, the gate insulating film 9 is formed on each side surface of this stack structure. Moreover, the selection gate line 8 (SSG) is provided between the channel regions 6 adjacent in the third direction. The source region 5, the channel region 6, the drain region 7, the gate insulating film 9, and the selection gate line 8 (SSG) form an MOS transistor which functions as the selection element SS. That is, the selection element SS includes two gates connected to different selection gate lines SSG, respectively, for one set of the source region 5, the channel region 6 and the drain region 7. In other words, it can be considered that one bit line BL is provided with two MOS transistors, and these transistors share the source region 5, the channel region 6, and the drain region 7, but the gates are connected to the different selection gate lines SSG. Moreover, the selection elements SS which are associated with the different bit lines BL and disposed adjacent in the third direction share the gate (the selection gate line SSG).

The pillar-shaped bit lines BL are formed on the source regions 7 of the selection elements SS. Moreover, the variable resistance materials 4 which function as the memory cells MC are formed on the side surfaces of the bit lines BL. Furthermore, the word lines WL are formed in a region between the bit lines BL adjacent in the third direction. The variable resistance material 4 is formed by using, for example, HfO in the material so that the material contact with the bit lines BL and the word lines WL. The variable resistance material 4 typified by this HfO is a material which transits between at least two resistance values of a low resistance state (LRS) and a high resistance state (HRS). Moreover, it is known that the variable resistance material of the high resistance state transits to the low resistance state when a predetermined or larger voltage is applied and that the variable resistance material of the low resistance state transits to the high resistance state when a predetermined or larger current flows. In particular, an element which performs the transition from the high resistance state to the low resistance state and the transition from the low resistance state to the high resistance state when the voltage is applied with different polarities is called a bipolar operation element. The variable resistance material 4 which performs such an operation can be formed by using a thin film including at least one of materials such as $TiO_2$, $ZnMn_2O_4$, NiO, AlO, $SrZrO_3$, $Pr_{0.7}Ca_{0.3}MnO_3$ and carbon in addition to HfO.

As described above, the memory cells MC each including the variable resistance material 4 provided between the word line WL and the bit line BL are arranged with, for example, a three-dimensional matrix arrangement in the memory cell array. In the present structure, the word lines WL and the bit lines BL simply form a line and space pattern. Moreover, it is required that the word lines WL and the bit lines BL is in an orthogonally positional relation, but any fluctuation in the word line direction and the bit line direction does not have to be taken into consideration. Therefore, about a positioning accuracy in the memory cells during fabrication, it is not necessary to be remarkably nervous, and the fabrication can easily be performed. Moreover, this structure is a highly integrated structure where one bit of information can be stored in a region of $2F^2$.

Figure 3:
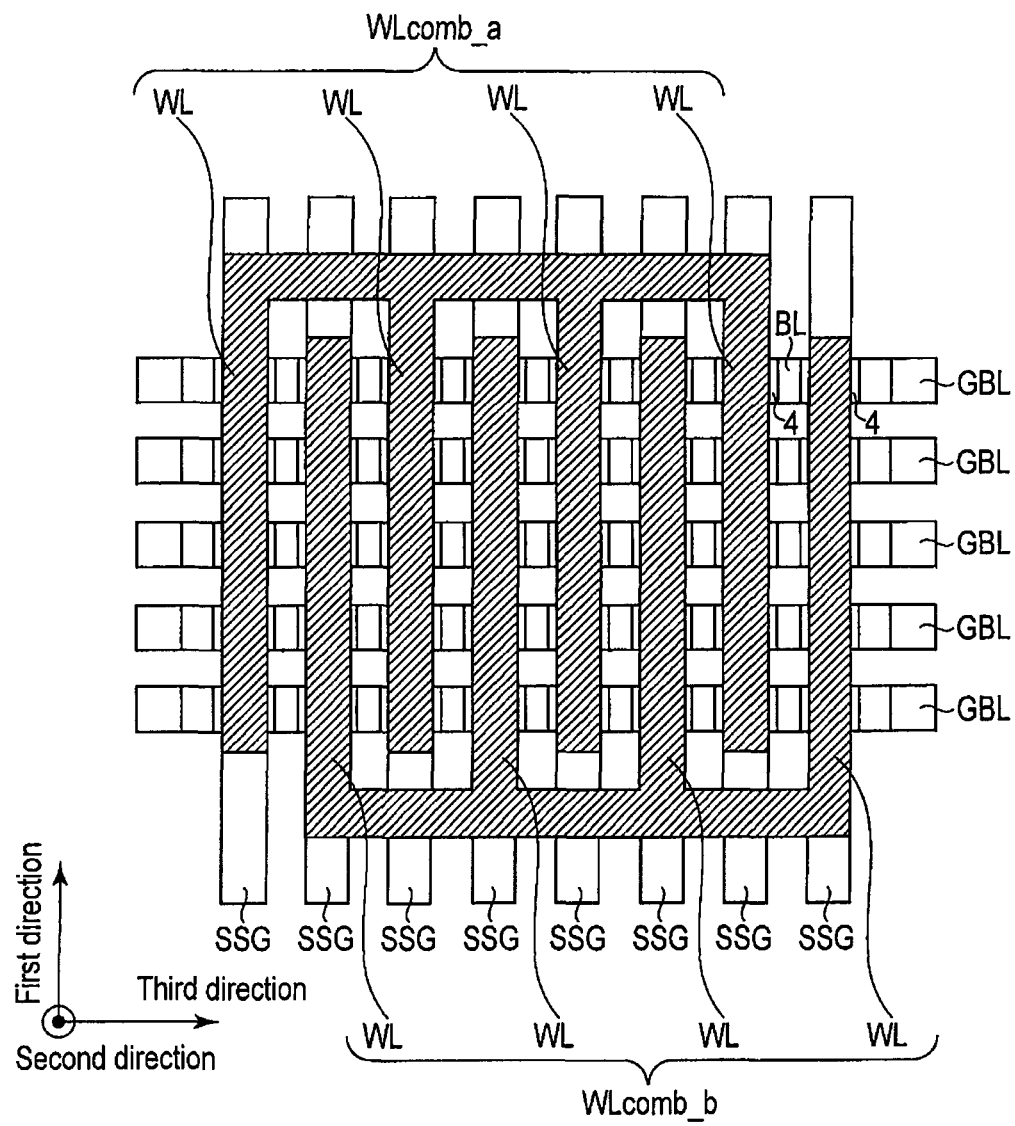
FIGS. 3 and 4 are plan views of the memory cell array according to the first embodiment.

FIG. 3 is a plan view of the memory cell array showing a structure of a partial region in the plane formed in the first direction and the third direction of FIG. 1, and is especially a view for explaining a planar pattern of the word lines WL. That is, FIG. 3 shows the pattern of the word lines WL in one of the layers of FIG. 1. In FIG. 3, a shaded region shows the word lines WL.

As shown, the word lines WL are alternately connected in common. In other words, the memory cell array includes two sets of word lines WL each having a comb-like structure, and a linear region along the first direction of the word lines WL alternately belong to one of the comb-like structures. Furthermore, the present structure can be considered as follows. That is, among the word lines WL arranged in order from the right side of the drawing sheet of FIG. 3, the same voltage is electrically applied to the odd-numbered word lines WL (or these word lines are connected in common). On the other hand, the same voltage is electrically applied also to the even-numbered word lines WL (or these word lines are connected in common). Moreover, a different voltage can be applied between the odd word line and the even word line (or the odd word lines and the even word lines are separated).

Hereinafter, the set of the odd word lines (the first, the third, the fifth, . . . ) is referred to as the word line group WLcomb_a, and the set of the even word lines (the zeroth, the second, the fourth, . . . ) is referred to as the word line group WLcomb_b. Moreover, when both the groups are not distinguished, each group is simply referred to as the word line group WLcomb.

It is to be noted that FIG. 3 shows a case where eight word lines, five global bit lines GBL, and 45 bit lines BL are included, but this is merely an illustration, and these numbers of the lines can suitably be selected.

Figure 4:
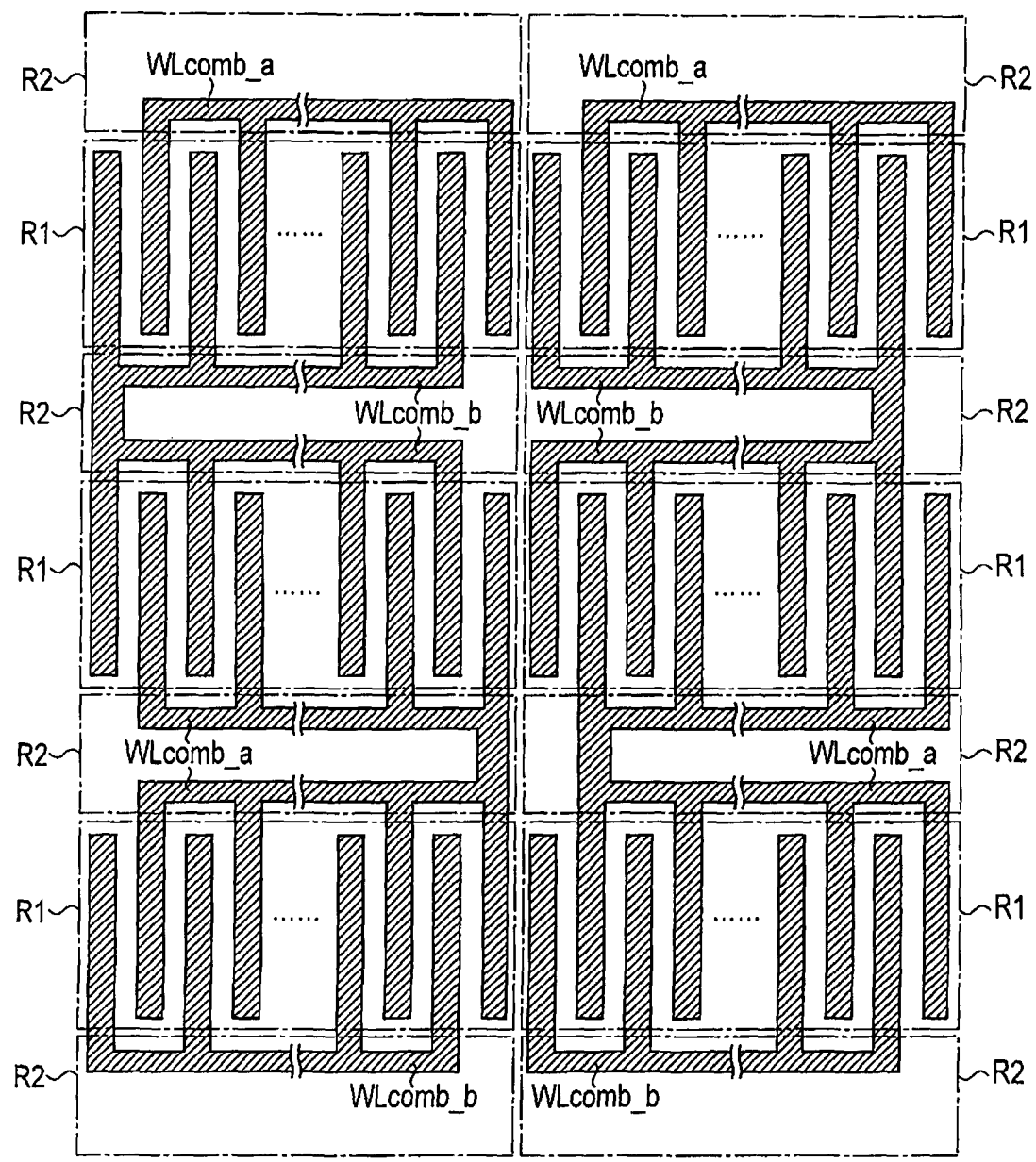

The memory cell array is formed as an array of a structure shown in FIG. 3. FIG. 4 is a plan view showing the whole memory cell array, and shows a structure in a plane formed in the first direction and the third direction of FIG. 1. A shaded region in FIG. 4 shows the word lines WL.

As shown, the memory cell array includes memory cell regions R1, and hook-up-regions R2. The memory cell regions R1 are regions where the word lines WL are arranged along the first direction and the memory cells MC are provided. FIG. 1 described above corresponds to a structure of the memory cell region R1.

The hook-up-regions R2 are regions for connecting the interconnects in the memory cell array to a peripheral circuit provided underneath the memory cell array. Each of the hook-up-regions R2 is provided between the memory cell regions R1 adjacent in the first direction. In the hook-up-region R2, the interconnects along the third direction are formed, and via the interconnects, the word lines WL belonging to the same word line group WLcomb are connected in common. Further in the hook-up-region R2, the same word line group WLcomb is connected in common between two memory cell regions R1 adjacent via the hook-up-region R2.

Figure 6:
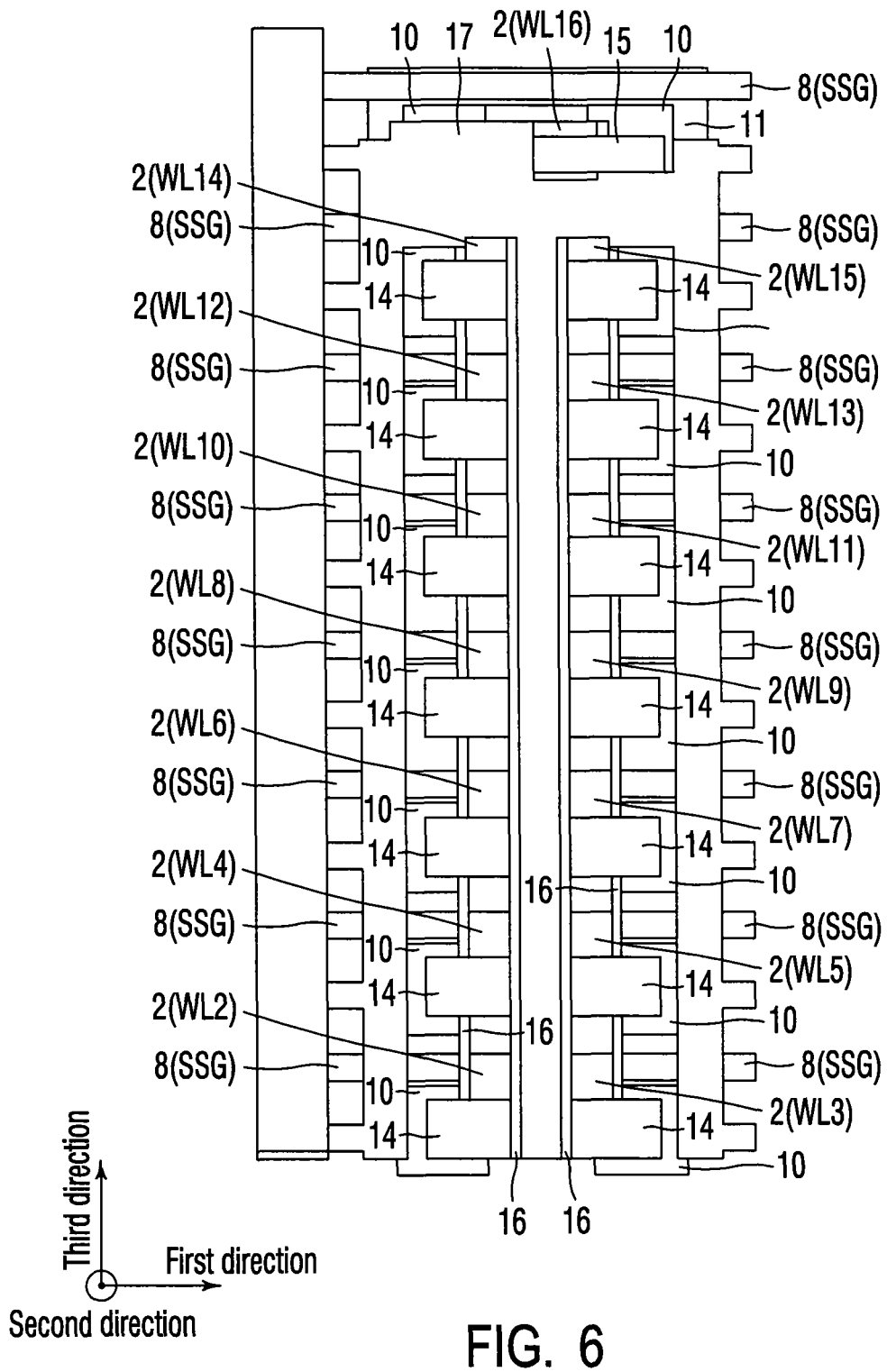

Next, details of the structure of the hook-up-region R2 will be described with reference to FIG. 5 and FIG. 6. FIG. 5 is a perspective view of the hook-up-region. Moreover, FIG. 6 is a plan view of the hook-up-region R2, and shows a plane formed in the first direction and the third direction. It is to be noted that to clearly illustrate the structure of the hook-up-region R2 in FIG. 5 and FIG. 6, the illustration of an interlayer insulating film and the like which are not especially noted is omitted. Hereinafter, there will be described an example where eight word lines WL are included in the same word line group WLcomb in one memory cell portion R1. Moreover, the number of the stacked word lines WL is 16 layers, and the respective layers are referred to as the word lines WL1 to WL16 in stacking order from below.

As shown, 16 metal interconnect layers 10 connected to the peripheral circuit (e.g., a word line driver which applies a bias to the word lines WL) are formed at a level below the global bit line 1 (GBL). Moreover, the selection gate lines 8 (SSG) pass over a region on the metal interconnect layers 10. Via these passing interconnects, the selection gate lines SSG of two memory cell regions R1 adjacent in the first direction via the hook-up-region R2 shown in FIG. 5 are connected in common. In this case, the selection gate lines SSG are alternately connected by using an interconnect for bypass. That is, the selection gate lines SSG in a first group are connected to each other between two memory cell regions R1 via the passing interconnects provided at the same level. On the other hand, the selection gate lines SSG in a second group which are adjacent to the first group selection gate lines SSG are drawn to the hook-up-region R2, and then connected to each other between two memory cell regions R1, via a metal interconnect layer 11 provided at the same level as the global bit line GBL and laid out to bypass the region on the metal interconnect layer 10. The selection gate line SSG is connected to the metal interconnect layer 11 via, for example, a contact plug 12. A contact plug 13 is formed on the metal interconnect layer 10. The contact plug 13 is provided in a region made by a bypass pattern of the metal interconnect layer 11, and formed at such a height as to reach the bottom surface of the word line WL1.

Furthermore, at a level above the selection gate lines SSG, the word line group WLcomb of 16 layers is drawn into the hook-up-region R2. Moreover, the word lines WL2 to WL15 are connected to the contact plugs 13 via contact plugs 14, and the word line WL16 is connected to the contact plug 13 via a contact plug 15.

Figure 7:
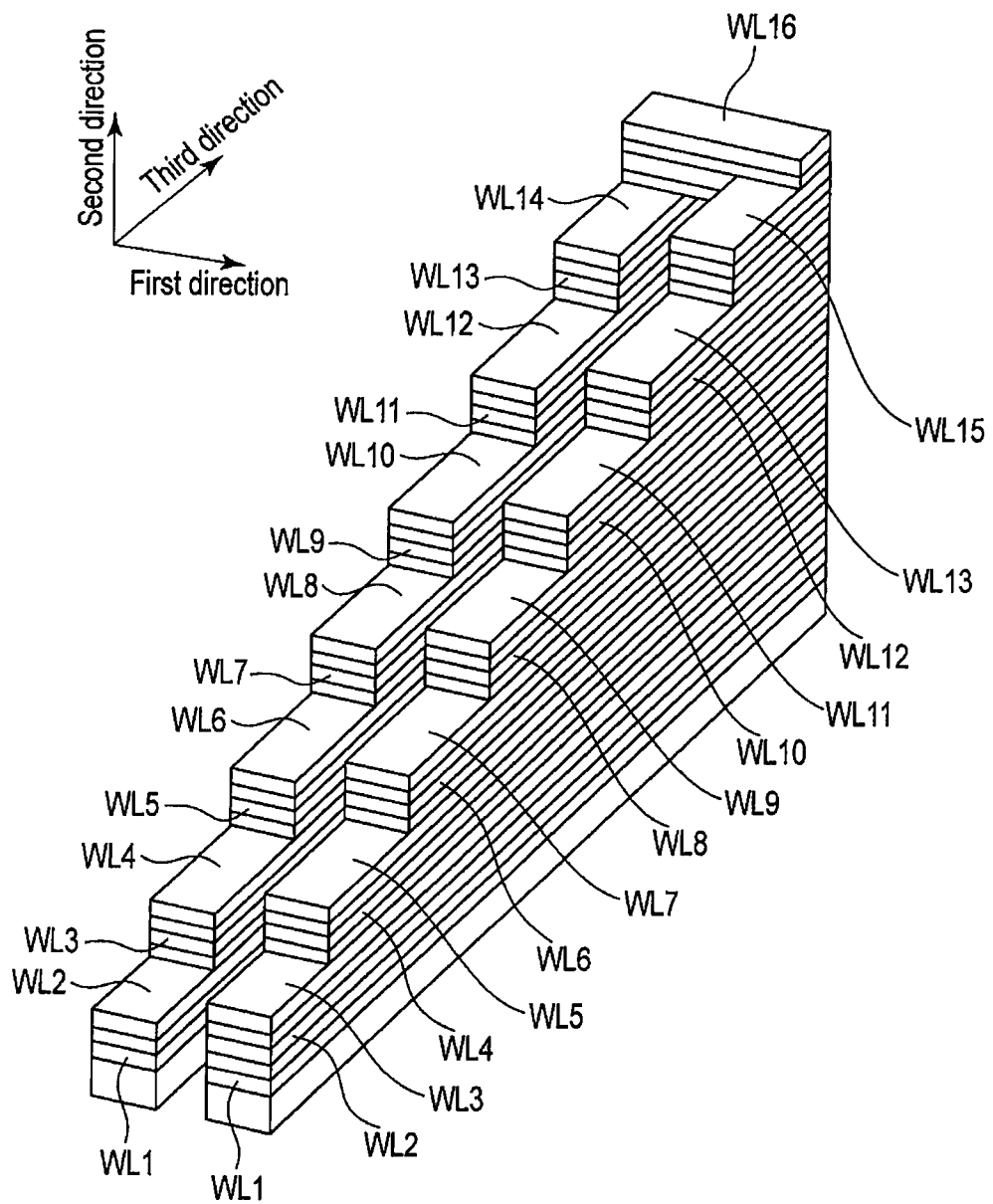
FIGS. 7 and 8 are schematic diagrams of a word line step portion according to the first embodiment.
Figure 8:
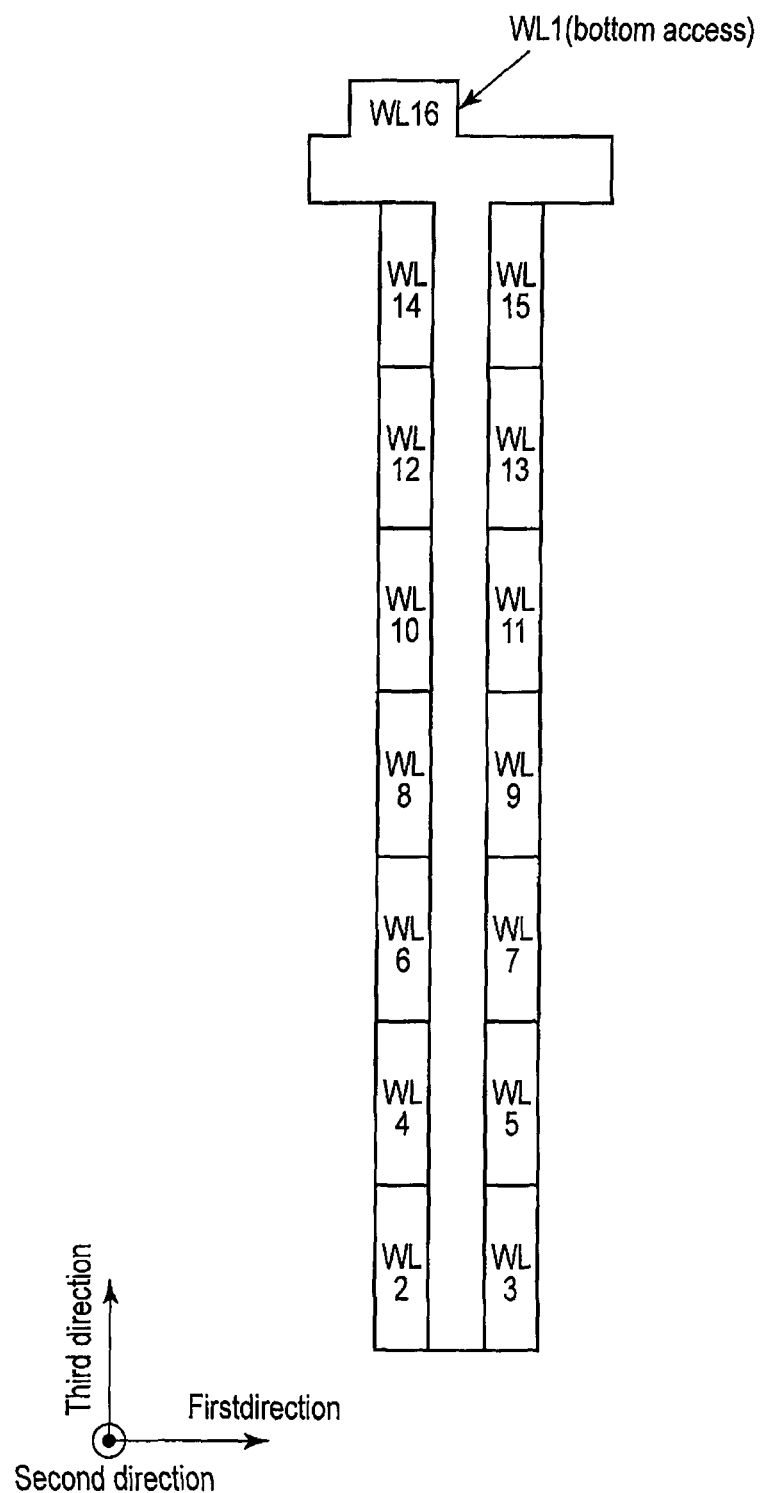

FIG. 7 and FIG. 8 are a perspective view and a plan view of the word line group WLcomb of 16 layers in a region connected to the contact plugs 14 and 15, respectively.

As shown, the word line group WLcomb has stair-like shapes provided in two rows, and in the upper surfaces of the respective stairs, the word lines WL2 to WL15 are exposed. In the following description, this stair-like region is referred to as the word line step portion sometimes. Each of steps of the stair corresponds to two stacked word lines. Therefore, as shown in FIG. 8, in the word line step portion of one row, the odd-numbered stacked word lines WL3, WL5, WL7, WL9, WL11, WL13 and WL15 are exposed. In the word line step portion of the other row, the even-numbered stacked word lines WL2, WL4, WL6, WL8, WL10, WL12 and WL14 are exposed. Moreover, in a region which connects the word line step portions in two rows, the word line WL16 of the uppermost layer is exposed. It is to be noted that the word line WL1 of the lowermost layer is connected to the metal interconnect layer 10 via a not-shown contact plug provided in a bottom portion thereof.

On the side surfaces of the word lines WL1 to WL16, an insulating film 16 is formed. Via the insulating films 16, the side surfaces of the word lines WL1 to WL16 are isolated from the contact plugs 14 and 15. Moreover, on the word line group WLcomb, there is formed an insulating film 17 functioning as a mask material when the word line group WLcomb is patterned.

2. Re: The Overall Structure of Semiconductor Memory Device

Figure 9:
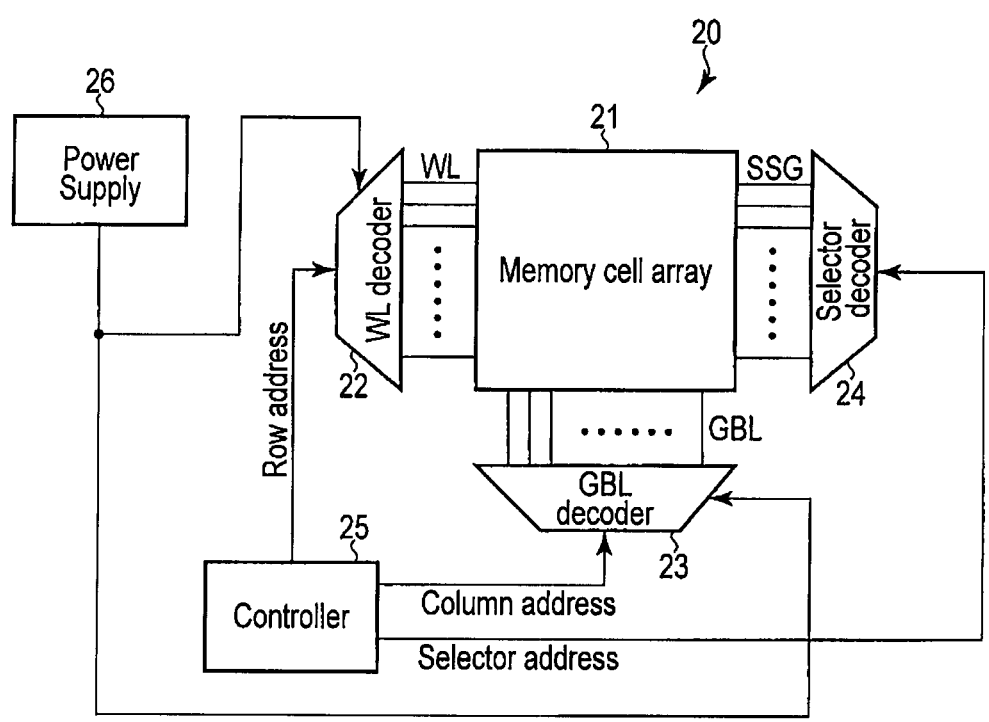
FIG. 9 is a block diagram of a memory device according to the first embodiment.

Next, the overall structure of a semiconductor memory device according to the present embodiment will be described with reference to FIG. 9. FIG. 9 is a block diagram of the semiconductor memory device according to the present embodiment.

As shown, a semiconductor memory device 20 includes a memory cell array 21, a WL decoder 22, a GBL decoder 23, a selector decoder 24, a controller 25, and a power supply 26.

Figure 10:
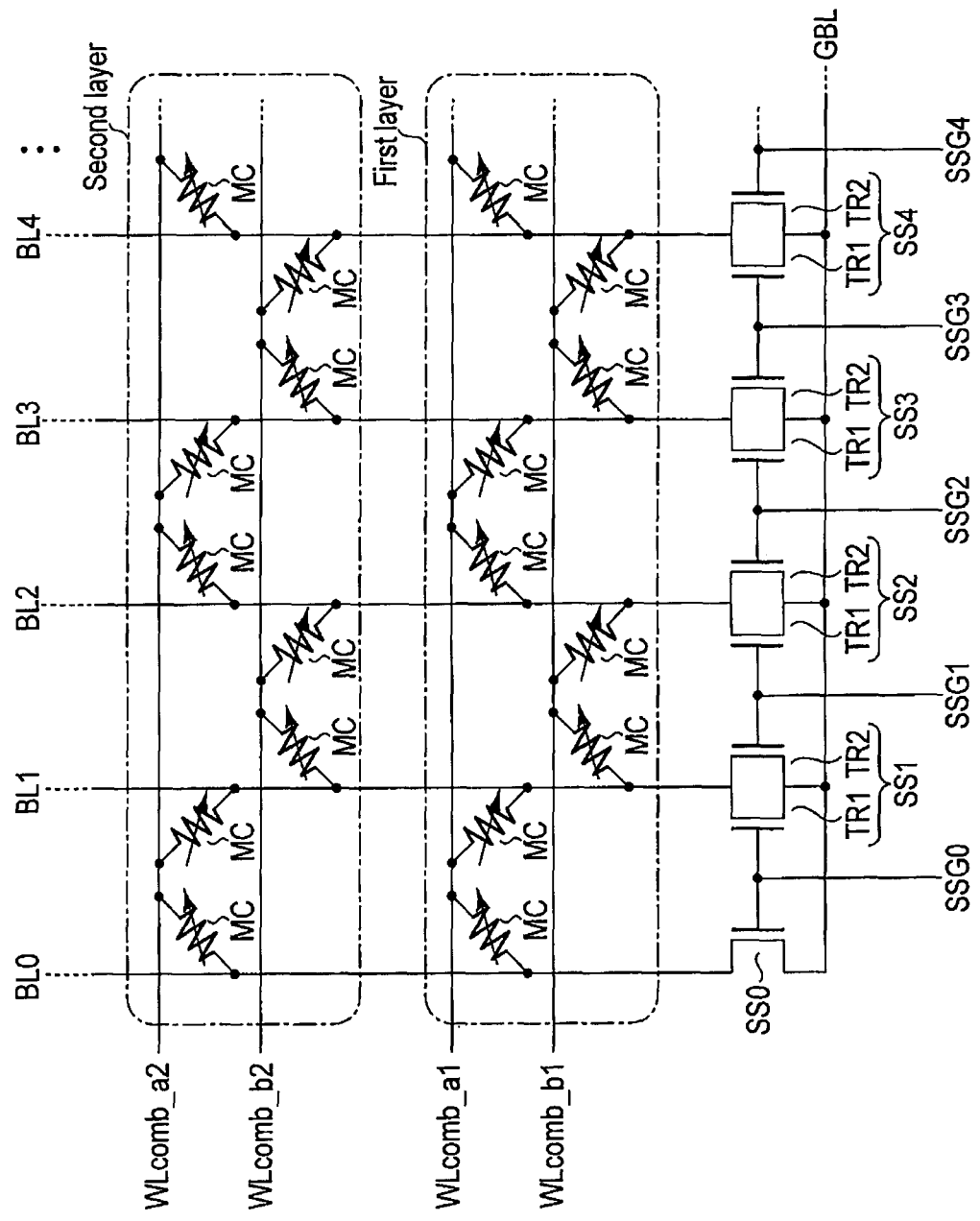
FIG. 10 is a circuit diagram of the memory cell array according to the first embodiment.

The memory cell array 21 has the structure described with reference to FIG. 1 to FIG. 8. FIG. 10 is an equivalent circuit diagram of the memory cell array 21. As shown, the memory cells MC including variable resistance elements (the variable resistance material 4 of FIGS. 1 and 2) are arranged in a matrix in the memory cell array 21. In the memory cell MC, an end of the variable resistance element is connected to one of the bit lines BL (BL0, BL1, . . . ), and the other end thereof is connected to one of the word line groups WLcomb (WLcomb_a, WLcomb_b). It is to be noted that in FIG. 5, the word line groups WLcomb_a and WLcomb_b are denoted with WLcomb_ai and WLcomb_bi, respectively, but this i indicates a number of a layer where the word line group is formed (indicates the ordinal number of the layer, indicates the first layer by i=1, and indicates the second layer by i=2, and the same applies to the subsequent layers). Moreover, each of the bit lines BL is connected to the corresponding global bit line GBL via the corresponding selection element SS (SS0, SS1, SS2, . . . ). Furthermore, the gates of the adjacent selection elements SS are connected to a common selection gate line SSGj (j is a positive integer, j=0, 1, 2, . . . ). The selection element SS can be regarded as a set of two MOS transistors TR1 and TR2 sharing a source and a drain and connected in parallel. Moreover, the transistor TR1 of the certain selection element SS shares the gate with the transistor TR2 of the adjacent selection element SS, and the transistor TR2 shares the gate with the transistor TR1 of the other adjacent selection element SS. However, the selection element SS positioned at an endmost portion is constituted only of the transistor TR1 or TR2.

The three-dimensional stacked type memory cell array of FIG. 1 has a structure of FIG. 10. That is, FIG. 10 corresponds to FIG. 1 showing a memory cell array included in the two-dimensional plane formed in the second direction and the third direction. These memory cell arrays are arranged along the first direction. At this time, the word lines WLcomb_ai, the word lines WLcomb_bi and the selection gate lines SSGj are connected in common among the memory cell arrays shown in FIG. 10. Conversely, the bit lines BL and the global bit lines GBL are separated among the memory cell arrays.

Returning to FIG. 9, the description will be continued. The WL decoder 22 includes a word line selection unit and a word line driver. Moreover, the word line selection unit selects the word line WL on the basis of a WL address received from the controller 25. Moreover, the word line driver applies, to the selected word line and unselected word line, a voltage required to read, write and erase data.

The GBL decoder 23 includes a global bit line selection unit and a global bit line driver. Moreover, the global bit line selection unit selects the global bit line GBL on the basis of a column address received from the controller 25. Moreover, the global bit line driver applies, to the selected global bit line and unselected global bit line, the voltage required to read, write and erase the data.

The selector decoder 24 includes a selector selection unit and a selection gate line driver. Moreover, the selector selection unit selects the selection gate line SSG on the basis of a sheet address received from the controller 25. Furthermore, the selection gate line driver applies, to the selected selection gate line and unselected selection gate line, the voltage required to read, write and erase the data.

It is to be noted that "the sheet" indicates a set of the memory cells selected by one of the selection gate lines. That is, the set of the memory cells which are present in the plane formed in the first direction and the second direction in FIG. 1 is the sheet.

The controller 25 controls the operation of the whole semiconductor memory device 20. Moreover, the controller transmits the above-mentioned required address to the WL decoder 22, the GBL decoder 23 and the selector decoder 24. Furthermore, when the data is written, the controller 25 instructs the WL decoder 22, the GBL decoder 23 and the selector decoder 24 to apply the required voltage in order to change the resistance state of the variable resistance element of the selected memory cell MC. Moreover, when the data is read, the controller instructs the WL decoder 22, the GBL decoder 23, and the selector decoder 24 to apply the required voltage in order to detect the resistance value of the variable resistance element of the selected memory cell MC as a memory state of the memory cell MC. Furthermore, the controller 25 includes a not-shown sense amplifier, and senses and amplifies the data read through the global bit line GBL by a sense amplifier.

The power supply 26 generates a predetermined voltage set required to read, write and erase the data. The voltage generated by the power supply 26 is given to the word line WL and the bit line BL. For example, when the data is written, a large potential difference is applied between the selected word line and the selected bit line, so that the resistance state of the variable resistance element transits. Moreover, when the data is read, a potential difference is applied between the selected word line and the selected bit line in such a range that any transition of the resistance state does not occur, so that a current flowing through the bit lines or the word lines is detected.

Figures 11, 12:
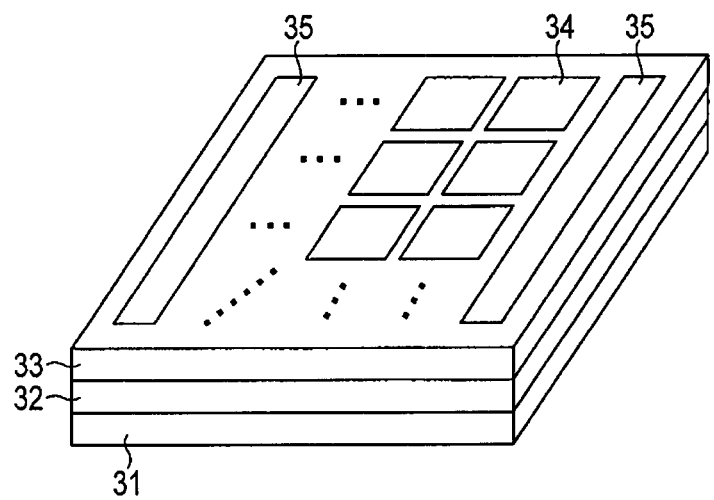
FIG. 11 is an appearance view of the memory device according to the first embodiment.
FIG. 12 is a diagram showing biases during an operation of the memory device according to the first embodiment.

FIG. 11 is an appearance view of the semiconductor memory device according to the present embodiment. As shown, a CMOS circuit 32 including an interconnect layer by a usually used process is formed on a silicon substrate 31. Further on the CMOS circuit 32, a layer 33 including memory cell portions 34 is formed. Each of the memory cell portions 34 of FIG. 11 corresponds to the memory cell region R1 of FIG. 4, and interconnects are formed by, for example, a 24 nm design rule. Moreover, a portion called the peripheral circuit in a usual memory and including the decoders 22 to 24 and the controller 25 of FIG. 4 is included in the CMOS circuit 32 of FIG. 9.

It is to be noted that the CMOS circuit 32, excluding connecting portions to the memory cell portions 34, can be designed and prepared by, for example, a 90 nm design rule which is looser than the memory cell portions 34. Moreover, the layer 33 includes portions (e.g., the hook-up-region R2) for electrically connecting to the CMOS circuit 32 around each of the memory cell portions 34, and unit blocks each including the memory cell portion 34 and the peripheral connecting portion are arranged in the form of the matrix. Furthermore, in the layer 33, through holes are formed, and in ends of the layer 33, there are formed input/output portions 35 of the present device including terminals electrically coupled with input/output portions of the CMOS circuit 32 via these through holes.

According to such a structure, a function corresponding to a protection film of the CMOS circuit 32 can be performed by insulators formed in the memory cell portions 34. On the other hand, the memory cell portions 34 and the CMOS circuit 32 are coupled each other in a vertical direction to a substrate surface, which enables the shortening of an operation time or the noticeable increase of the number of simultaneously readable/writable cells without involving the increase of chip areas. It is to be noted that the input/output portions 35 of the device are bonded to a lead frame in a packaging step in the same manner as in a usual semiconductor device.

3. Re: Operation

Figure 13:
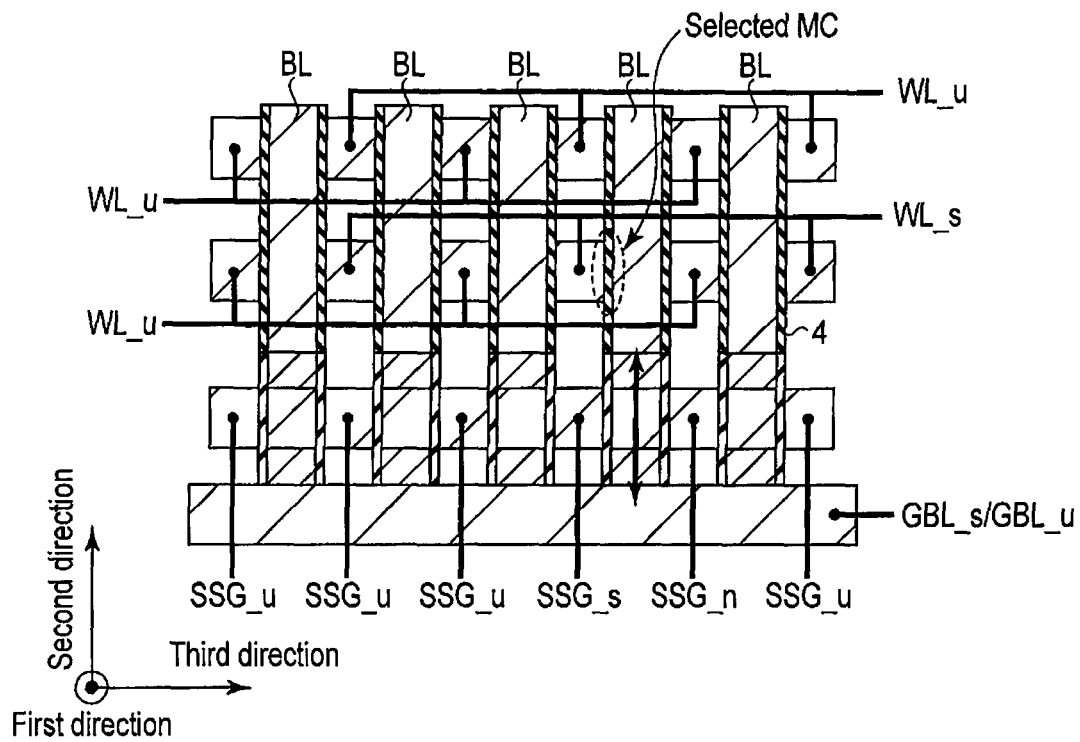
FIG. 13 is a sectional view of the memory cell array according to the first embodiment.

Next, an operation of the semiconductor memory device according to the present embodiment will be described. FIG. 12 shows a bias state of each signal line during the operation of the semiconductor memory device according to the present embodiment. Moreover, FIG. 13 is a sectional view of the memory cell array, and shows the plane formed in the second direction and the third direction of FIG. 1.

In the following description, the selected global bit lines GBL is labeled as GBL_s, and the unselected global line is labeled as GBL_u. Moreover, the selected word lines WL is labeled as WL_s, and the unselected word line is labeled as WL_u. Further among the selection gate lines SSG, two selection elements SS corresponding to the bit line BL connected to the selected memory cell MC are selected, and labeled as SSG_s and SSG_n. The other selection gate lines SSG are unselected, and labeled as SSG_u.

3.1 Writing Operation

First, a writing operation of storing information in the memory cells will be described.

During the writing operation, the GBL decoder 23 applies a writing voltage Vw (>0 V) to the selected global bit line GBL_s, and applies a half (Vw/2) of the writing voltage to the unselected global bit line GBL_u.

Moreover, the WL decoder 22 applies 0 V to the selected word line WL_s, and applies (Vw/2) to the unselected word line WL_u.

Furthermore, the selector decoder 24 applies a writing gate voltage Vg_w (>0 V) to both of two selection gate lines SSG_s and SSG_n, and applies 0 V to the other selection gate lines SSG_u.

Consequently, in the selection element SS connected to the selected bit line BL, a channel is formed by the two selection gate lines SSG_s and SSG_n, and the line GBL_s transfers a writing voltage Vw to the selected memory cell MC. On the other hand, 0 V is transferred from WL_s to the selected memory cell MC. In consequence, when a potential difference Vw is applied across the variable resistance element of the memory cell MC, the data is written in the memory cell MC.

3.2 Erasing Operation

Next, an erasing operation of information held in the memory cells will continuously be described with reference to FIG. 12 and FIG. 13.

During the erasing operation, considering that the element performs a bipolar operation, the WL decoder 22 applies a voltage (Ve+1), obtained by adding an offset voltage of 1 V to an erasing voltage Ve, to the selected word line WL_s, and applies ((Ve/2)+1) to the unselected word line WL_u.

Moreover, the GBL decoder 23 applies the offset voltage of 1 V to the selected global bit line GBL_s, and applies ((Ve/2)+1) to the unselected global bit line GBL_u.

Furthermore, the selector decoder 24 applies an erasing gate voltage Vg_e to both of the selection gate lines SSG_s and SSG_n, and applies 0 V to the other selection gate lines SSG_u.

In consequence, the voltage Ve is transferred to the selected memory cell MC in the same manner as in the writing. Moreover, when a potential difference Ve is applied across the variable resistance element, the data is erased.

3.3 Reading Operation

Next, an operation of reading the information from the memory cells will continuously be described with reference to FIG. 12 and FIG. 13.

During the reading operation, the GBL decoder 23 applies a voltage (Vr+Vo), obtained by adding an offset voltage Vo to a reading voltage Vr, to the selected global bit line GBL_s and the unselected global bit GBL_u.

Moreover, the WL decoder 22 applies the offset voltage Vo to the selected word line WL_s, and applies (Vr+Vo) to the unselected word line WL_u.

Furthermore, the selector decoder 24 applies a reading gate voltage Vg_r to both of the selection gate lines SSG_s and SSG_n, and applies 0 V to the other selection gate lines SSG_u.

In consequence, the voltage Vr is transferred to the selected memory cell MC in the same manner as in the writing. Moreover, the data read from the selected memory cell MC is transferred to GBL_s via the selection element SS.

4. Effect of the Present Embodiment

According to the structure of the present embodiment, an integration degree of the memory cell array can be enhanced. Hereinafter, the present effect will be described in detail.

In recent years, with the high integration of a semiconductor device, a circuit pattern of an LSI element has increasingly been miniaturized. This miniaturization of the pattern requires not only the reduction of a line width but also the enhancement of a dimensional or positional accuracy of the pattern. This also applies to the memory device. As to the memory device, it has continuously been requested that in memory cells formed by making full use of an accurate processing technology, a predetermined amount of a charge required for storage is held in a smaller region.

Heretofore, various types of memories such as a DRAM, SRAM and a flash memory have been fabricated. All these memories hold the predetermined amount of the charge to store data. Therefore, with the miniaturization of the pattern, there are severe restrictions on fluctuations of the memory cells, and the like. In consequence, a large burden is also imposed on a lithography technology which forms these patterns, which becomes a factor to raise a lithography step cost. Moreover, the lithography step cost occupies a large part of the present mass production cost. Therefore, the burden on the above lithography step becomes the factor for raising a product cost as it is.

On the other hand, in recent years, there has been suggested a memory called an ReRAM in which each memory cell is formed by a non-ohmic element typified by a diode and a variable resistance material, as a technology which conquers such a problem. In this ReRAM, it is not necessary to use an MOSFET in the memory cell, and hence it has been expected that higher integration in excess of a conventional trend can be achieved. Furthermore, the ReRAM has a structure which facilitates three-dimensional stacking. Therefore, it is expected that the integration degree can noticeably be enhanced as compared with a conventional memory in which an only two-dimensional plane is utilized.

Figures 14, 15:
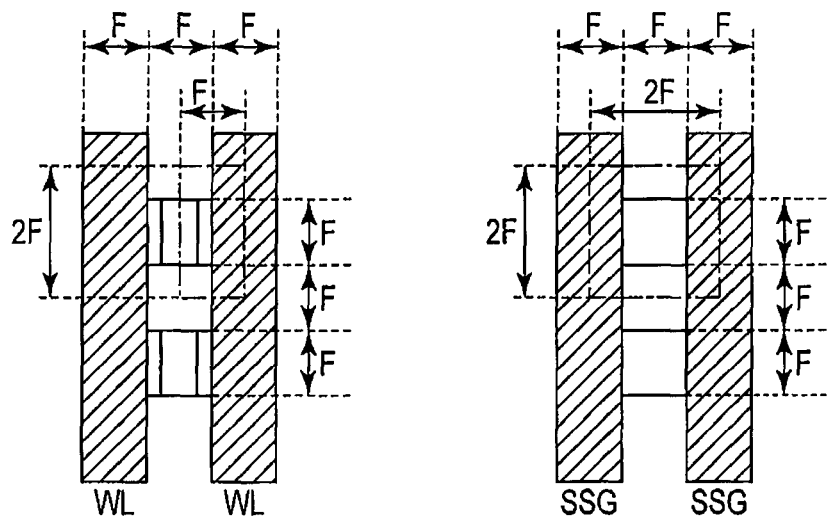
FIGS. 14 and 15 are plan views of the memory cell array according to the first embodiment.

FIG. 14 is a plan view of the memory cell MC according to the present embodiment, and corresponds to a plane formed in the first direction and the third direction of FIG. 1. As shown, when a line width and a space of the word lines and a width of each bit line BL along the second direction are formed with a minimum processing dimension F of a photolithography technology, a size of one memory cell MC is $2F^2$ with a vertical size of 2F and a horizontal size of F.

However, when a hierarchical bit line structure where bit lines are connected to a global bit line is used, it is actually difficult to form the memory cell with a size of $2F^2$. This is caused by the selection element SS. The selection element SS switches the connection between the bit line BL and the global bit line GBL, and is usually realized by an MOS transistor.

The selection element SS is positioned immediately under the memory cell MC. Therefore, if the memory cell MC is formed with the size of $2F^2$, the size of the selection element SS, accordingly, has to be reduced. However, when a usual planar type MOS transistor realizes the selection element SS, it has been difficult to satisfy this requirement.

In the present embodiment, however, the source region 5, the channel region 6 and the drain region 7 are stacked with the same width as that of the bit line BL, and the gates SSG are provided on side surfaces, to realize the selection element SS. In consequence, a size of the selection element SS per bit line BL becomes $4F^2$. This behavior is shown in FIG. 15. FIG. 15 is a plan view of the selection element SS according to the present embodiment, and corresponds to the plane formed in the first direction and the third direction of FIG. 1. As shown, the size of the selection element SS becomes $4F^2$. Moreover, a region occupied by this element corresponds to a region where two memory cells MC are arranged.

Consequently, the size of the selection element SS is reduced, therefore the size of the memory cell MC can be decreased, so that the integration degree of the memory cell array can be enhanced.

However, it is considered that with the three-dimensional stacking of the memory cells, many technical problems occur. As described above, the memory cell region R1 is securely a super-highly integrated structure where information of a bit number corresponding to the number of the word line layers can be stored in the region of $2F^2$. However, the hook-up-region R2 is required to connect the memory cells to the peripheral circuit, and this hook-up-region R2 is preferably simultaneously highly integrated. If the hook-up-region R2 is formed by a conventional technique, the hook-up-region R2 might occupy the same degree of area as an area of the memory cell region R1. In consequence, advantages of the super-high integration of the memory cell regions R1 are impaired.

In this respect, with the structure of the present embodiment, two rows of word line stacking structures (WL1 to WL16) are provided in the hook-up-region R2, and these structures have the stair-like shape. Moreover, this stair shape has two layers of the word lines in one step, and there is a difference of one layer between the word lines exposed in the respective steps. More specifically, in one row, the word lines WL3, WL5, WL7, . . . WL15 are exposed, and in the other row, the word lines WL2, WL4, WL8, . . . WL14 are exposed (see FIGS. 7 and 8). Furthermore, each step of the stair shape is provided with the contact plug 14 to be connected to the peripheral circuit.

In consequence, it is possible to connect the respective word lines to the peripheral circuit in a compacter region. For example, a width of the hook-up-region is about 6 μm or larger in the conventional technique, while the width is 0.3 μm or smaller in the present embodiment. The size can noticeably be reduced. Consequently, it is possible to realize a super-highly integrated memory in which the super-high integration of the memory cell regions R1 is effectively utilized.

Moreover, according to the present embodiment, any negative voltage is not used, but operation reliability can be enhanced. This is because the offset voltage is used during the erasing operation as described in the above section 3.2. That is, when the potential of GBL_s is set to a value which is about 1 V higher than SSG_u, it is possible to noticeably save a leak current to the unselected cell, because of characteristics of the selection element SS. In this case, when a reference of a bias is set to a positive voltage of 0 V to 1 V, the use of the negative voltage can be avoided.

When the negative voltage is used, a circuit for generating the negative voltage is required, and an area of the circuit is comparatively large. In the present embodiment, however, this negative voltage generation circuit is not used, but the leak current is lowered, so that the operation reliability of the semiconductor memory device can be enhanced. It is to be noted that the offset voltage during the erasing is not limited to 1 V, and can appropriately be selected in accordance with a requested performance or the like.

Furthermore, according to the present embodiment, it is possible to realize the lowering of power consumption and/or the raising of an operation speed. This is because the offset voltage is used during the reading operation as described above in section 3.3. Usually, the data is read from the memory cell immediately after performing the writing or the erasing, and it is confirmed whether or not the memory cell obtains a desired resistance value. In consequence, when the resistance value is different from the desired range, the writing or the erasing is additionally performed. Moreover, the voltage required for the writing or the erasing is larger than the voltage required for the reading.

Thus, according to the present embodiment, the reference of the bias during the reading is set at a positive voltage Vo in place of 0 V. That is, a value of the voltage for use in the reading is brought close to that of the voltage for use in the writing and erasing. Therefore, when the device transitions from the writing and erasing operation to the reading operation, or in the opposite case, a large voltage difference is prevented from being made between bias conditions of both the operations. Moreover, a voltage change of a node with a large parasitic capacity can be lowered. Therefore, the increase of an unnecessary power consumption and the delay of an operation time can be suppressed.

It is to be noted that the parasitic capacitance of the global bit line GBL is largest in the present embodiment. Therefore, the voltage to be applied to the global bit line GBL is preferably set so that the values thereof become as equal as possible during the writing or erasing and during the reading.

The number of the unselected global bit lines is larger than that of the selected global bit lines. Therefore, the offset voltage Vo may be preferably set so that (Vw/2) becomes substantially equal to (Vr+Vo) during the writing and ((Ve/2)+1) becomes substantially equal to (Vr+Vo) during the erasing, whereby the potential of the unselected global bit line does not noticeably change.

It is to be noted that only one word line WL is usually selected from the memory cell array, but the global bit lines GBL may simultaneously be selected. In consequence, the number of simultaneously writable/erasable/readable bits increases, and a band width can be increased.

[Second Embodiment]

Next, a memory device according to a second embodiment will be described. The present embodiment relates to a fabricating method of an ReRAM described in the above first embodiment.

1. Re: Fabricating Method of Memory Cell Region R1

First, a fabricating method of the memory cell region R1 of the memory cell array of the ReRAM described in the first embodiment will be described with reference to FIG. 16 to FIG. 27. FIG. 16 to FIG. 27 are perspective views successively showing fabricating steps of the memory cell region R1.

First, a usual CMOS circuit 32 which controls an operation of the ReRAM is formed on, for example, a silicon substrate 31. Next, an interlayer insulating film is formed on the silicon substrate 31 to cover the CMOS circuit 32. FIG. 16 to FIG. 27 show a structure positioned in upper layers above this interlayer insulating film.

Figure 16:
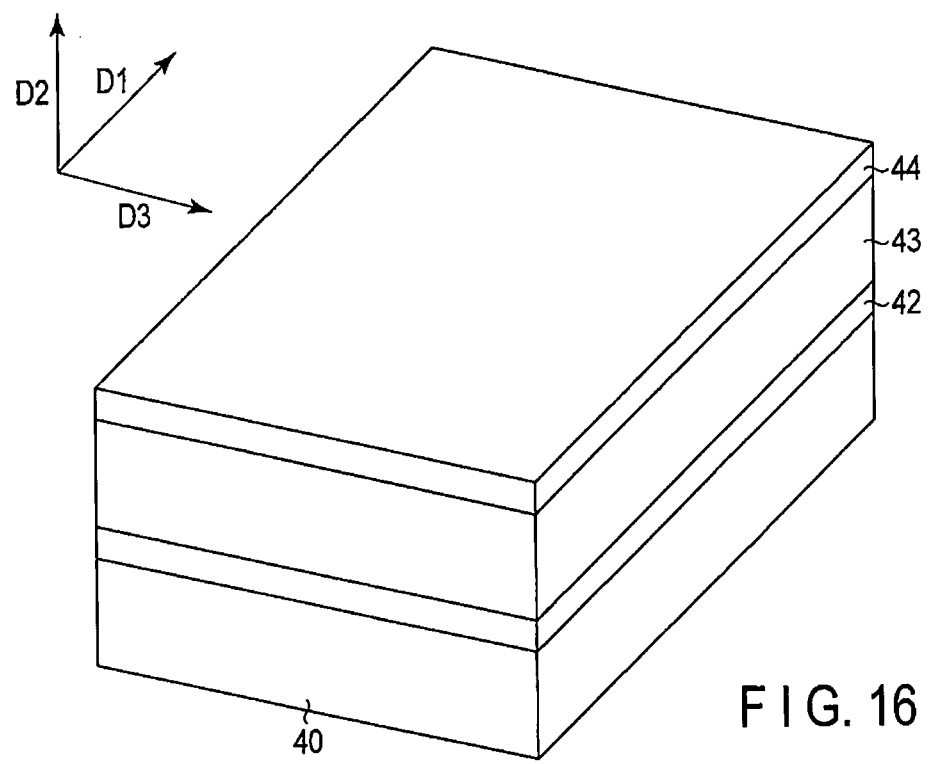

Next, as shown in FIG. 16, a global bit line film 40 is formed on the interlayer insulating film. The global bit line film corresponds to the global bit lines GBL described with reference to FIG. 1. As an example, the global bit line film 40 is formed by using tungsten (W) and a TiN film as a barrier metal in a material. Continuously, an $n^+$-type silicon layer 42, a $p^-$-type silicon layer 43 and an $n^+$-type silicon layer 44 are successively formed on the global bit line film 40. The silicon layers 42 to 44 correspond to the source region 5, the channel region 6, and the drain region 7 described with reference to FIG. 1, respectively. The silicon layers 42 and 44 have an impurity concentration of, for example, about $1\times10^{20}$ $cm^{-3}$, and a film thickness of, for example, about 40 nm. The silicon layer 43 has an impurity concentration of, for example, about $1\times10^{18}$ $cm^{-3}$, and a film thickness of, for example, about 120 nm. Afterward, annealing is performed on conditions of about 750° C. and 60 seconds, to crystallize the silicon layers 42 to 44.

Figure 17:
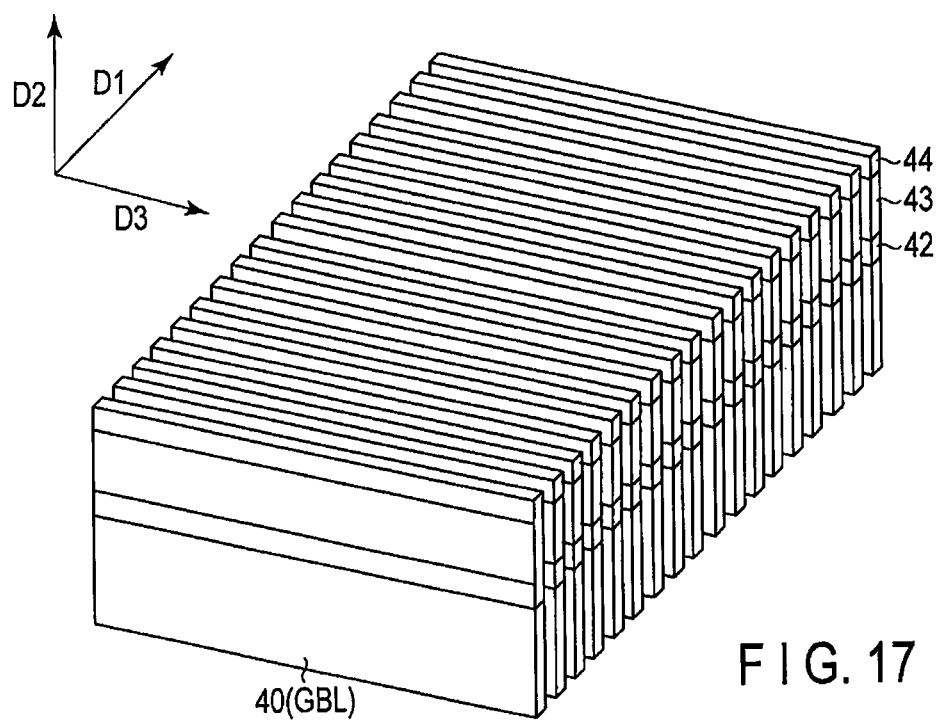

Next, as shown in FIG. 17, the silicon layers 42 to 44 and the global bit line film 40 are patterned by a photolithography technology and an RIE technology. In consequence, the global bit lines 40 (GBL) having a stripe shape along a third direction (D3) are formed. It is to be noted that a line width and adjacent space of the global bit lines GBL are, for example, about 24 nm, a film thickness thereof is, for example, about 150 nm, and a sheet resistance is, for example, about 1.5 ohms.

Figure 18:
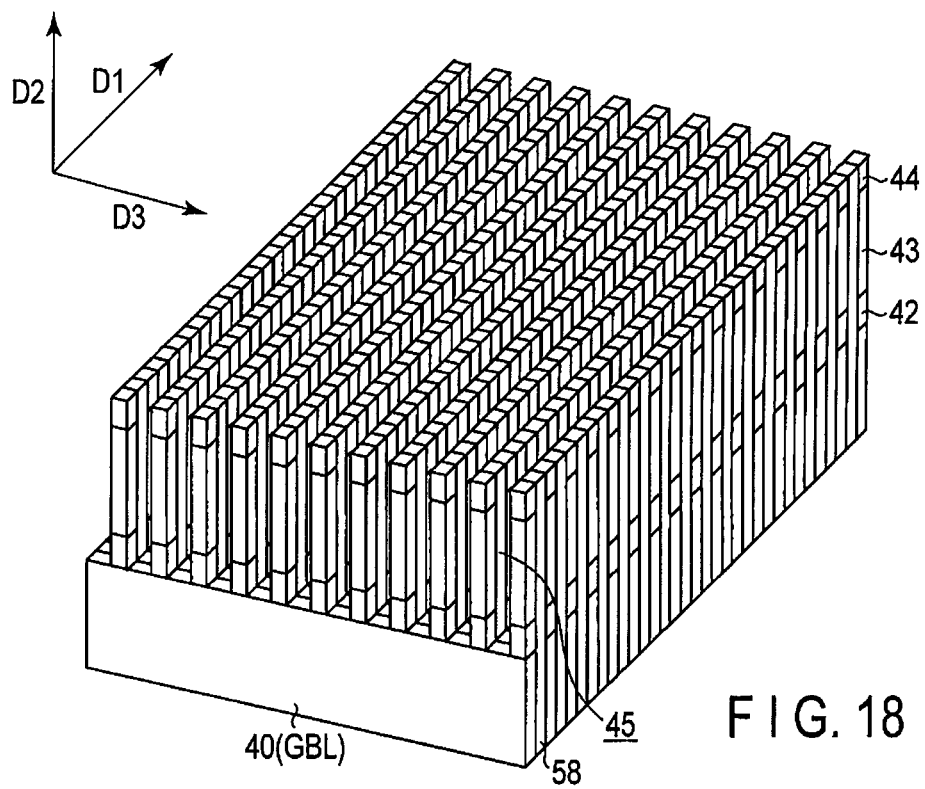

Next, as shown in FIG. 18, an interlayer insulating film 58 is formed on the whole surface. Continuously, the interlayer insulating film 58 is polished by a CMP process or the like, to expose the upper surface of the silicon layer 44. Through the present step, the interlayer insulating film 58 fills in groove portions generated in the step of FIG. 17. Then, the silicon layers 42 to 43 and the interlayer insulating film 58 are patterned into a stripe shape along a first direction (D1) by use of the photolithography technology and the RIE technology. As a consequence of the present step, the silicon layers 42 and 43 are separated for each selection element SS. It is to be noted that this patterning step is performed, for example, on conditions that a line width is about 19 nm and an adjacent space is about 29 nm (a half pitch is 24 nm). In bottom portions of grooves 45 formed by the present step, the global bit lines 40 and the interlayer insulating film 58 are exposed.

Figure 19:
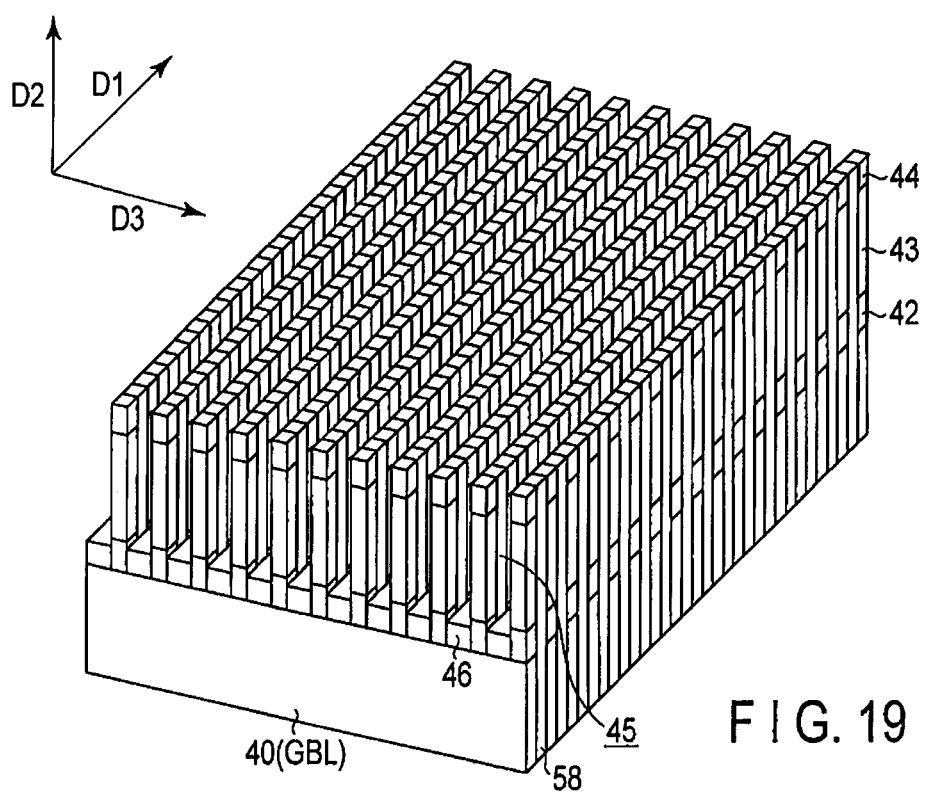

Next, as shown in FIG. 19, an insulating film 46 (e.g., a silicon oxide film) is formed on the whole surface. Continuously, the insulating film 46 is etched back, whereby the insulating film 46 remains only in the bottom portions of the grooves 45. The remaining insulating film 46 has a film thickness of, for example, about 30 nm. Therefore, part of the silicon layer 42 and the side surfaces of the silicon layers 43 and 44 are exposed in the grooves 45.

Figure 20:
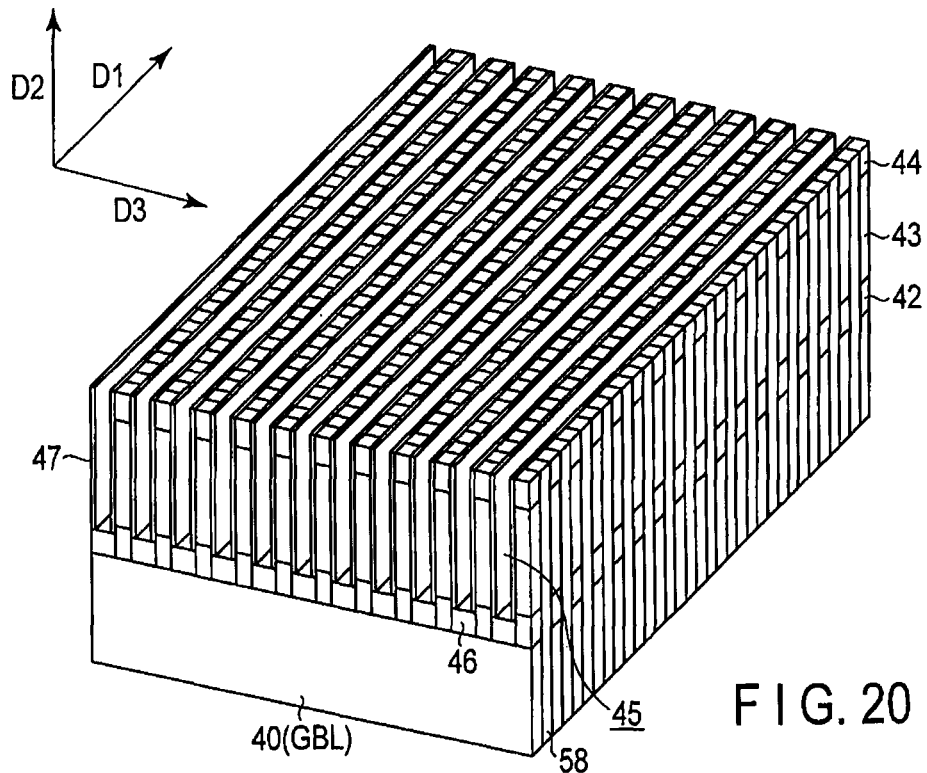

Next, as shown in FIG. 20, an insulating film 47 is formed on the whole surface. The insulating film 47 corresponds to the gate insulating film 9 described with reference to FIG. 1. Continuously, the upper surface of the silicon layer 44 and the insulating film 47 on the insulating film 46 are removed, whereby the insulating film 47 remains only on the side surfaces of the grooves 45.

Figure 21:
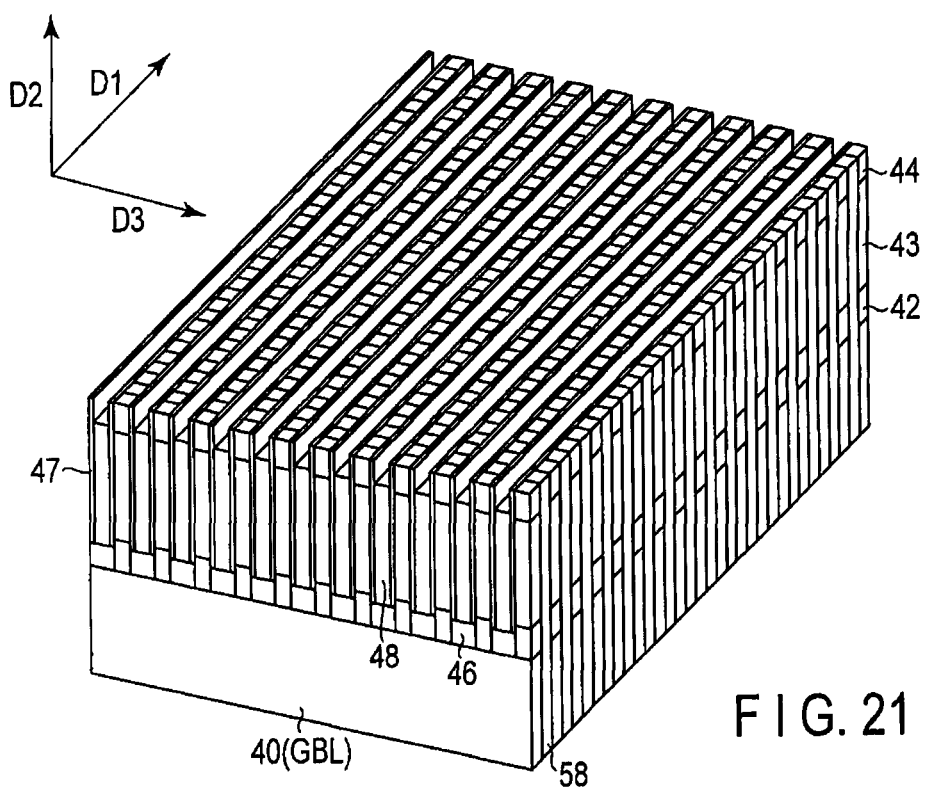

Next, as shown in FIG. 21, a conductive film 48 fills in the grooves 45. The conductive film 48 is, for example, an n⁺-type polycrystalline silicon layer, and corresponds to the selection gate line SSG described with reference to FIG. 1. Afterward, the upper surface of the conductive film 48 is etched back, whereby a film thickness of the conductive film 48 becomes, for example, about 140 nm. Through the present step, the bottom surface of the conductive film 48 becomes lower than the interface between the silicon layers 42 and 43, and the upper surface of the conductive film 48 becomes higher than the interface between the silicon layers 43 and 44.

Figure 22:
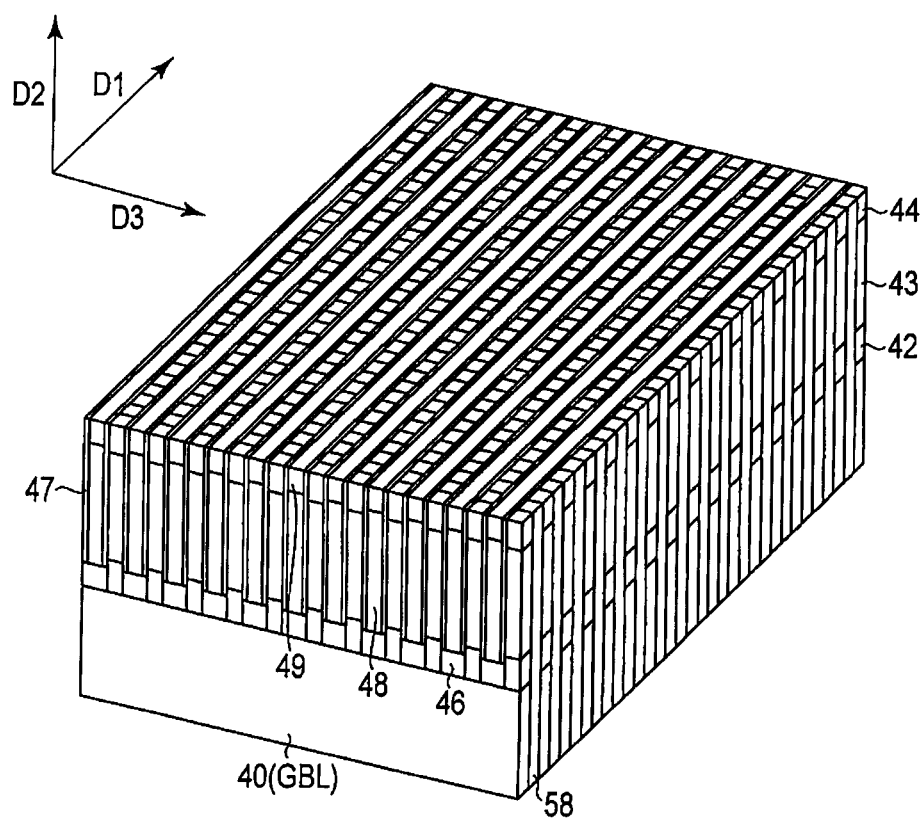

Next, as shown in FIG. 22, an insulating film 49 (e.g., a silicon oxide film) is formed on the whole surface. Afterward, the insulating film 49 is polished by, for example, the CMP process, and left only in the grooves 45. In consequence, the upper surface of the silicon layer 44 is exposed.

Figure 23:
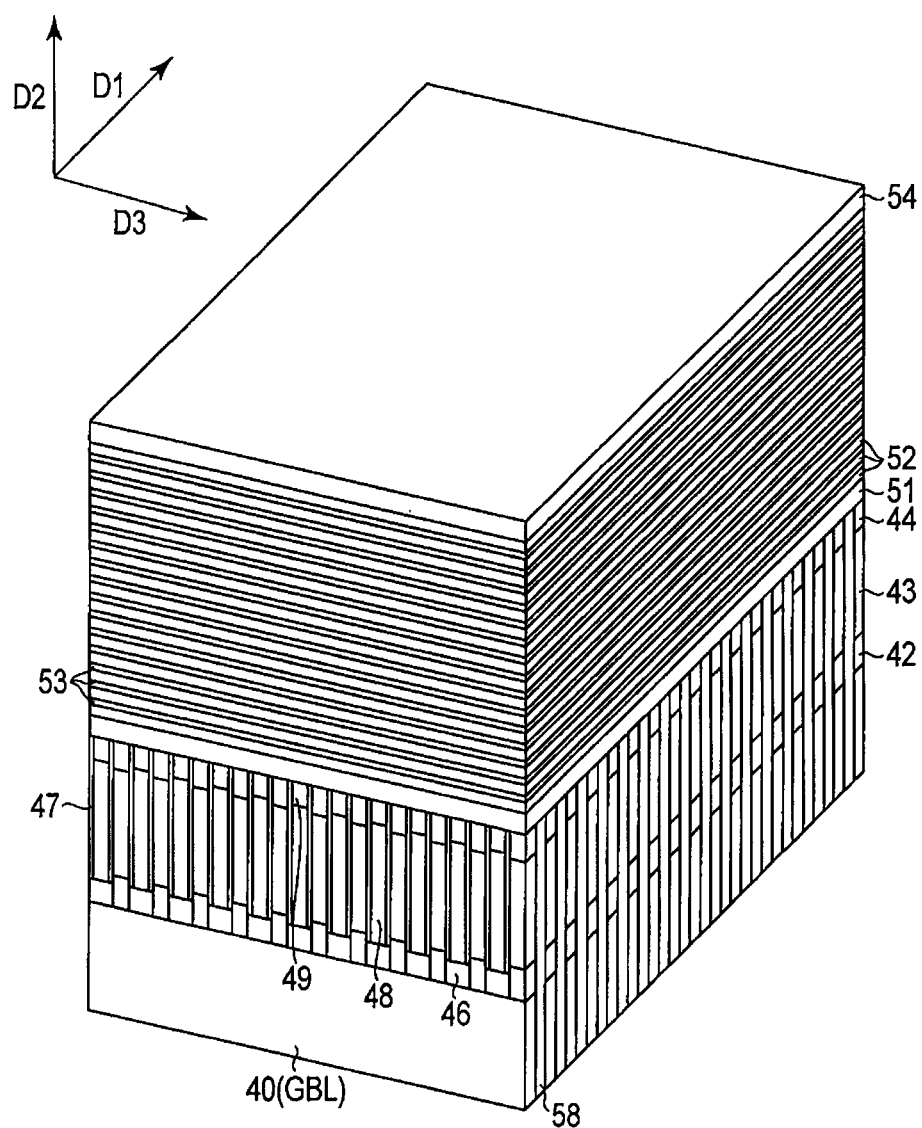

Next, as shown in FIG. 23, an insulating film 51 (e.g., a silicon oxide film) having a film thickness of, for example, 20 nm is formed on the silicon layer 43 and the insulating films 49 and 58. Afterward, 16 layers of word line films 52 are formed on the insulating film 51. The word line films 52 correspond to the word lines WL described with reference to FIG. 1. Moreover, the word line films 52 are formed by using, for example, TiN in a material, and a film thickness thereof is, for example, about 10 nm. Furthermore, an insulating film 53 (e.g., a silicon oxide film) having a film thickness of, for example, 7 nm is formed between the stacked word line films 52. Continuously, an insulating film 54 (e.g., a silicon oxide film) having a film thickness of, for example, 13 nm is formed on the word line film 52 of the uppermost layer (the sixteenth layer in the present example).

Next, as shown in FIG. 24, the insulating films 54, 53 and 51 and the word line film 52 are patterned into a stripe shape along the first direction by the photolithography technology and the RIE technology.

The present patterning step is performed, for example, on conditions that a line width is about 20 nm and an adjacent space is about 28 nm (a half pitch is 24 nm). Moreover, the present step is performed so that the insulating films 54, 53 and 51 and the word line film 52 remain on the insulating film 49 in the lower layer. As a consequence of the present step, the word lines WL are formed, and the upper surfaces of the silicon layer 44 and the insulating films 58 and 47 are exposed in bottom portions of grooves 55 generated by the patterning.

Next, as shown in FIG. 25, a variable resistance material 56 is disposed on the bottom surfaces and side surfaces of the grooves 55 and the upper surface of the insulating film 54. The variable resistance material 56 corresponds to the variable resistance material 4 described with reference to FIG. 1. The variable resistance material is disposed with a film thickness of, for example, about 4 nm so that the material does not fill in the grooves 55. Afterward, the material is etched back to remove the variable resistance material 56 from the bottom portions of the grooves 55 and the upper surface of the insulating film 54. In consequence, the upper surfaces of the silicon layer 44 and the insulating films 58 and 47 are again exposed in the bottom portions of the grooves 55.

Next, as shown in FIG. 26, a bit line film 57 is formed on the whole surface, and polished by the CMP process, whereby the bit line film 57 is left only in the grooves 55. The bit line film 57 corresponds to the bit lines BL described with reference to FIG. 1, and is formed by using, for example, n⁺-type polycrystalline silicon as a material.

Figure 27:
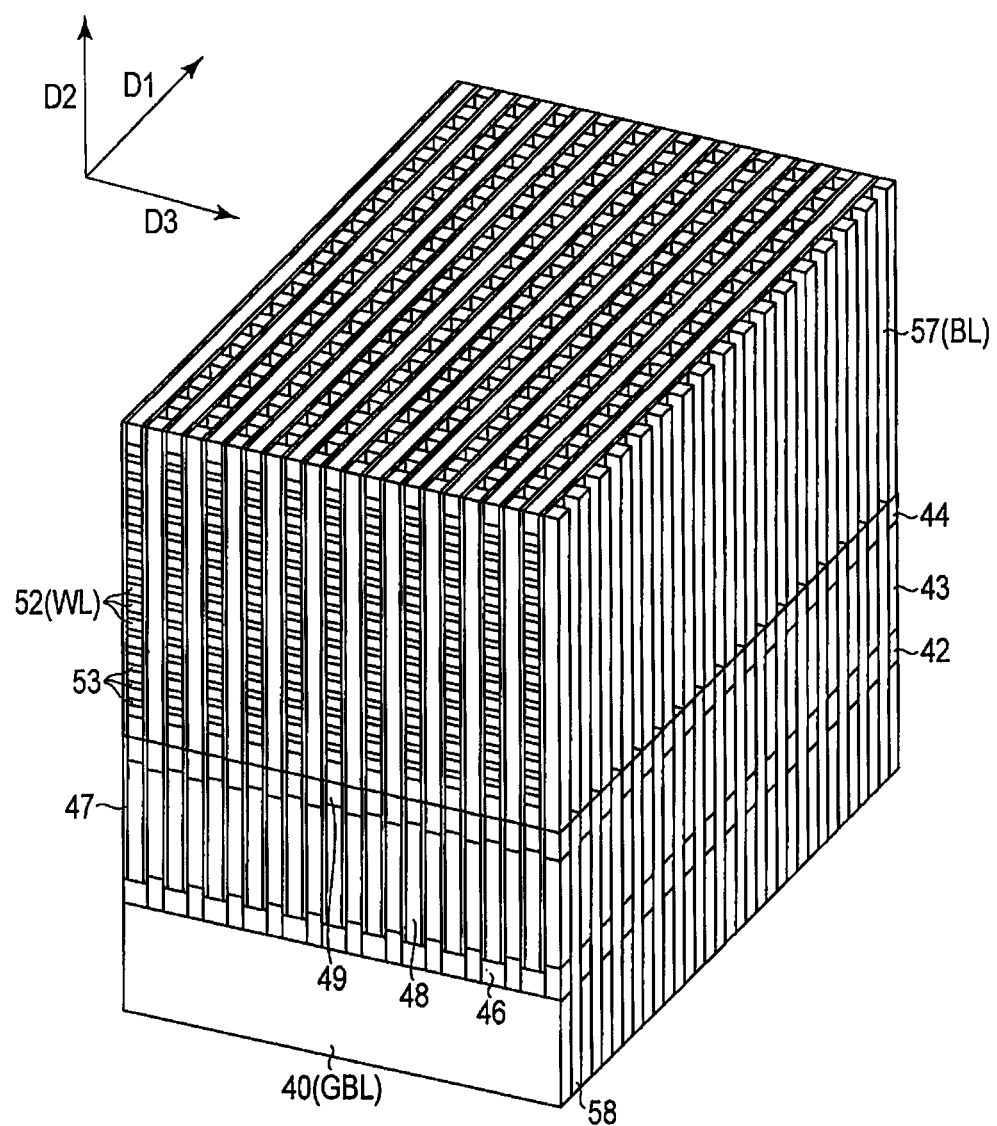

Next, as shown in FIG. 27, the bit line film 57 is patterned into a pillar-like shape by use of the photolithography technology and the RIE technology. The present patterning step is performed, for example, on conditions that both of a line width and an adjacent space are about 24 nm. Moreover, the present step is performed so that the bit line film 57 remains on a lower layer which is the silicon layer 44. As a consequence of the present step, the bit lines BL are completed.

Afterward, an interlayer insulating film fills in each groove between the adjacent bit lines BL, to complete the memory cell region R1. Continuously, a passivation step is performed in the same manner as in a conventional semiconductor device, and an interconnect connecting portion which becomes an input/output portion is further formed. Finally, so-called post steps of inspection, dicing and the like are performed, to complete the ReRAM described in the first embodiment.

2. Re: Fabricating Method of Hook-Up-Region R2

Next, a fabricating method of a hook-up-region R2 will be described with reference to FIG. 28 to FIG. 80. FIGS. 28, 30, 32, 34, 36, 38, 40 to 47, 49, 51, 53, 55, 57, 59, 61, 63, 65, 67, 69, 71, 73, 75 and 77 to 81 are perspective views successively showing fabricating steps of the hook-up-region R2. Moreover, FIGS. 29, 31, 33, 35, 37 and 39 are plan views of FIGS. 28, 30, 32, 34, 36 and 38. Furthermore, FIGS. 48, 50, 52, 54, 56, 58, 60, 62, 64, 66, 68, 70, 72, 74 and 76 are perspective views showing an only word line group WLcomb and a resist for processing the group in FIGS. 47, 49, 51, 53, 55, 57, 59, 61, 63, 65, 67, 69, 71, 73, and 75. It is to be noted that for clarification of the drawings, FIG. 28 to FIG. 78 show only main layers, and the illustration of an interlayer insulating film and the like which are not important for the description is omitted.

Figure 28:
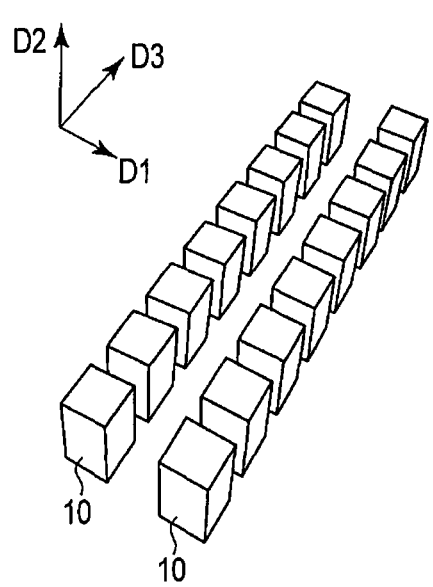
Figure 29:
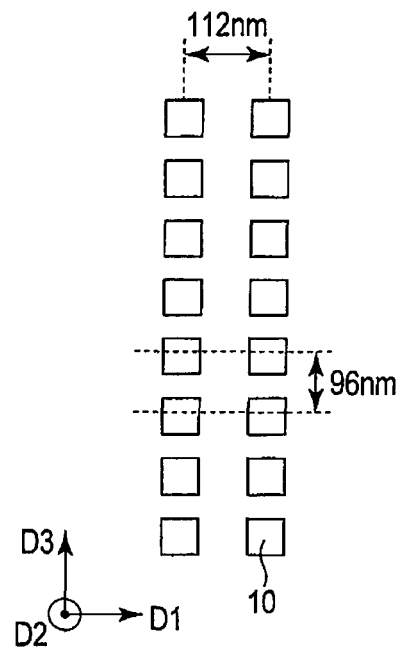
FIGS. 29, 31, 33, 35, 37 and 39 are plan views of FIGS. 28, 30, 32, 34, 36, and 38.

First, as shown in FIGS. 28 and 29, 16 metal interconnect layers 10 associated with 16 layers of word lines WL1 to WL16 are formed by using an upper interconnect (the M1 interconnect: i of the Mi interconnect indicates a level of the interconnect layer) of the CMOS circuit 32 described with reference to FIG. 11. The metal interconnect layers 10 have a quadrangular pattern of, for example, (64 nm×64 nm) or (48 nm×48 nm), a film thickness of, for example, 200 nm, and a sheet resistance of, for example, 0.75 Ω. Furthermore, a pitch in the first direction is, for example, 112 nm, and a pitch in the third direction is 96 nm.

Figure 30:
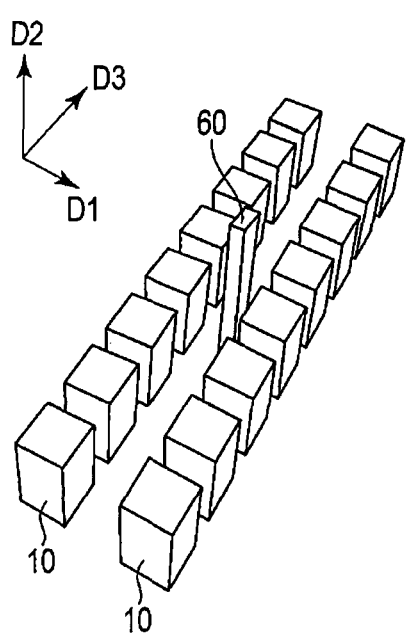
Figure 31:
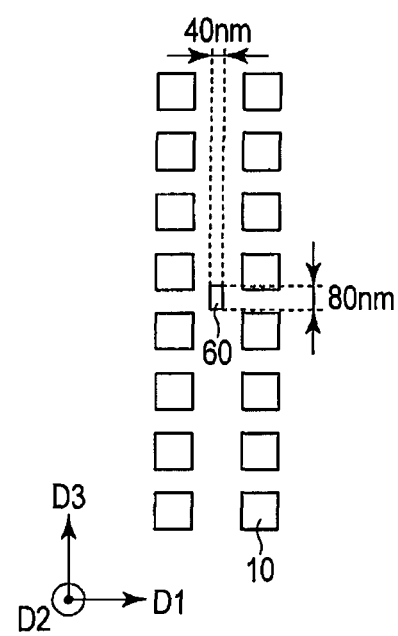

Afterward, an insulating film (not shown) is formed on the whole surface. This insulating film is formed at such a height as to reach the bottom surface of the global bit line film 40 described with reference to FIG. 16. Next, as shown in FIGS. 30 and 31, a contact plug 60 is formed in this insulating film. The contact plug 60 is formed as follows. That is, a contact hole is made in the insulating film. This contact hole is made to reach the metal interconnect layer which is formed by using a lower interconnect (the M0 interconnect) of the CMOS circuit 32 and which is connected to a selection gate line driver. Moreover, a size of an opening in an upper portion of the hole is, for example, (40 nm×80 nm). Afterward, this contact hole is filled with a metal material such as tungsten, to form the contact plug 60. The contact plug 60 can be shared by the memory cell regions R1. Therefore, the number of the contact plugs 60 can overwhelmingly be decreased as compared with the number of the selection gate lines SSG.

Figure 33:
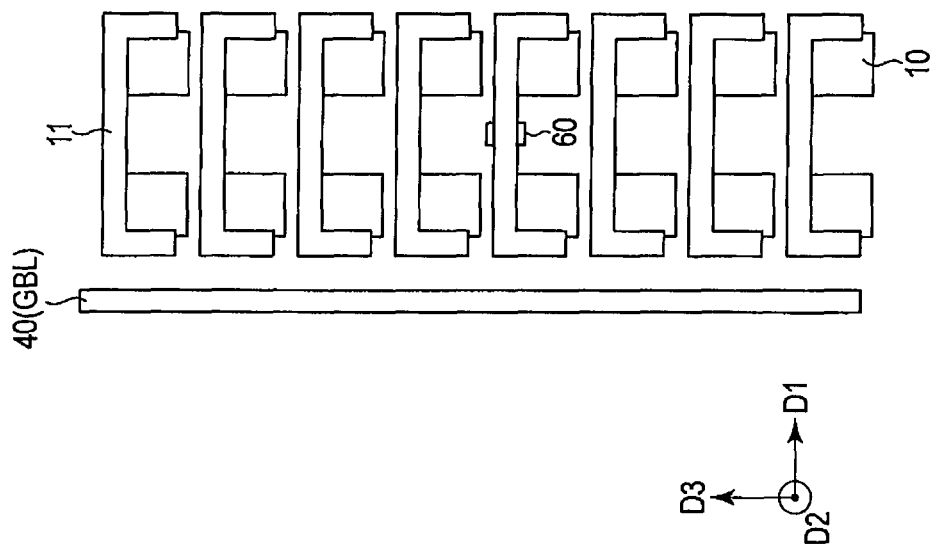
Figure 32:
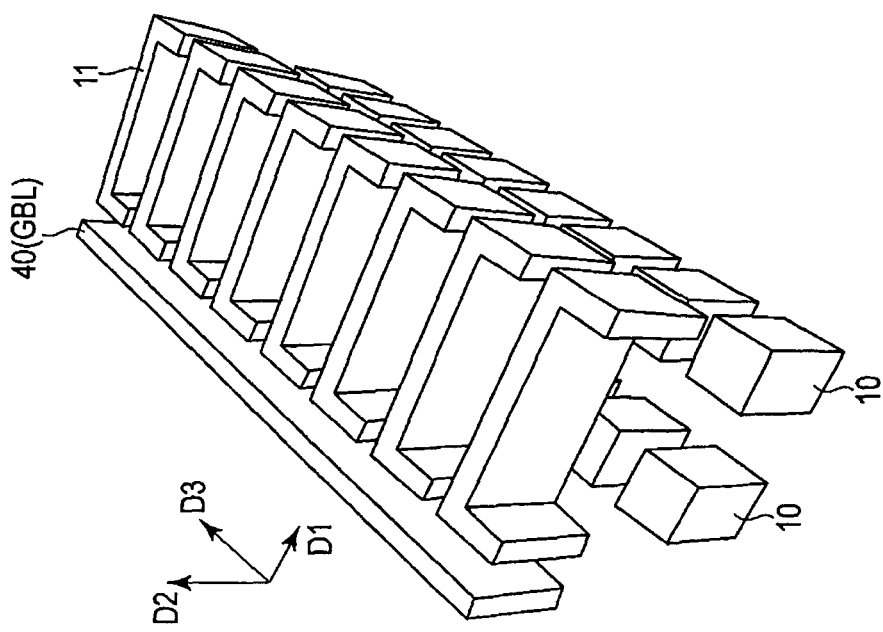

Next, as shown in FIGS. 32 and 33, the bypass patterns (the metal interconnect layers) 11 of the selection gate lines SSG are formed in the same layer as the global bit line film 40 of the memory cell region R1. Some of the bypass patterns 11 are in contact with the contact plugs 60. Moreover, in this fabricating step, the global bit line film 40 is formed in the memory cell region R1 as described with reference to FIG. 16. It is to be noted that the bypass pattern 11 is formed to go around a region right above the metal interconnect layer 10. Moreover, a line width of the pattern is, for example, 24 nm, a minimum adjacent space is, for example, 24 nm, and a sheet resistance is, for example, 1.5 Ω.

Moreover, FIGS. 32 and 33 are views drawn for the understanding of a bypass pattern structure. In an actual step, the silicon layers 42 to 44 are formed in the memory cell region R1 and the hook-up-region R2. Continuously, when the step of FIG. 17 is performed, the bypass pattern 11 is formed. Afterward, the silicon layers 42 to 44 of the hook-up-region R2 are etched, the structure of FIGS. 32 and 33 is obtained. Afterward, as described with reference to FIG. 18, the insulating film 58 is formed in the memory cell region R1 and the hook-up-region R2, and a patterning step is performed as described with reference to FIG. 18. In consequence, the grooves 45 having the pattern of the selection gate lines SSG formed later are made not only in the memory cell region R1 but also in the hook-up-region R2. Afterward, the steps of FIGS. 19 and 20 are performed in the memory cell region R1.

Figure 35:
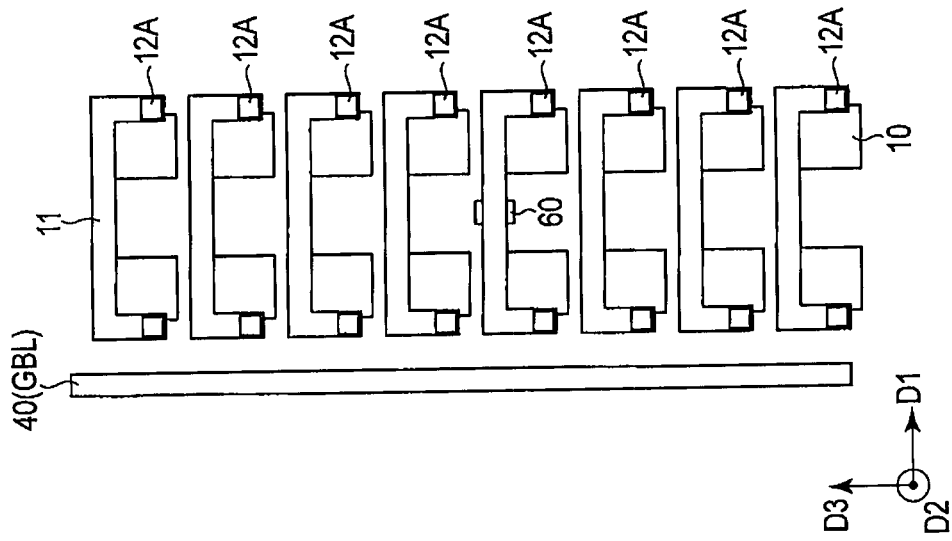
Figure 34:
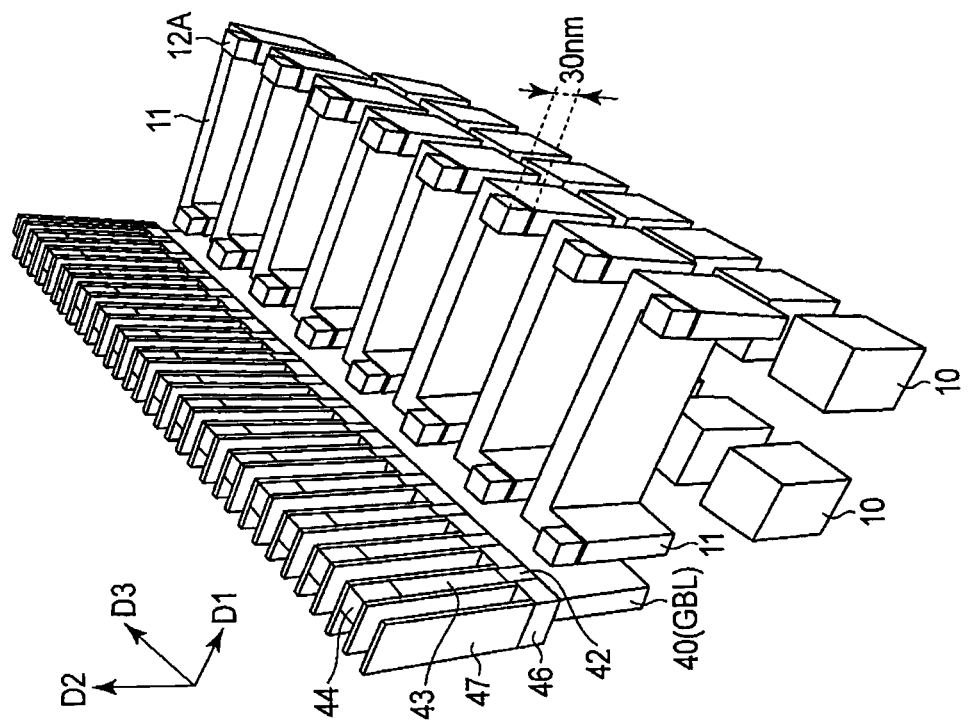
Figure 37:
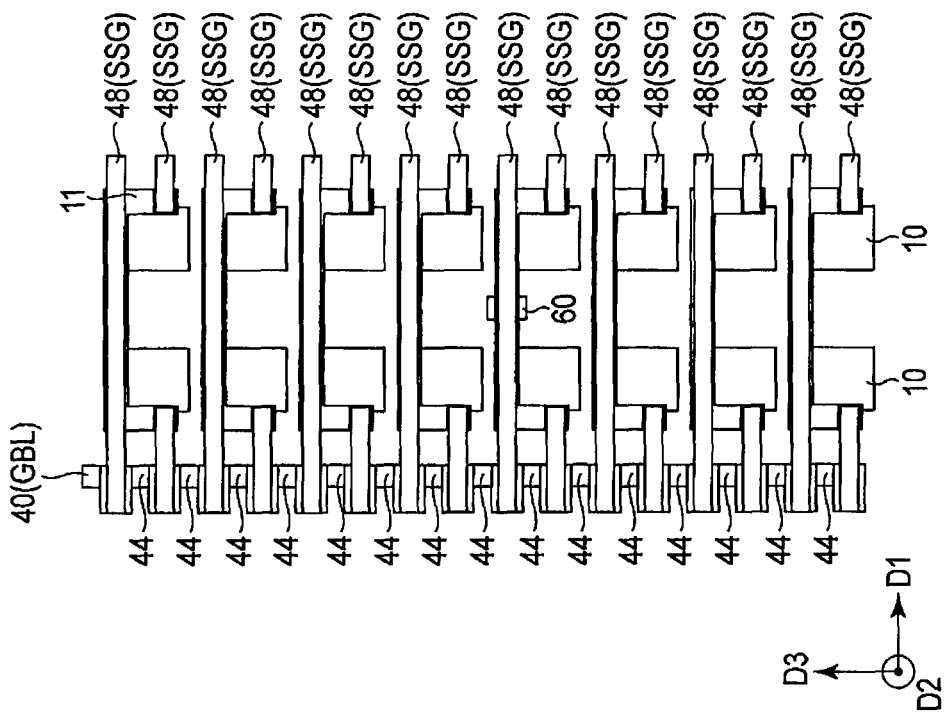
Figure 36:
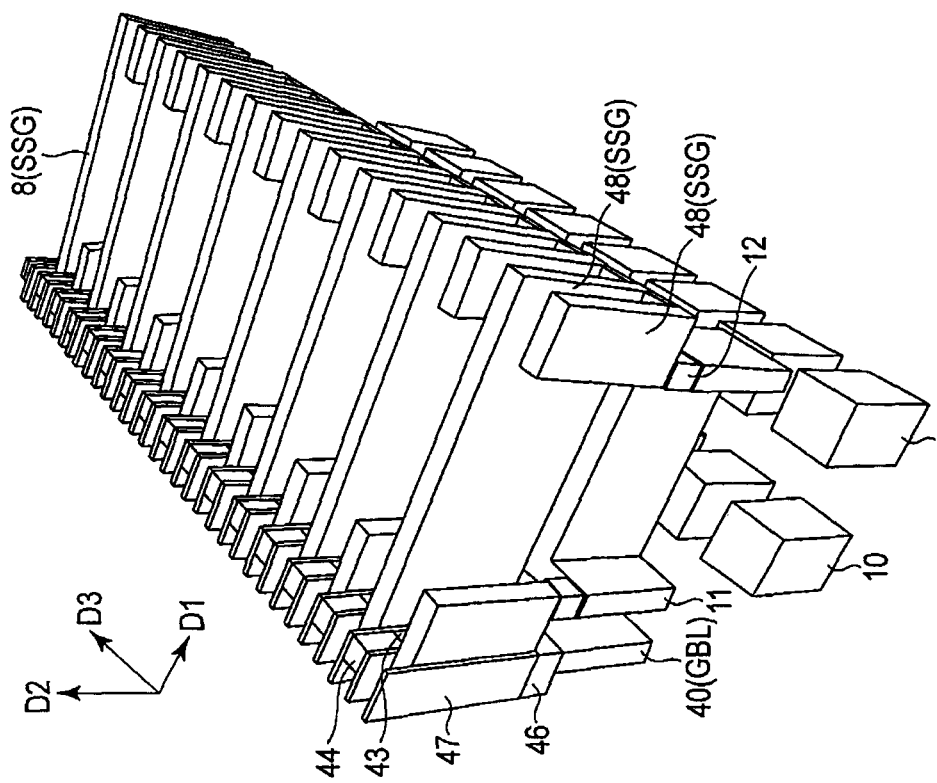

Afterward, as shown in FIGS. 34 and 35, contact holes 12A reaching the bypass pattern 11 are made in the bottom portions of the grooves 45 in the hook-up-region R2. The contact holes 12A are used to form contact plugs 12, and a depth of each hole is, for example, 30 nm. Afterward, the step of FIG. 21 is carried out. In this step, as shown in FIGS. 36 and 37, the conductive film 48 is also formed in the grooves 45 of the hook-up-region R2. Furthermore, the conductive film 48 fills in the contact holes 12A to form the contact plugs 12.

As a consequence of the step of FIGS. 36 and 37, the selection gate lines SSG connected in common between the memory cell regions R1 adjacent in the first direction are completed. In one of the selection gate lines SSG, the conductive film 48 is separated between the memory cell regions R1. Then, two separated conductive films 48 are connected via a bypass pattern formed by the contact plug 12 and the interconnect layer 11 which is a lower layer below the conductive film 48. Moreover, the selection gate line SSG which does not pass through the region right above the metal interconnect layer 10 is formed by the one conductive film 48 of a line pattern. In consequence, in the region right above the metal interconnect layer 10, any selection gate line SSG is not present, but a not-shown insulating film is present.

Figure 39:
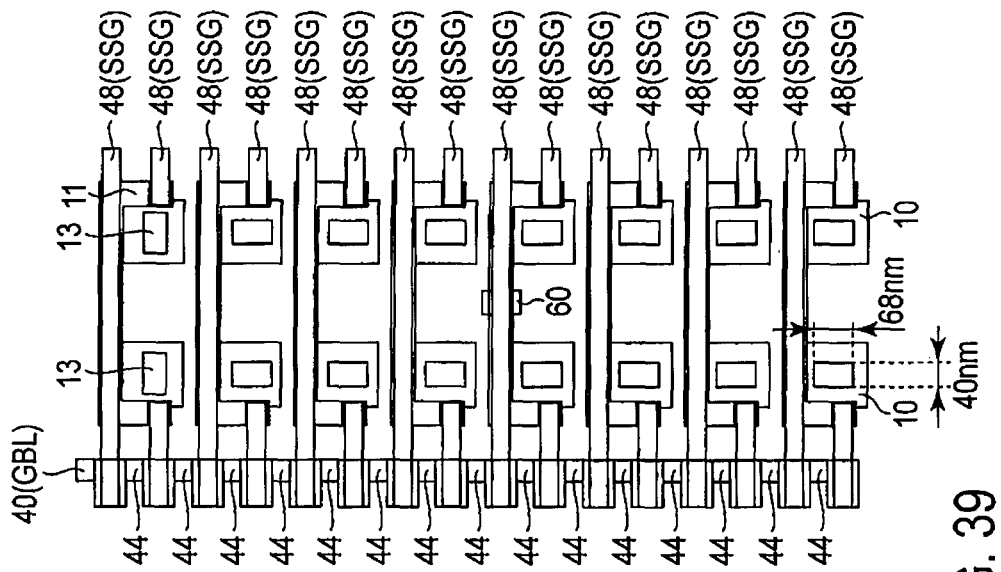
Figure 38:
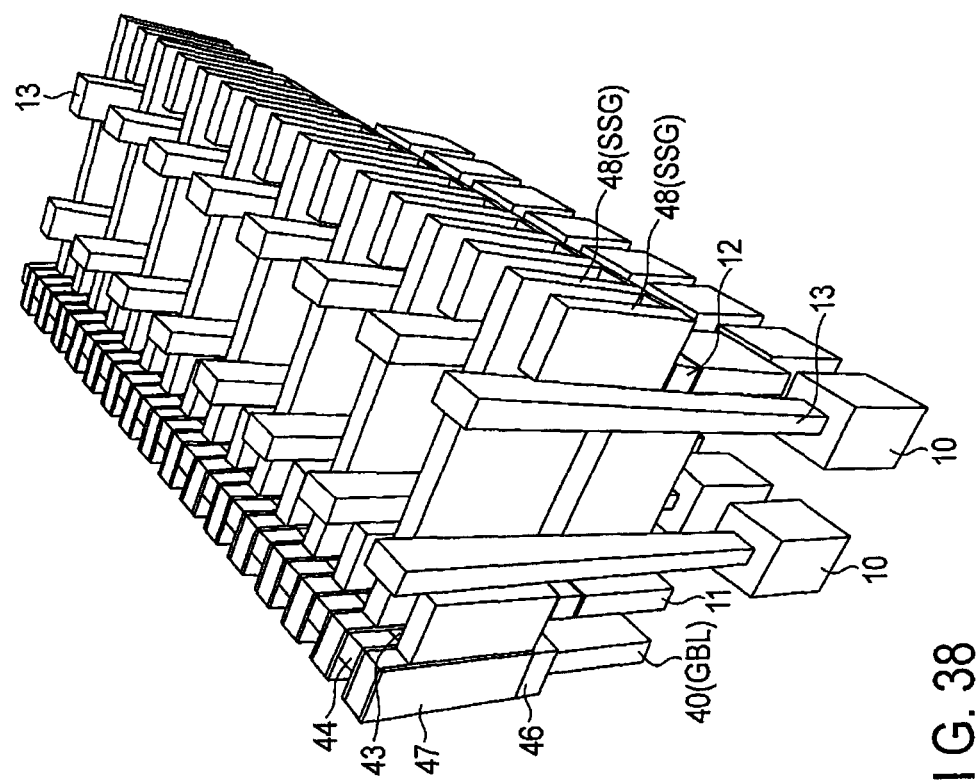
Figure 40:
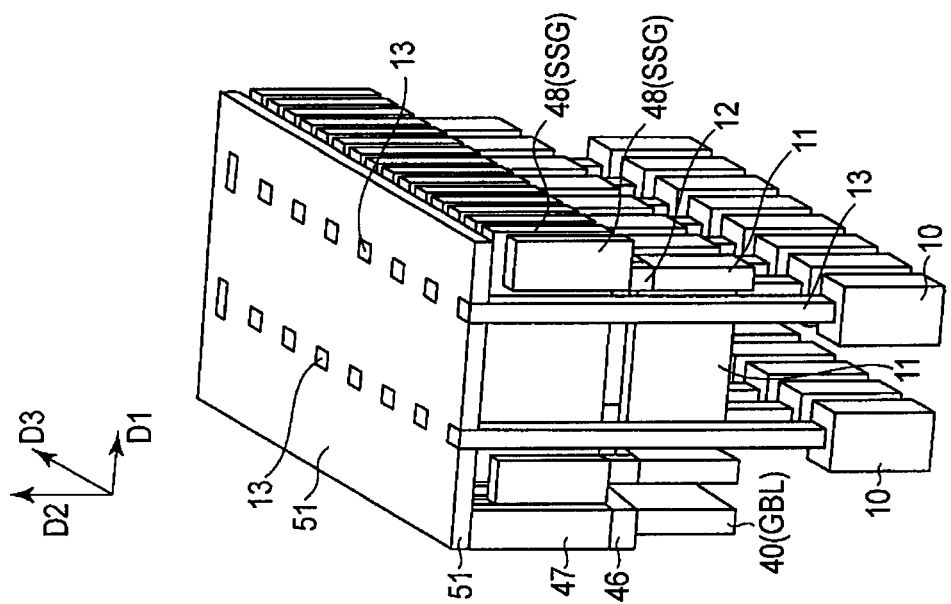

Next, the step of FIG. 22 is carried out in the memory cell region R1. Furthermore, the insulating film 51 is formed in the memory cell region R1 and the hook-up-region R2. Afterward, in the hook-up-region R2, contact holes which reach 16 metal interconnect layers 10 are made in the insulating film. A size of an opening in an upper portion of this contact hole is, for example, (32 nm×48 nm). Then, as shown in FIGS. 38 and 39, these contact holes are filled with a metal such as tungsten, to form contact plugs 13. FIG. 40 is a perspective view showing the same step as FIG. 38, and the insulating film 51 is shown for reference.

Figure 41:
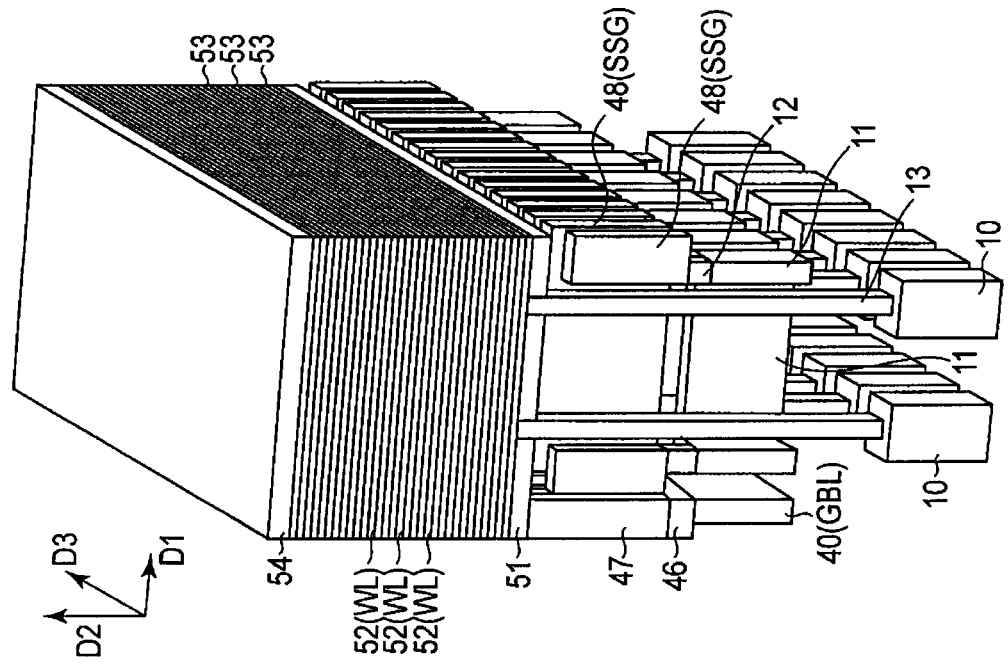

Next, the step described with reference to FIG. 23 is carried out in the memory cell region R1. In this step, the word line films 52 and the insulating films 53 and 54 are also formed in the hook-up-region R2, as shown in FIG. 41. The word line film (WL1) 52 of the lowermost layer is in contact with the contact plugs 13.

Figures 42, 43:
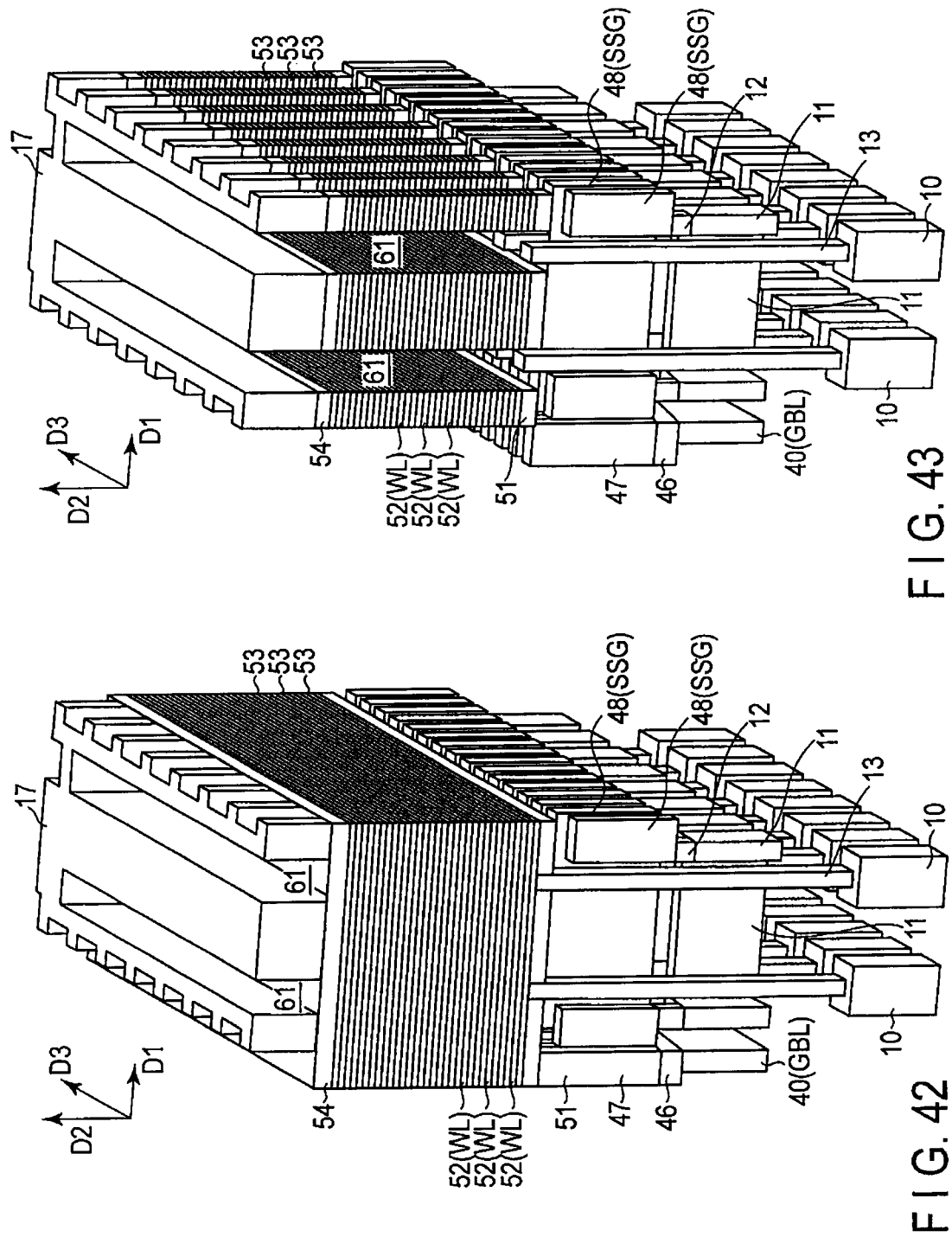

Next, as shown in FIG. 42, a mask layer 17 is formed by conventional photolithography and mask processing technologies, by use of a silicon nitride film having a film thickness of, for example, 100 nm in a material. The mask layer 17 functions as a mask for the patterning step of FIG. 24 in the memory cell region R1, and functions as a mask for forming the word line step portion of FIGS. 7 and 8 in the hook-up-region R2. Therefore, the mask layer 17 of the hook-up-region R2 has a shape including a region where the word lines WL which belong to the same word line group WLcomb are connected in common and a region, along the third direction, for forming the word line step portion. Then, grooves 61 are made between these regions.

Next, the patterning step of FIG. 24 is carried out in the memory cell region R1 by use of the mask layer 17. It is to be noted that in FIGS. 24 to 27, the illustration of the mask material 17 is omitted. In this step, a similar patterning step is also carried out in the hook-up-region R2, as shown in FIG. 43. In consequence, the grooves 61 reach the bottom portion of the insulating film 51, and the upper surfaces of the contact plugs 13 are exposed in the bottom portions of the grooves 61.

Afterward, the steps shown in FIGS. 25 to 27 are performed in the memory cell region R1. Furthermore, after the structure of FIG. 27 is obtained, an interlayer insulating film is formed in a region between the adjacent bit lines BL. In these steps, the hook-up-region R2 is protected by a mask material such as a coating type carbon material. Afterward, the hook-up-region R2 is processed.

First, the mask material which has protected the hook-up-region R2 is removed. Then, as shown in FIG. 44, an insulating film (e.g., a silicon nitride film) 16 having a film thickness of, for example, 10 nm is formed on the side surfaces and bottom surfaces of the grooves 61 and on the mask layer 17 by an LPCVD process. The inner portions of the grooves 61 are uniformly covered with the insulating film 16. Afterward, the insulating film 16 is etched back, whereby the insulating film 16 is left only on the side surfaces of the grooves 61. In consequence, the contact plugs 13 are exposed in the bottom surfaces of the grooves 61.

Next, as shown in FIG. 45, a hard mask (e.g., a silicon oxide film is a main component) 62 having a film thickness of, for example, 700 to 800 nm is formed on the mask layer 17. Moreover, the hard mask 62 is patterned into such a pattern as to expose only one row of the word line step portion by the conventional photolithography and mask processing technologies. In consequence, a groove 63 is made. Continuously, the mask layer 17 and the insulating film 16 are etched by RIE by use of the hard mask 62. Furthermore, the insulating film 54 exposed in a bottom portion of the groove 63 and the word line film 52 of the uppermost layer are removed by the RIE. In consequence, a structure of FIG. 45 is obtained. It is to be noted that the grooves 61 are filled with the hard mask 62, although not shown in FIG. 45. Further in the present step, a groove 64 which reaches the upper surface of the insulating film 54 is made in a predetermined forming region of a contact plug 15.

Figure 46:
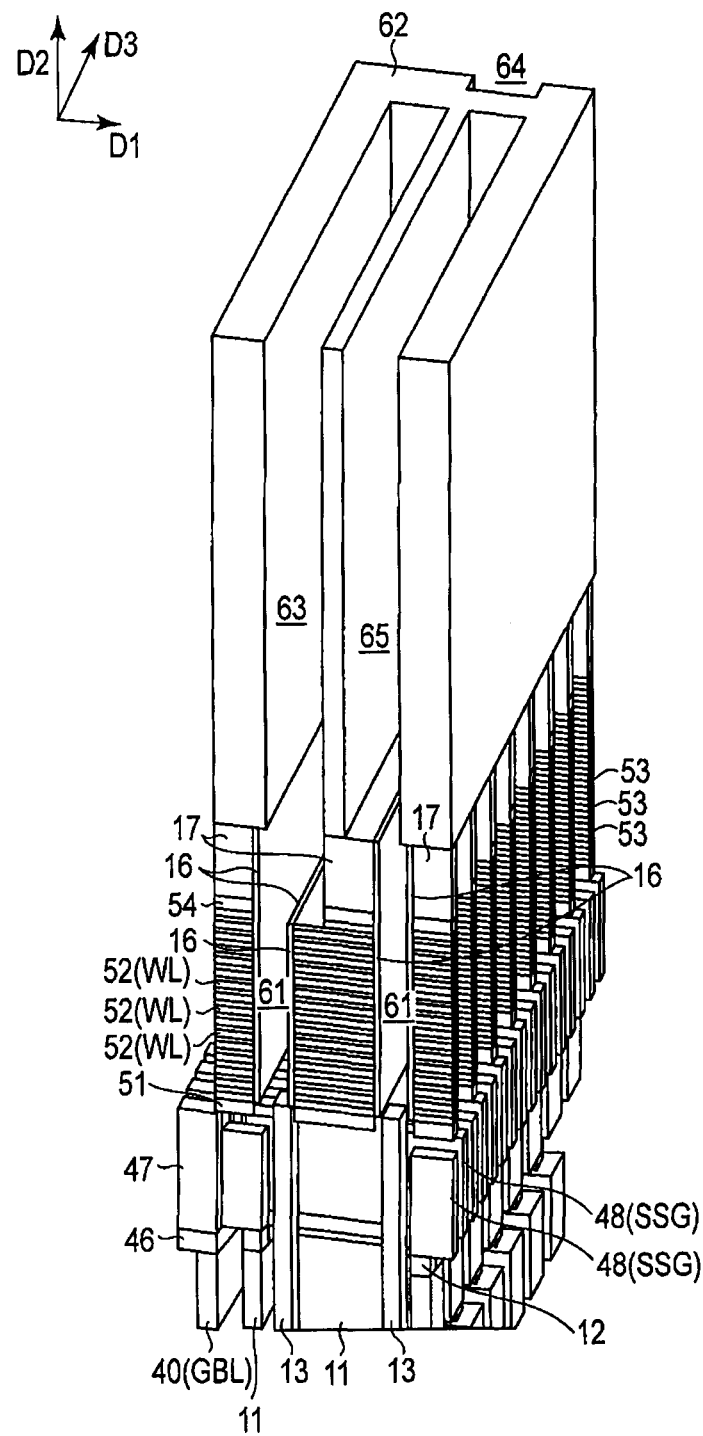

Next, as shown in FIG. 46, the hard mask 62 is patterned into such a pattern as to expose the other row of the word line step portion by the conventional photolithography and mask processing technologies. In consequence, a groove 65 is made.

Next, the insulating films 16 and 17 in a bottom portion of the groove 65 are etched to expose the insulating film 54. Afterward, as shown in FIG. 47, a shrink mask (e.g., the photoresist or the like) 66 is formed in the grooves 63 to 65. It is to be noted that as described above, the grooves 61 of FIG. 47 are filled with, for example, the insulating film 62. Moreover, groove is made on the side depicted as closer to the viewer of FIG. 47, a sectional portion formed in a first direction and a second direction of FIG. 47 is exposed. That is, the hard mask 62 and the shrink mask 66 on the side depicted as closer to the viewer of FIG. 47 do not come in contact with any position. On the other hand, a structure on the side depicted as farther from the viewer of FIG. 47 in a third direction comes in contact with an adjacent hook-up portion back to back. Therefore, a periphery of the shrink mask 66 in the groove 64 is surrounded with the hard mask 62.

FIG. 48 is a perspective view only showing the shrink mask 66 and the word line step portion under the shrink mask 66 from FIG. 47. The same applies to FIGS. 50, 52, 54, 56, 58, 60, 62, 64, 66, 68, 70, 72, 74, and 76.

Next, as shown in FIGS. 49 and 50, a first shrink step is performed. That is, the side surfaces of the shrink masks 66 are recessed, for example, as much as 96 nm by a chemical solution treatment, an ashing treatment or the like. In this step, the upper surfaces of the shrink masks 66 are also recessed as much as the same degree. In consequence, the insulating film 53 on the word line WL15 is exposed in the bottom portion of the groove 63, and the insulating film 54 on the word line WL16 is exposed in the bottom portion of the groove 65.

Next, as shown in FIGS. 51 and 52, a first step RIE process is performed. That is, two word line films and two insulating films (four layers in total) of the word line step portion exposed by recessing the shrink masks 66 in FIGS. 49 and 50 are etched by the RIE (in this case, the insulating film 16 is also etched). In consequence, the insulating film 53 on the word line WL13 is exposed in the bottom portion of the groove 63, and the word lines WL15 and WL14 are exposed on the side surfaces of the groove 63. Moreover, the insulating film 53 on the word line WL14 is exposed in the bottom portion of the groove 65, and the word lines WL16 and WL15 are exposed on the side surfaces of the groove 65.

Figure 53:
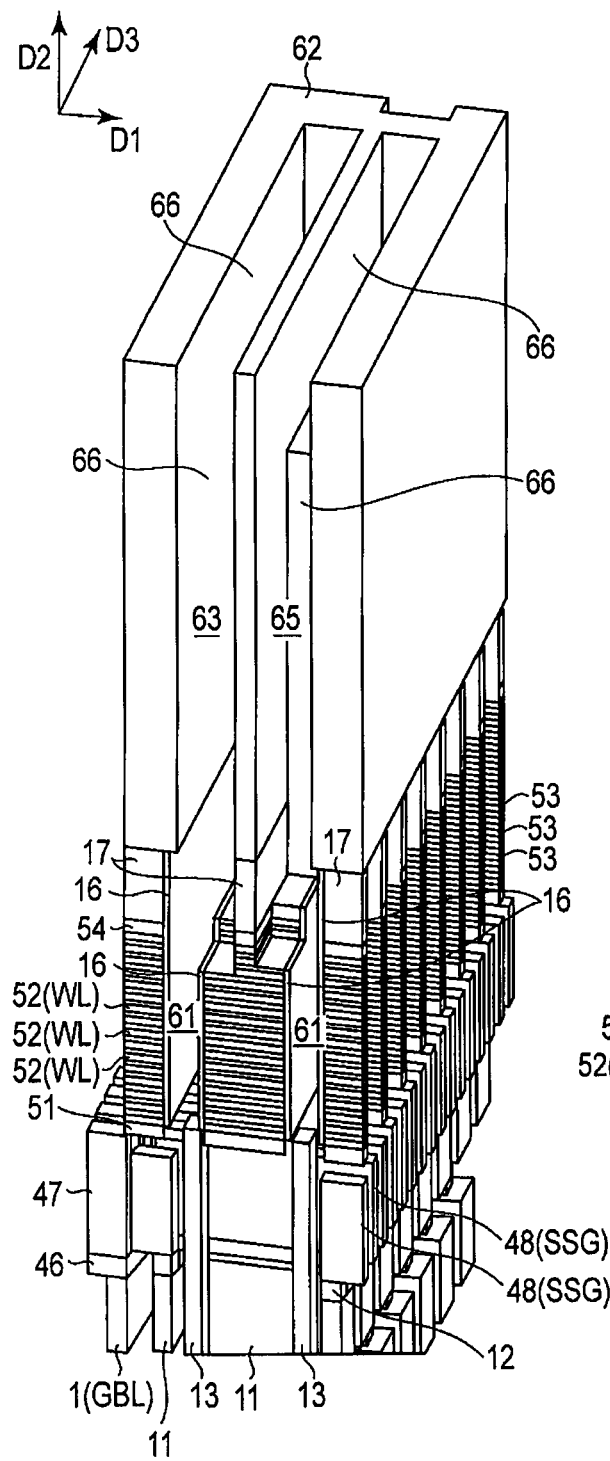
Figure 54:
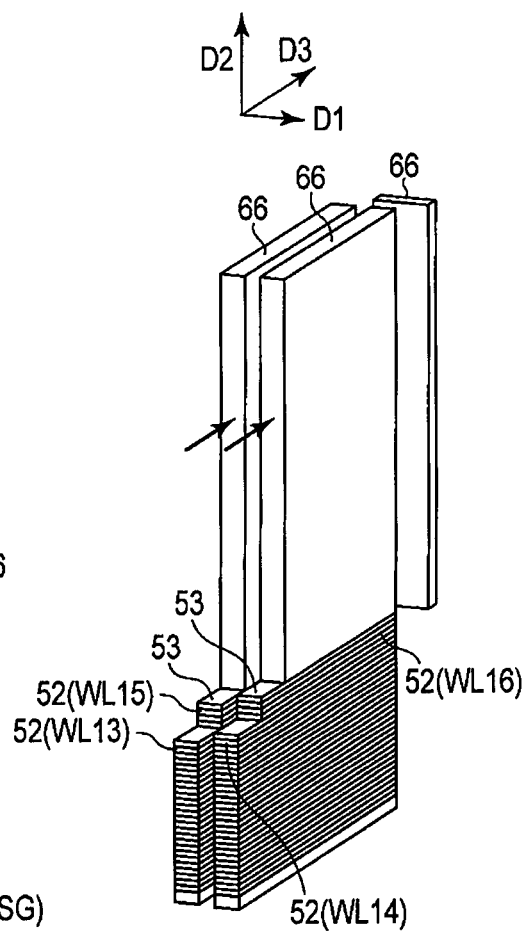

Hereinafter, a combination of the step of FIGS. 49 and 50 and the step of FIGS. 51 and 52 is repeated six times. That is, first as shown in FIGS. 53 and 54, a second shrink step is performed, whereby the side surfaces of the shrink masks 66 are further recessed as much as 96 nm. In consequence, the insulating films 53 on the word lines WL15 and WL13 are exposed in the bottom portion of the groove 63, and the insulating film 54 on the word line WL16 and the insulating film 53 on the word line WL14 are exposed in the bottom portion of the groove 65. Next, as shown in FIGS. 55 and 56, a second step RIE process is performed. That is, two word line films and two insulating films (four layers in total) of the exposed word line step portion are further etched. Consequently, the insulating films 53 on the word lines WL13 and WL11 are exposed in the bottom portion of the groove 63, and the word lines WL15 to WL12 are exposed on the side surfaces of the groove 63. Moreover, the insulating films 53 on the word lines WL14 and WL12 are exposed in the bottom portion of the groove 65, and the word lines WL16 to WL13 are exposed on the side surfaces of the groove 65.

Figures 57, 58:
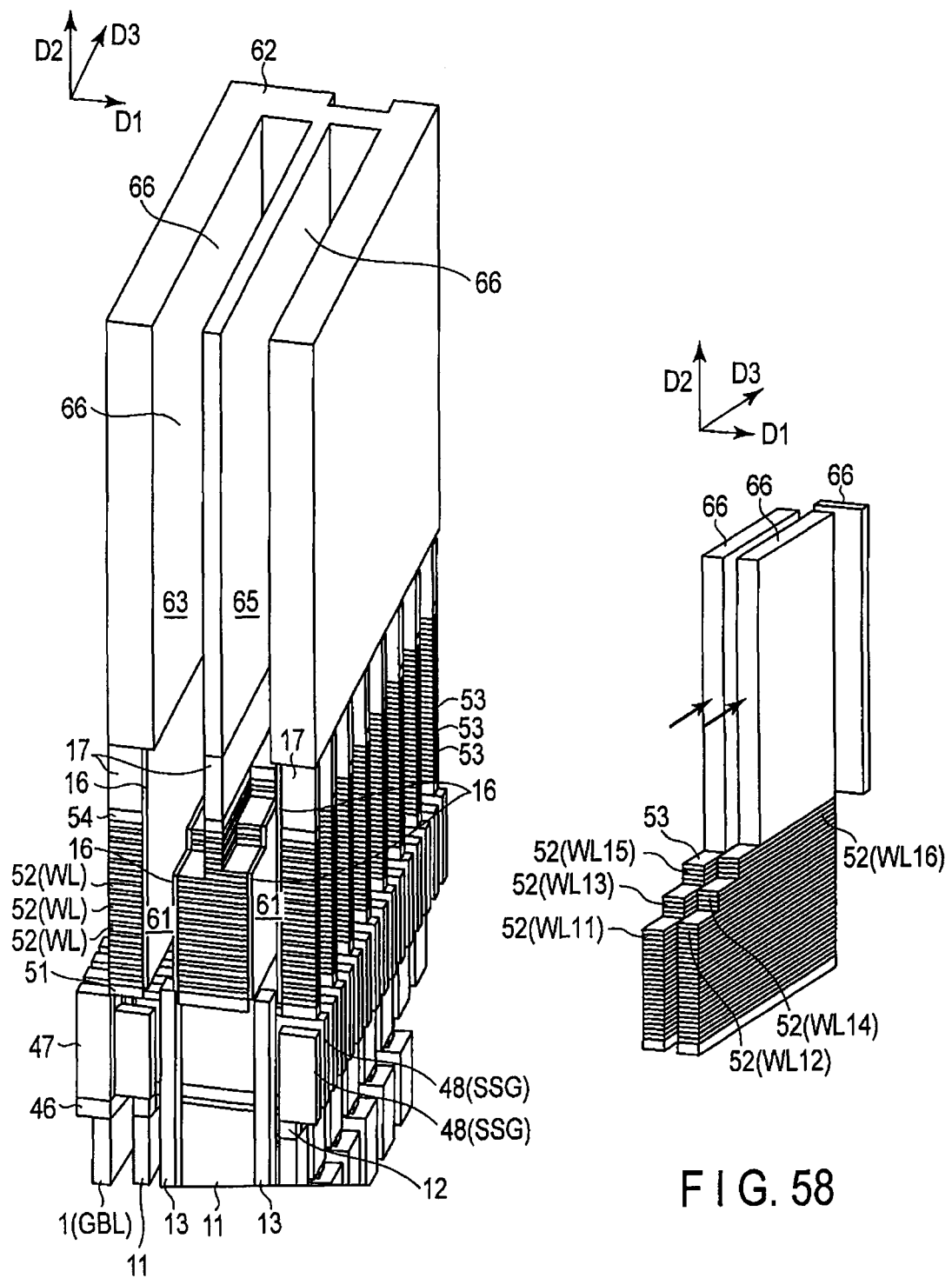
Figures 59, 60:
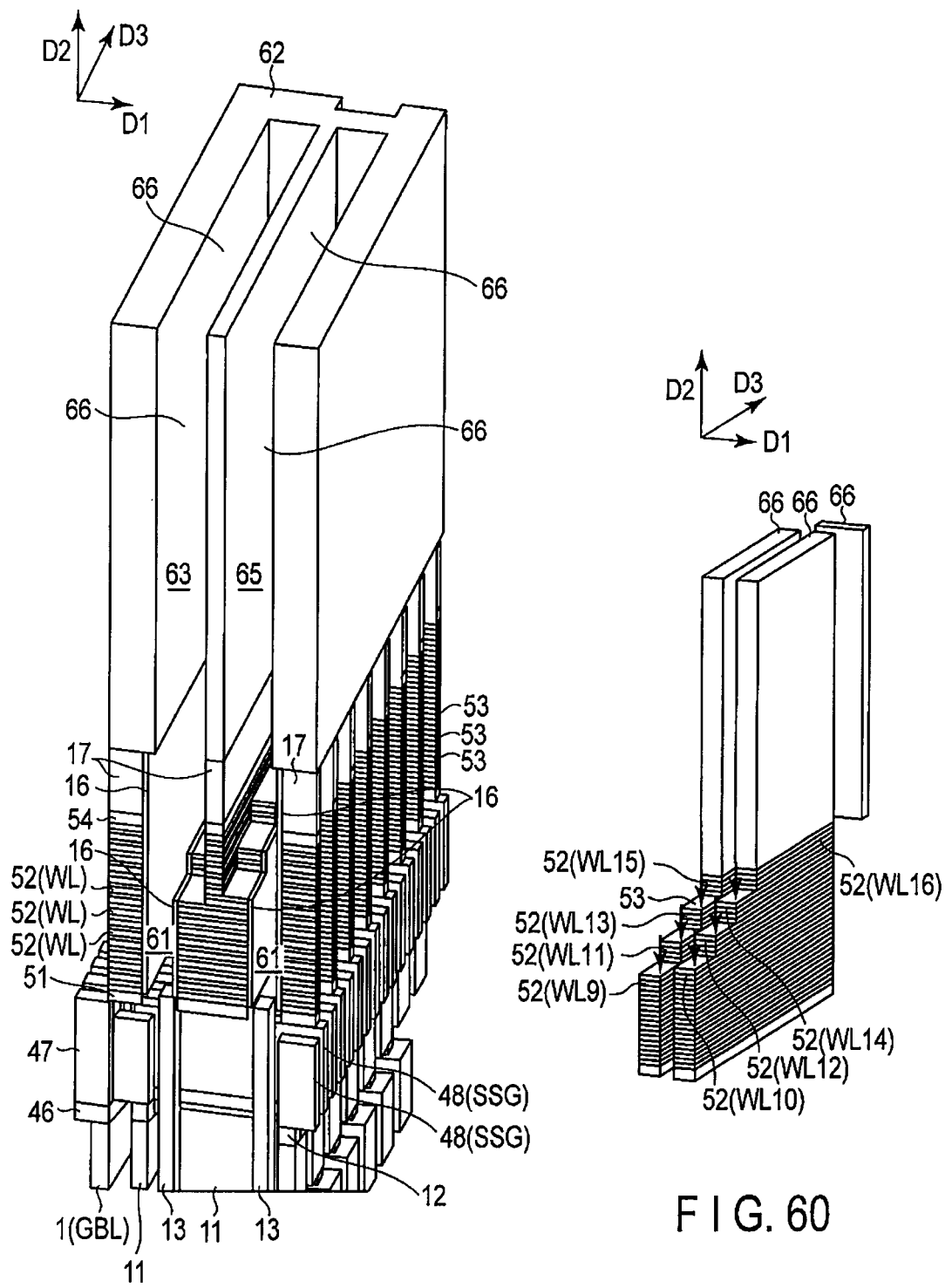

Next, as shown in FIGS. 57 and 58, a third shrink step is carried out. The insulating films 53 on the word lines WL15, WL13 and WL11 are exposed in the bottom portion of the groove 63, and the insulating film 54 on the word line WL16 and the insulating films 53 on the word lines WL14 and WL12 are exposed in the bottom portion of the groove 65. Next, as shown in FIGS. 59 and 60, a third step RIE process is performed. In consequence, the insulating films 53 on the word lines WL13, WL11 and WL9 are exposed in the bottom portion of the groove 63, and the word lines WL15 to WL10 are exposed on the side surfaces of the groove 63. Moreover, the insulating films 53 on the word lines WL14, WL12 and WL10 are exposed in the bottom portion of the groove 65, and the word lines WL16 to WL11 are exposed on the side surfaces of the groove 65.

Figures 61, 62:
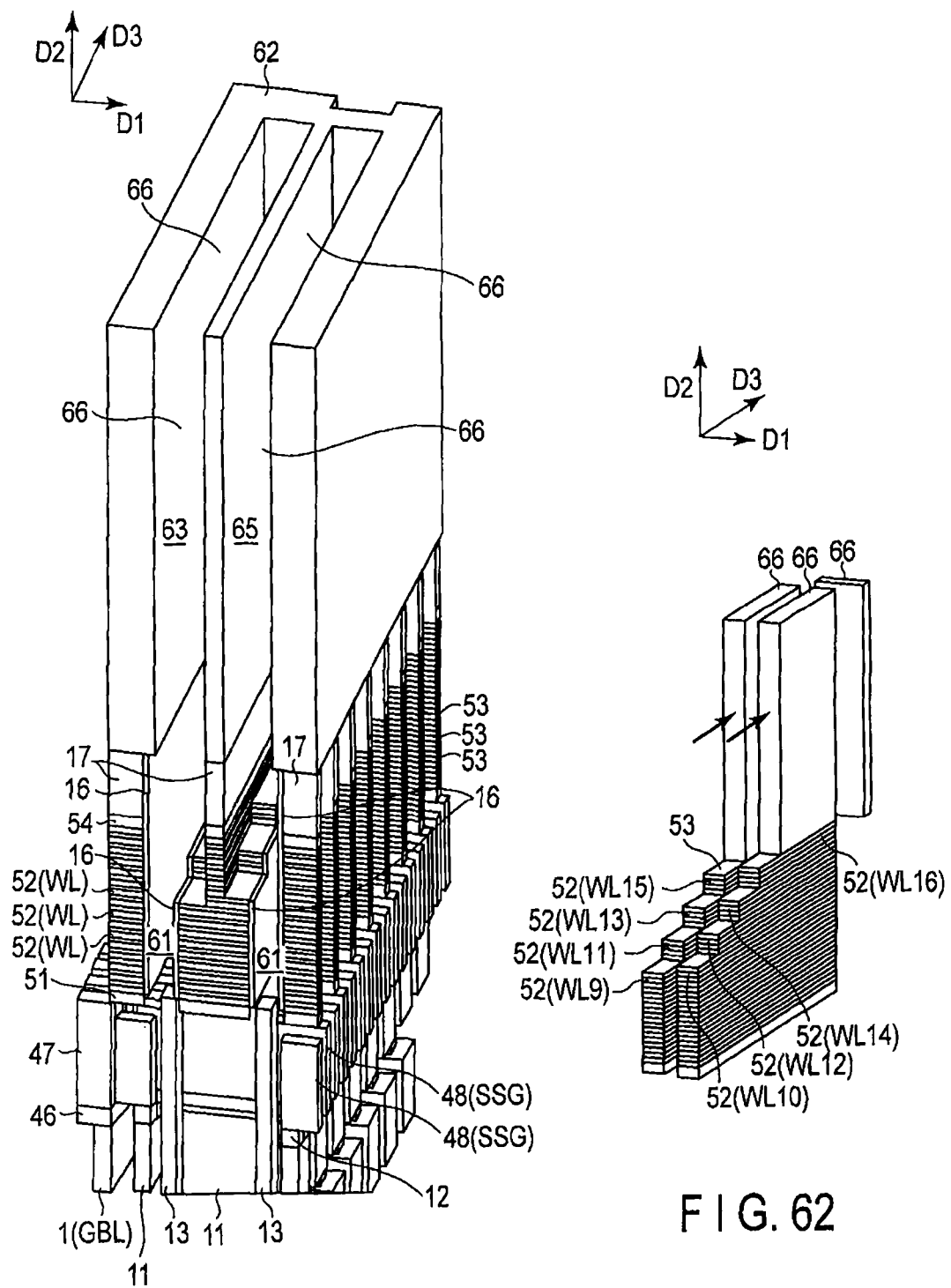

Next, as shown in FIGS. 61 and 62, a fourth shrink step is carried out. The insulating films 53 on the word lines WL15, WL13, WL11 and WL9 are exposed in the bottom portion of the groove 63, and the insulating film 54 on the word line WL16 and the insulating films 53 on the word lines WL14, WL12 and WL10 are exposed in the bottom portion of the groove 65. Next, as shown in FIGS. 63 and 64, a fourth step RIE process is performed. In consequence, the insulating films 53 on the word lines WL13, WL11, WL9 and WL7 are exposed in the bottom portion of the groove 63, and the word lines WL15 to WL8 are exposed on the side surfaces of the groove 63. Moreover, the insulating films 53 on the word lines WL14, WL12, WL10 and WL8 are exposed in the bottom portion of the groove 65, and the word lines WL16 to WL9 are exposed on the side surfaces of the groove 65.

Figures 65, 66:
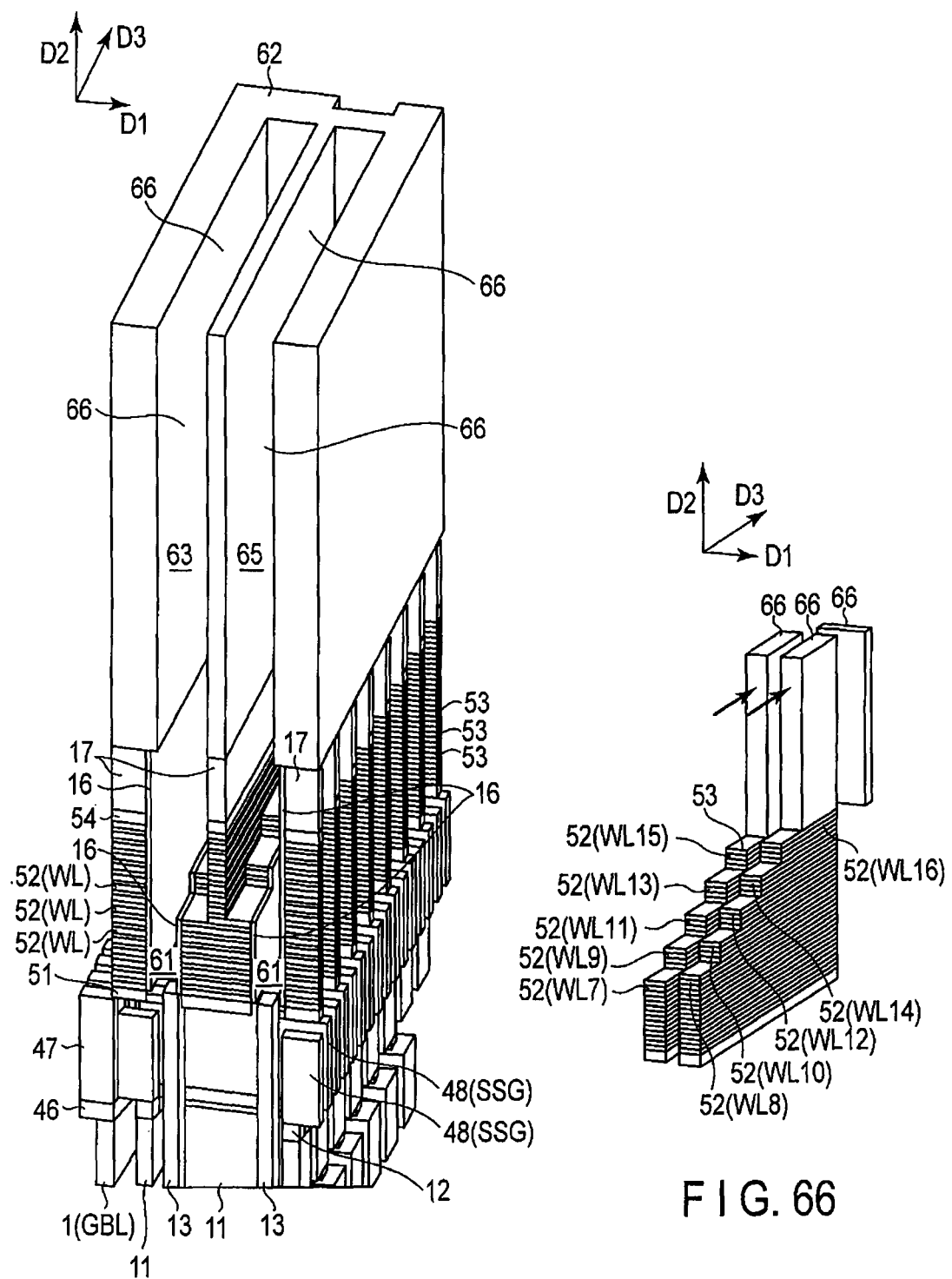
Figure 67:
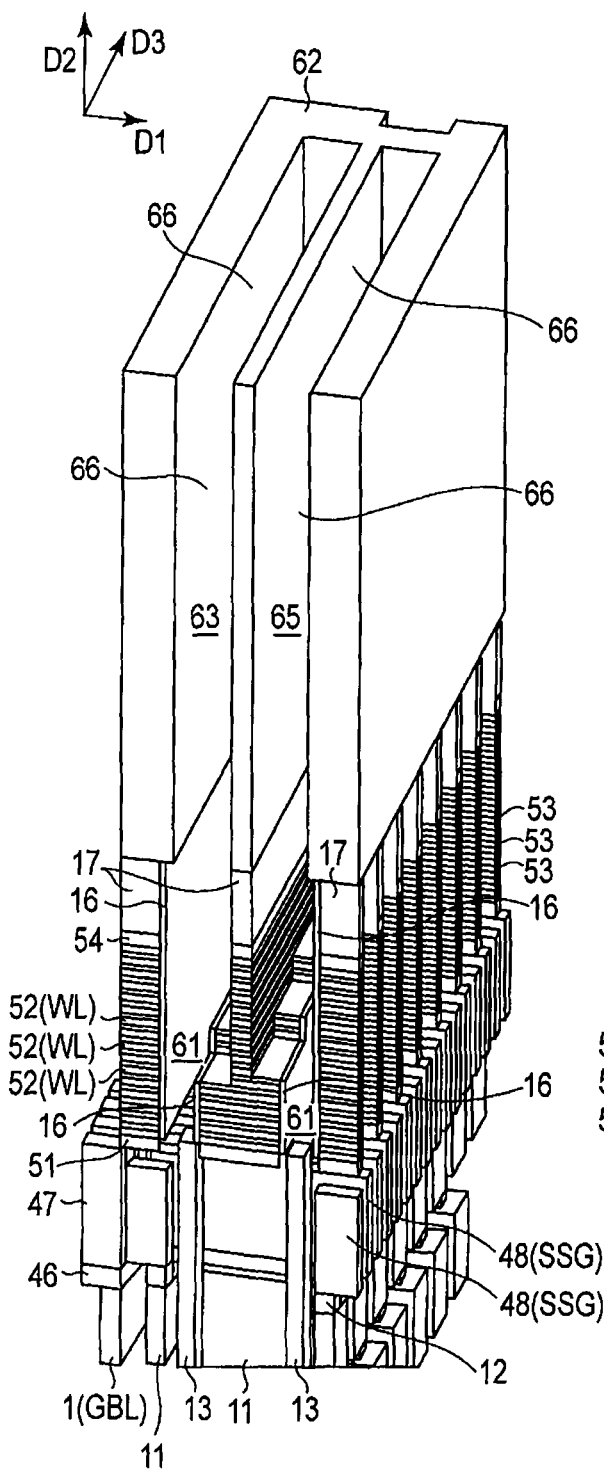
Figure 68:
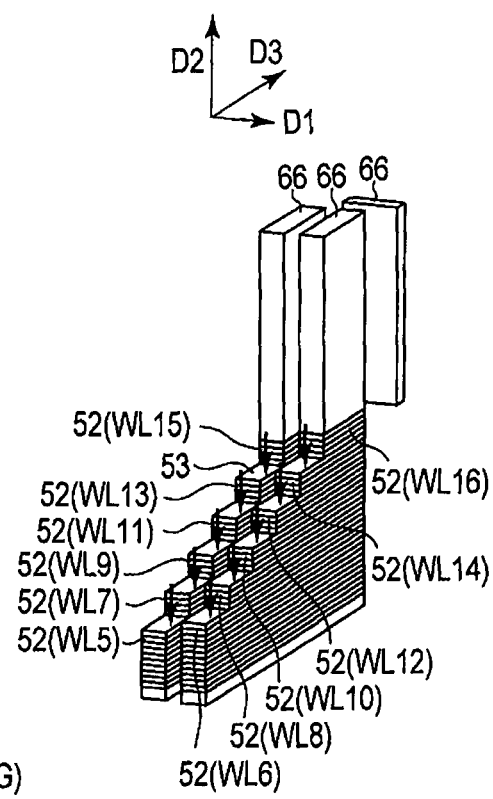

Next, as shown in FIGS. 65 and 66, a fifth shrink step is carried out. The insulating films 53 on the word lines WL15, WL13, WL11, WL9 and WL7 are exposed in the bottom portion of the groove 63, and the insulating film 54 on the word line WL16 and the insulating films 53 on the word lines WL14, WL12, WL10 and WL8 are exposed in the bottom portion of the groove 65. Next, as shown in FIGS. 67 and 68, a fifth step RIE process is performed. In consequence, the insulating films 53 on the word lines WL13, WL11, WL9, WL7 and WL5 are exposed in the bottom portion of the groove 63, and the word lines WL15 to WL6 are exposed on the side surfaces of the groove 63. Moreover, the insulating films 53 on the word lines WL14, WL12, WL10, WL8 and WL6 are exposed in the bottom portion of the groove 65, and the word lines WL16 to WL7 are exposed on the side surfaces of the groove 65.

Figures 71, 72:
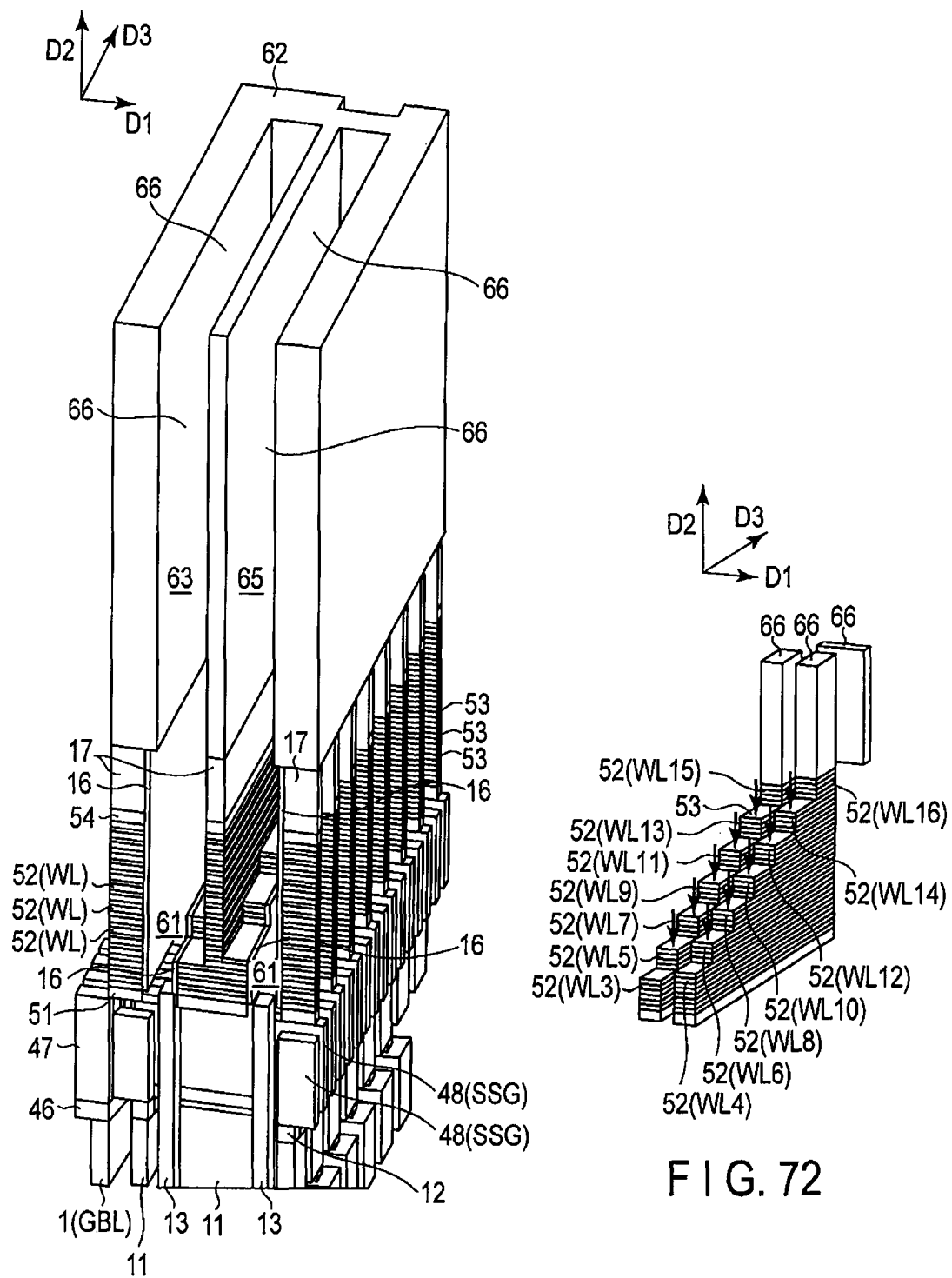

Next, as shown in FIGS. 69 and 70, a sixth shrink step is carried out. The insulating films 53 on the word lines WL15, WL13, WL11, WL9, WL7 and WL5 are exposed in the bottom portion of the groove 63, and the insulating film 54 on the word line WL16 and the insulating films 53 on the word lines WL14, WL12, WL10, WL8 and WL6 are exposed in the bottom portion of the groove 65. Next, as shown in FIGS. 71 and 72, a sixth step RIE process is carried out. In consequence, the insulating films 53 on the word lines WL13, WL11, WL9, WL7, WL5 and WL3 are exposed in the bottom portion of the groove 63, and the word lines WL15 to WL4 are exposed on the side surfaces of the groove 63. Moreover, the insulating films 53 on the word lines WL14, WL12, WL10, WL8, WL6 and WL4 are exposed in the bottom portion of the groove 65, and the word lines WL16 to WL5 are exposed on the side surfaces of the groove 65.

Figure 73:
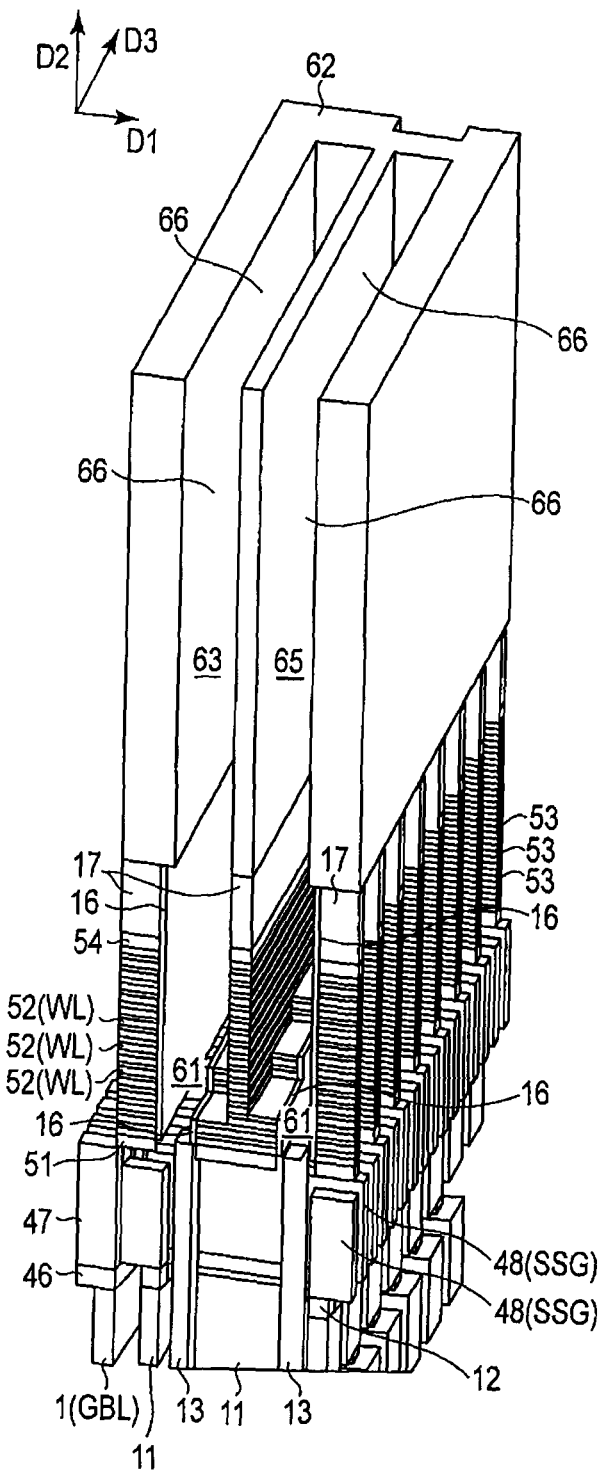
Figure 74:
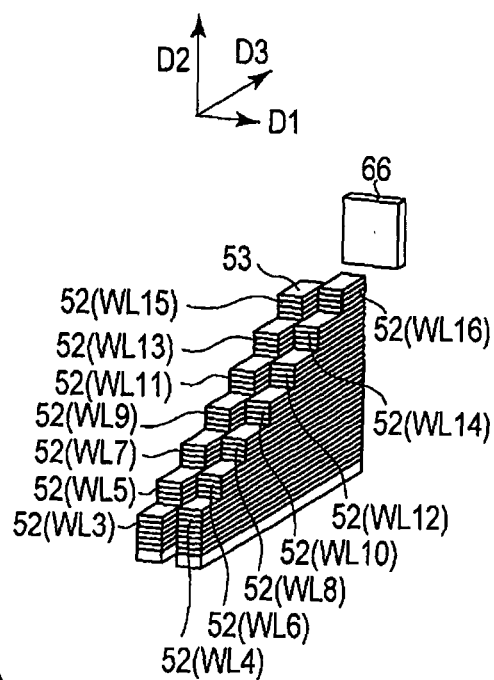

Next, as shown in FIGS. 73 and 74, a seventh shrink step is performed. The insulating films 53 on the word lines WL15, WL13, WL11, WL9, WL7, WL5 and WL3 are exposed in the bottom portion of the groove 63, and the insulating film 54 on the word line WL16 and the insulating films 53 on the word lines WL14, WL12, WL10, WL8, WL6 and WL4 are exposed in the bottom portion of the groove 65. Next, as shown in FIGS. 75 and 76, a seventh step RIE process is performed. In the seventh step RIE process, one word line film and one insulating film (two layers in total) are etched by the RIE. In consequence, the insulating films 53 on the word lines WL14, WL12, WL10, WL8, WL6, WL4 and WL2 are exposed in the bottom portion of the groove 63, and the word lines WL15 to WL3 are exposed on the side surfaces of the groove 63. Moreover, the insulating films 53 on the word lines WL15, WL13, WL11, WL9, WL7, WL5 and WL3 are exposed in the bottom portion of the groove 65, and the word lines WL16 to WL4 are exposed on the side surfaces of the groove 65.

As described above, the word line step portion is formed. Afterward, as shown in FIG. 77, the hard mask 62 and the shrink masks 66 are removed.

Next, as shown in FIG. 78, the insulating film (e.g., a silicon nitride film) 16 having a film thickness of, for example, 10 nm is formed in the grooves 66 generated in the steps of FIGS. 51 to 76 by the LPCVD process. Then, the insulating films 16 in the bottom portions of the grooves 66 are removed by etching back, whereby the insulating films 16 are left only on the side surfaces of the word lines WL.

Figure 79:
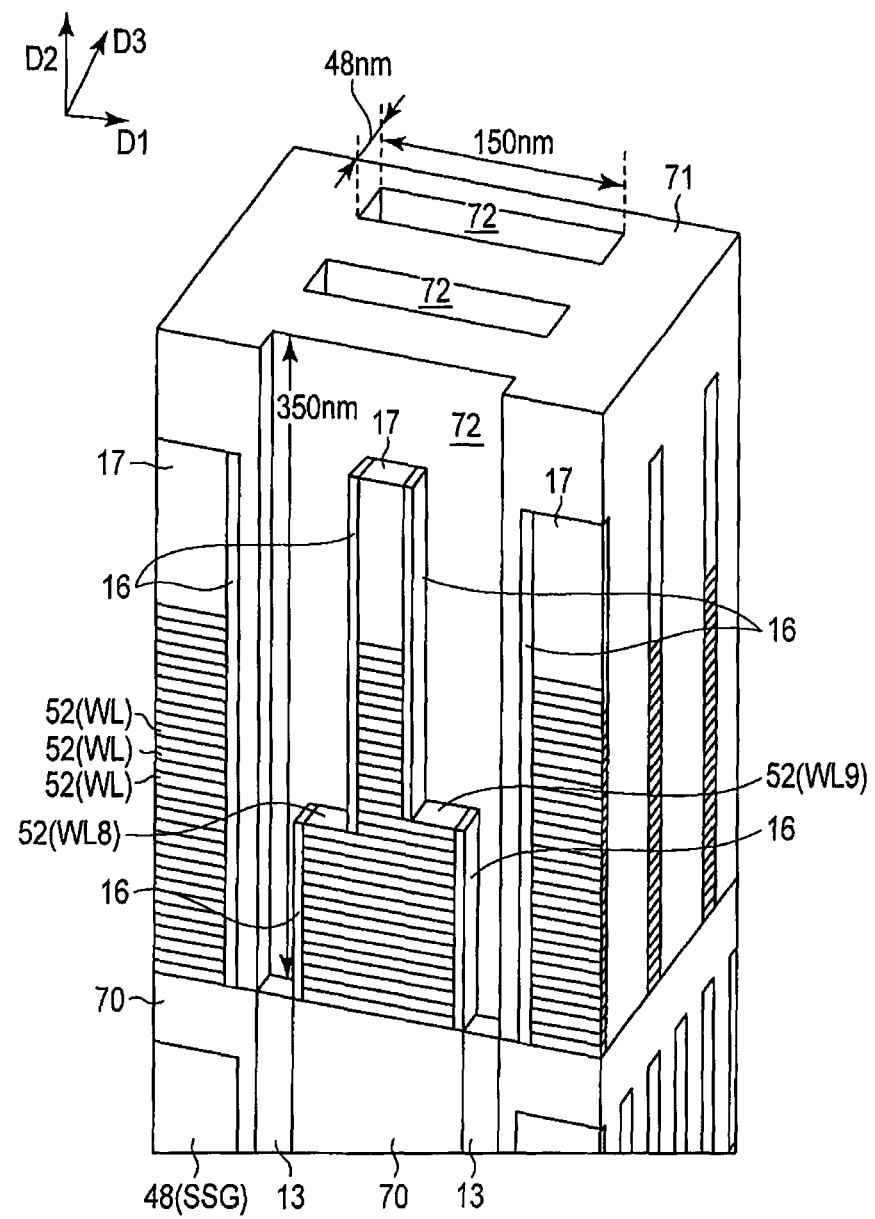

Next, as shown in FIG. 79, a coating type interlayer insulating film 71, in which, for example, a silicon oxide film is a main component, is formed on the whole surface. The interlayer insulating film 71 fills in the grooves 66, and the upper surface of the film is flattened. Moreover, FIG. 79 also shows an interlayer insulating film 70 formed around the selection gate lines SSG and the like. Then, grooves 72 are made in the interlayer insulating film 71 by the conventional photolithography and mask processing technologies. The grooves 72 are used to form contact plugs 14, but have a far larger pattern than the contact plugs 14. A size of the groove is, for example, (50 nm×150 nm), and a pitch thereof is, for example, 96 nm.

Seven grooves 72 are formed along the third direction, to be associated with the respective steps of the word line step portion. The RIE for forming the grooves 72 is performed on conditions that an etching rate for the silicon nitride film and TiN is remarkably small. Therefore, in the grooves 72, the upper surface of the associated word lines WL and the associated contact plugs 13 are exposed. In a region shown in FIG. 79, the word lines WL8 and WL9 are exposed. In another groove 72, the word lines WL2 and WL3 are exposed. In still another groove 72, the word lines WL4 and WL5 are exposed. In a further groove 72, the word lines WL6 and WL7 are exposed. In a further groove 72, the word lines WL10 and WL11 are exposed. In a further groove 72, the word lines WL12 and WL13 are exposed. In a still further groove 72, the word lines WL14 and WL15 are exposed. Further in a not-shown region, a groove 72 which reaches the word line WL16 is further made. The groove 72 is made to be associated with a region provided with the groove 64 (see FIG. 45).

Next, as shown in FIG. 80, a conductive film 73 of, for example, tungsten or the like is formed on the interlayer insulating film 71, to fill in the grooves 72.

Figure 81:
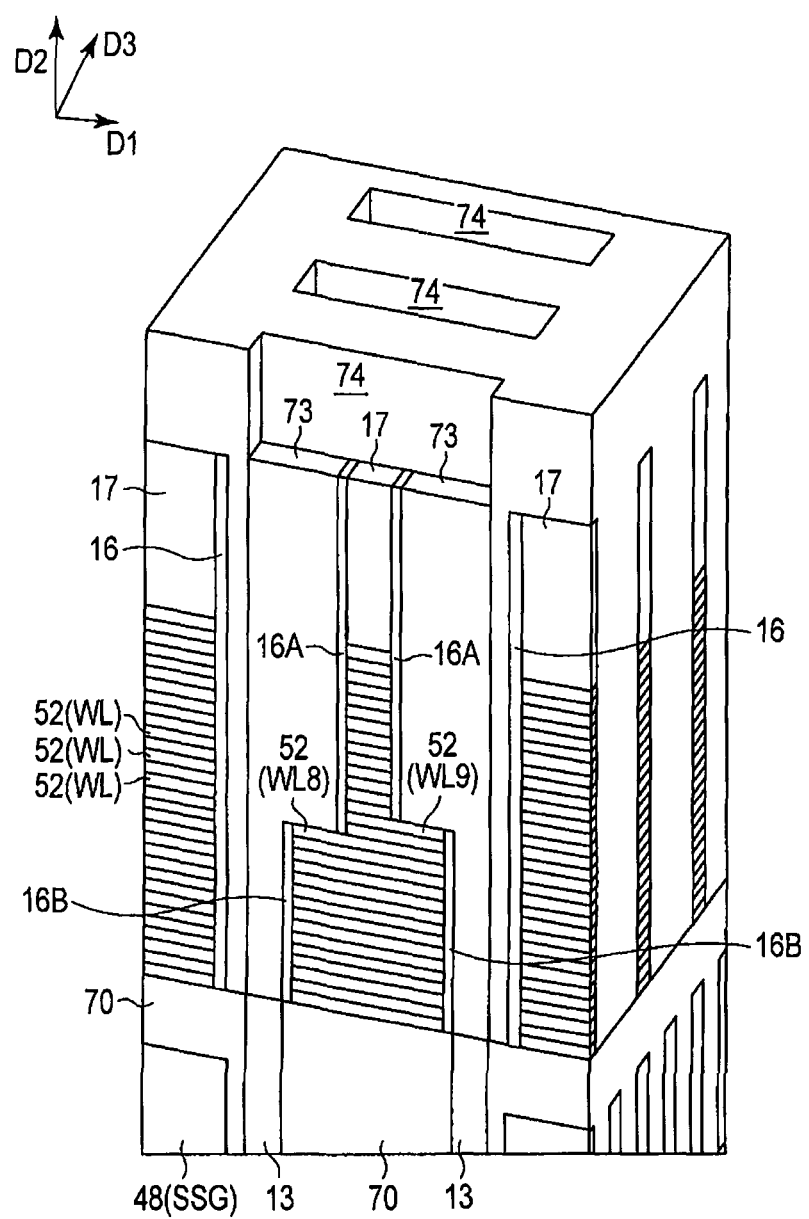

Afterward, as shown in FIG. 81, the conductive film 73 is etched back. In this step, an etch back amount is regulated so that the upper surface of the conductive film 73 becomes higher than the upper surface of the insulating film 16 formed in FIG. 44 (shown as an insulating film 16B in FIG. 81), and becomes lower than the upper surface of the insulating film 16 formed in FIG. 78 (shown as an insulating film 16A in FIG. 81) and/or the insulating film 17. Consequently, in the grooves 72, two contact plugs 14 each connecting one of the word lines WL exposed in the grooves 72 to the associated metal interconnect layer 13 are formed by the conductive film 73.

Afterward, an interlayer insulating film is formed on the whole surface. Moreover, a contact to a metal interconnect of the uppermost layer and the metal interconnect of the uppermost layer are formed.

Furthermore, a passivation film is finally formed to open pad holes, thereby completing the hook-up-region R2.

3. Effect of the Present Embodiment

As described above, the structure described in the first embodiment can be fabricated by the method according to the present embodiment.

Moreover, in the present embodiment, a minute structure can easily be processed. For example, as described above, the size of the upper surface of the contact plug 13 is, for example, (32 nm×48 nm), and the contact hole which reaches this upper surface has the same degree of size, which is very minute.

However, the processing size of the photolithography step required to form the contact plug 14 connected to the contact plug 13 can be remarkably enlarged to, for example, about (48 nm×150 nm) as described with reference to FIG. 79. Furthermore, the etching of the interlayer insulating film 71 is performed on conditions that an etching selection ratio with insulating film 16 and the word line 52 can be taken. Therefore, an allowable amount of misalignment can be enlarged.

Furthermore, when the steps of FIGS. 79 to 81 are used, it is possible to prevent the increase of process cost due to adding a step of forming the contact plugs 14 prior to the formation of the final metal layer. Furthermore, it is not necessary to include a minute pattern of several tens of nanometers in the final metal layer usually formed in a large size of 500 nm or larger, in forming the contact plugs 14. In consequence, it is possible to prevent a final metal processing difficulty level from becoming high and to prevent a degree of freedom in design from becoming remarkably low.

It is to be noted that in the above example, the insulating films 16 formed in FIGS. 44 and 78 do not have to be formed in FIGS. 44 and 78, and may be formed in a stage where the structure of FIG. 79 is obtained. That is, the steps of FIG. 45 to FIG. 79 may be carried out without the insulating film 16. FIG. 82 shows a structure obtained after the step of FIG. 79 in this case. Even when the insulating film 16 is not present, the etching during the making of the grooves 72 is performed on conditions that an etching selection ratio is large as compared with the word lines WL. Therefore, any problem does not especially occur. Then, in the structure of FIG. 82, the insulating film 16 may be formed on the side surfaces and bottom surfaces of the grooves 72, and continuously the etching back may be carried out to remove the insulating film 16 from the bottom surfaces of the grooves 72 and the upper surfaces of the word lines WL. Afterward, the metal film 73 fills in the insulating film 72, to form the contact plugs 14.

[Modifications and the Like]

As described above, the memory device according to the first and second embodiments can be described as follows. FIG. 83 is a plan view of a memory cell array according to the above embodiments, and FIG. 84 is a perspective view of a word line step portion.

As shown, a memory device includes: a first interconnect group (WLG in FIG. 83) in which first interconnects (WL) are stacked; second interconnects (BL); and memory cells (MC in FIG. 83). The first interconnect group (WLG in FIG. 83) includes first regions (RA1 in FIG. 83 on both sides) in which the first interconnects (WL) are formed along a first direction (D1), and a second region (RA2 in FIG. 83) in which first contact plugs (14-1 in FIG. 83) are formed on the first interconnects. The second interconnects (BL) are formed along a second direction (D2) different from the first direction. The first interconnects are stacked along the second direction. The memory cells (MC in FIG. 83) include variable-resistance-layers (variable resistance elements 4 in FIG. 83). The variable-resistance-layers are formed on the side surfaces of the second interconnects (BL), and connected to the first interconnects (WL). In the second region (RA2 in FIG. 83), the first interconnect group (WLG in FIG. 83) includes a step portion (FIG. 84), and the step portion includes word line terraces. Adjacent terraces have different heights from each other by at least twice a distance between upper surfaces of two layers of the first interconnects which are included in the first interconnects and are adjacent in the second direction (FIG. 84).

The above step portion can be described as follows. That is, in the second region, lengths of the first interconnects each corresponding to at least two layers vary. The first interconnect positioned in a lower layer is longer, and the first interconnect positioned in an upper layer is shorter. In consequence, the first interconnect group in the second region has a stair-like shape.

Further in other words, the step portion includes word line terraces and a vertical surface making a step between the adjacent word line terraces. Moreover, in each vertical surface, two first interconnects (WL) and two insulating films 53 are exposed.

Moreover, the first interconnect group may further include a third region (RA3 in FIG. 83). In the third region (RA3 in FIG. 83), second contact plugs (14-2 in FIG. 83) are formed on a plurality of first interconnects. In the third region (RA3 in FIG. 83), the second contact plugs (14-2 in FIG. 83) are formed on first ones the first interconnects (WL2, WL4, WL6 . . . WL14 in FIG. 83) different from second ones of the first interconnects (WL3, WL5, WL7 . . . WL15 in FIG. 83) connected to the first contact plugs (14-1 in FIG. 83) in the second region (RA2 in FIG. 83). In the third region (RA3 in FIG. 83), the first interconnect group includes a step portion, and the step portion of the third region includes word line terraces, and heights of the adjacent terraces are different from each other by two or more first interconnects (FIG. 84).

Furthermore, the second region (RA2 in FIG. 83) may be provided in parallel with the third region (RA3 in FIG. 83). The first interconnect group may further include a fourth region (RA4 in FIG. 83) between the second region and the third region. The upper surface (WL16 in FIG. 83) of the fourth region is higher than the upper surfaces (WL15 in RA2, WL14 in RA3) of the second and third regions. Insulating films (16 in FIG. 83) are formed on the side surfaces of the second to fourth regions. The first contact plugs (14-1 in FIG. 83) are isolated from the first interconnects on the side surfaces of the fourth region (RA4 in FIG. 83) and the second region (RA2 in FIG. 83) by the insulating films (16 in FIG. 83), and are coupled with at least one of the first interconnects of the first region (RA1 in FIG. 83). The second contact plugs (14-2 in FIG. 83) are isolated from the first interconnects on the side surfaces of the fourth region (RA4 in FIG. 83) and the third region (RA3 in FIG. 83) by the insulating films (16 in FIG. 83), and are coupled with at least one of the first interconnects of the third region (RA3 in FIG. 83).

In addition, the memory devices according to the above first and second embodiments can be described as follows. That is, a memory device includes; memory cell regions (R1 in FIG. 4); and a connection region (R2 in FIG. 4) provided between the adjacent memory cell regions. Each of the memory cell regions (R1 in FIG. 4) includes: a first interconnect group (stacked WL in FIG. 1) including first interconnects (WL in Memory cell array in FIG. 1) formed along a first direction; second interconnects (BL in FIG. 1); and memory cells (MC in FIG. 1). The first interconnects are stacked, with a first insulating film (53) interposed therebetween, in a second direction different from the first direction. The second interconnects (BL in FIG. 1) are formed along the second direction. The memory cells (MC in FIG. 1) include variable-resistance-layers (the variable resistance elements 4 in FIG. 1) formed on the side surfaces of the second interconnects and connected to the first interconnects. The connection region (R2 in FIG. 4) includes: a third interconnect group (stacked WLs in FIG. 5) including third interconnects (WL in Hook-up-region in FIG. 5) stacked, with a second insulating film (53) interposed therebetween, in the second direction, the third interconnects being connected to the corresponding first interconnects; and first contact plugs (14 in FIG. 5) connecting the third interconnects to a peripheral circuit underneath the memory cell. The third interconnect group includes a step portion including steps, and each of the steps of the step portion has a height equivalent to or more than the sum of heights of two third interconnects and two insulating films (FIG. 7).

According to the above structure, an area of a connecting portion between the interconnects in the memory cell array and the peripheral circuit underneath the memory cell array is decreased, so that a size of the whole memory device can be reduced. It is to be noted that embodiments are not limited to the above configurations, and can variously be modified.

For example, in the above second embodiment, hard mask processing is performed twice (FIGS. 45-46) and a shrink process/step RIE process (FIGS. 49-76) are performed seven times, to form 15 steps. However, this combination is noticeably optional. For example, the hard mask processing may be performed four times instead of performing the step RIE of two steps seven times as in the present embodiment. In this case, word line step portions are formed in four rows, and the uppermost layers of the respective rows become a combination of (the thirteenth layer (WL13), the fourteenth layer (WL14), the fifteenth layer (WL15) and the sixteenth layer (WL16)). Moreover, in this case, the step RIE of four steps may be performed three times. In this case, the step is formed also in the word line WL1 of the lowermost layer. Therefore, it is not necessary to connect the only word line WL1 to the contact plug from below as in the present embodiment. However, in this case, the total number of the steps increases, and hence a usable area of each step seen from the upper surface becomes small.

Needless to say, the step RIE may be performed for three steps, five steps . . . or the like, and may suitably be selected in consideration of the layer number of the word lines WL (not limited to 16 layers), an area of the hook-up-region R2 or the like.

Moreover, in the fabricating method described in the second embodiment, the order of fabricating steps can be changed as much as possible, and the steps may simultaneously be performed. Furthermore, the materials or specific values such as the film thicknesses in the above description can suitably be changed. In addition, the bit lines, the word lines and the global bit lines do not necessarily have to be orthogonal, as long as the directions of the lines are different from one another. Moreover, a sectional shape and/or a planar shape of the memory cell stacking structure is not limited to a quadrangular shape, and the shape may be another polygonal shape or a round shape.

Furthermore, a structure in which each step corresponds to two or more word lines is not limited to the ReRAM, and can be applied to, for example, a three-dimensional stacking type NAND flash memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a first interconnect group in which a plurality of first interconnects is stacked, the first interconnect group including a plurality of first regions in which the first interconnects are formed along a first direction, and a second region in which a plurality of first contact plugs are formed on the first interconnects;
   a plurality of second interconnects formed along a second direction different from the first direction, the first interconnects being stacked along the second direction; and
   a memory cell including a variable-resistance-layer which is formed on a side surface of one of the second interconnects and is coupled with one of the first interconnects,
   wherein in the second region, the first interconnect group includes a step portion, and the step portion includes a plurality of terraces,
   adjacent terraces have different heights from each other by at least twice a distance between upper surfaces of two layers of the first interconnects which are included in the first interconnects and are adjacent in the second direction, and
   the plurality of terraces of the second region of the first interconnect group are arranged along a third direction perpendicular to the first and second directions in at least two rows, the at least two rows being apart from each other with a separator interposed between the at least two rows, and the separator is higher than any one of the plurality of the terraces in height,
   wherein a width of each of the terraces at a shorter side is larger than a width of each of the first interconnects in the first regions.

2. The device according to claim 1, wherein the plurality of first interconnects formed on a same layer of one of the plurality of the first regions are connected in common, and are further connected to the second region.

3. The device according to claim 1, further comprising:
   a first insulating film formed on a side surface of the second region of the first interconnect group.

4. The device according to claim 3, further comprising:
   a second insulating film which covers the first regions of the first interconnect group,
   wherein the first insulating film is formed by using a material having a large etching selectivity to the second insulating film.

5. The device according to claim 4, wherein a main component of the first insulating film is SiN.

6. The device according to claim 1, wherein the first contact plugs are coupled with a peripheral circuit through the second region, the peripheral circuit being formed on a layer lower than that of the memory cell is formed.

7. The device according to claim 1, further comprising a selection element formed at an end of the bit line, the selection element including:
   a drain region in contact with the end of the bit line,
   a silicon layer in contact with the drain region,
   a source region in contact with the silicon layer, wherein the bit line, the drain region, the silicon layer and the source region being arranged in line,
   a gate insulating layer formed on a side of the silicon layer, the side being sandwiched by the drain region and the source region, and
   a gate electrode formed on the gate insulating layer.

8. A memory device comprising:
   a first interconnect group in which a plurality of first interconnects are stacked, the first interconnect group including a plurality of first regions in which the first interconnects are formed along a first direction, and a second region in which a plurality of first contact plugs are formed on the first interconnects;
   a plurality of second interconnects formed along a second direction different from the first direction, the first interconnects being stacked along the second direction;
   a memory cell including a variable-resistance-layer which is formed on a side surface of one of the second interconnects and is coupled with one of the first interconnects;
   a plurality of memory cell regions in which the memory cells are arranged; and
   a connection region in which the second region of the first interconnect group is provided and in which the first interconnects are coupled with a peripheral circuit via the first contact plugs,
   wherein in the second region, the first interconnect group includes a step portion, and the step portion includes a plurality of terraces arranged in at least two rows, the at least two rows being apart from each other with a separator interposed between the at least two rows, and the separator is higher than any one of the plurality of the terraces in height,
   adjacent terraces have different heights from each other by at least twice a distance between upper surfaces of two layers of the first interconnects which are included in the first interconnects and are adjacent in the second direction,
   the connection region is provided between adjacent one of the memory cell regions, and
   a width of each of the terraces at a shorter side is larger than a width of each of the first interconnects in the first regions.

9. The device according to claim 2, wherein the connection region is located between the memory cell regions arranged in the first direction,
- each of the first contact plugs is formed on each of the terraces, and
- contact regions between the first contact plugs and the terraces are arranged in the third direction.

10. A memory device comprising:
- a first interconnect group in which a plurality of first interconnects are stacked, the first interconnect group including a plurality of first region in which the first interconnects are formed along a first direction, and a second region in which a plurality of first contact plugs are formed on the first interconnects;
- a plurality of second interconnects formed along a second direction different from the first direction, the first interconnects being stacked along the second direction;
- a memory cell including a variable-resistance-layer which is formed on a side surface of one of the second interconnects and is coupled with one of the first interconnects;
- a plurality of memory cell regions in which the memory cells are arranged; and
- a connection region in which the second region of the first interconnect group is provided and in which the first interconnects are coupled with a peripheral circuit via the first contact plugs,
- wherein in the second region, the first interconnect group includes a step portion, and the step portion includes a plurality of terraces,
- adjacent terraces have different heights from each other by at least twice a distance between upper surfaces of two layers of the first interconnects which are included in the first interconnects and are adjacent in the second direction, and
- the connection region is provided between adjacent ones of the memory cell regions,
- wherein the connection region is located between the memory cell regions arranged in the first direction,
- each of the first contact plugs is formed on each of the terraces, and
- contact regions between the first contact plugs and the terraces are arranged in the third direction,
- wherein the first interconnect group further includes a third region in which second contact plugs are formed on the first interconnects,
- in the third region, the second contact plugs are formed on first ones of the first interconnects different from the first interconnects coupled with the first contact plugs in the second region,
- in the third region, the first interconnect group includes a step portion, and
- the step portion of the third region includes a plurality of terraces, and heights of the adjacent terraces are different from each other by the two or more first interconnects, and
- wherein the second region is provided in parallel with the third region, and
- the first interconnect group further includes a fourth region between the second region and the third region,
- the upper surface of the fourth region is higher than the upper surfaces of the second region and the third region,
- an insulating film is formed on the side surfaces of the second to fourth regions,
- the first contact plugs are isolated from the first interconnects on the side surfaces of the fourth region and the second region by the insulating film, and coupled with at least one of the first interconnects of the first region, and
- the second contact plugs are isolated from the first interconnects on the side surfaces of the fourth region and the third region by the insulating film, and coupled with at least one of the first interconnects of the third region.

* * * * *